(12) United States Patent
Yamazaki et al.

(10) Patent No.: US 10,068,953 B2
(45) Date of Patent: Sep. 4, 2018

(54) LIGHT EMITTING DEVICE, DRIVING METHOD OF LIGHT EMITTING DEVICE AND ELECTRONIC DEVICE

(71) Applicant: Semiconductor Energy Laboratory Co., Ltd., Atsugi-shi, Kanagawa-ken (JP)

(72) Inventors: Shunpei Yamazaki, Tokyo (JP); Mai Akiba, Kanagawa (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/860,725

(22) Filed: Jan. 3, 2018

(65) Prior Publication Data

US 2018/0145120 A1  May 24, 2018

Related U.S. Application Data

(60) Continuation of application No. 15/340,069, filed on Nov. 1, 2016, now Pat. No. 9,876,063, which is a
(Continued)

(30) Foreign Application Priority Data

Sep. 21, 2001 (JP) ................................ 2001-290290

(51) Int. Cl.
    *H01L 29/08* (2006.01)
    *H01L 27/32* (2006.01)
    (Continued)

(52) U.S. Cl.
    CPC ....... *H01L 27/3248* (2013.01); *G09G 3/2018* (2013.01); *G09G 3/3225* (2013.01);
(Continued)

(58) Field of Classification Search
CPC . H01L 27/3248; H01L 27/124; H01L 27/155; H01L 27/15; H01L 27/3279;
(Continued)

(56) References Cited

U.S. PATENT DOCUMENTS

| | | |
|---|---|---|
| 4,523,189 A | 6/1985 | Takahara et al. |
| 4,951,041 A | 8/1990 | Inada et al. |

(Continued)

FOREIGN PATENT DOCUMENTS

| | | |
|---|---|---|
| EP | 0658834 A | 6/1995 |
| EP | 0883191 A | 12/1998 |

(Continued)

OTHER PUBLICATIONS

Baldo.M et al., "Highly Efficient Phosphorescent Emission From Organic Electroluminescent Devices", Nature, Sep. 10, 1998, vol. 395, pp. 151-154.

(Continued)

*Primary Examiner* — Thinh T Nguyen
(74) *Attorney, Agent, or Firm* — Fish & Richardson P.C.

(57) ABSTRACT

By controlling the luminance of light emitting element not by means of a voltage to be impressed to the TFT but by means of controlling a current that flows to the TFT in a signal line drive circuit, the current that flows to the light emitting element is held to a desired value without depending on the characteristics of the TFT. Further, a voltage of inverted bias is impressed to the light emitting element every predetermined period. Since a multiplier effect is given by the two configurations described above, it is possible to prevent the luminance from deteriorating due to a deterioration of the organic luminescent layer, and further, it is possible to maintain the current that flows to the light emitting element to a desired value without depending on the characteristics of the TFT.

10 Claims, 42 Drawing Sheets

Related U.S. Application Data continuation of application No. 15/172,240, filed on Jun. 3, 2016, now Pat. No. 9,876,062, which is a continuation of application No. 14/874,605, filed on Oct. 5, 2015, now Pat. No. 9,368,527, which is a continuation of application No. 14/524,040, filed on Oct. 27, 2014, now Pat. No. 9,165,952, which is a continuation of application No. 13/974,330, filed on Aug. 23, 2013, now Pat. No. 8,895,983, which is a continuation of application No. 13/554,295, filed on Jul. 20, 2012, now Pat. No. 8,519,392, which is a continuation of application No. 12/876,603, filed on Sep. 7, 2010, now Pat. No. 8,227,807, which is a division of application No. 11/423,757, filed on Jun. 13, 2006, now Pat. No. 7,795,618, which is a continuation of application No. 10/983,749, filed on Nov. 9, 2004, now Pat. No. 7,170,094, which is a continuation of application No. 10/247,670, filed on Sep. 20, 2002, now Pat. No. 6,870,192.

(51) Int. Cl.

| | |
|---|---|
| *G09G 3/3225* | (2016.01) |
| *H01L 27/12* | (2006.01) |
| *H01L 51/52* | (2006.01) |
| *G09G 3/3233* | (2016.01) |
| *G09G 3/3258* | (2016.01) |
| *H01L 27/15* | (2006.01) |
| *G09G 3/3283* | (2016.01) |
| *G09G 3/3241* | (2016.01) |
| *H01L 33/32* | (2010.01) |
| *H01L 27/13* | (2006.01) |
| *H01L 29/66* | (2006.01) |
| *H01L 33/20* | (2010.01) |
| *H01L 29/49* | (2006.01) |
| *H01L 51/00* | (2006.01) |
| *G09G 3/325* | (2016.01) |
| *G09G 3/22* | (2006.01) |
| *G09G 3/20* | (2006.01) |

(52) U.S. Cl.
CPC ......... *G09G 3/3233* (2013.01); *G09G 3/3241* (2013.01); *G09G 3/3258* (2013.01); *G09G 3/3283* (2013.01); *H01L 27/12* (2013.01); *H01L 27/124* (2013.01); *H01L 27/1255* (2013.01); *H01L 27/15* (2013.01); *H01L 27/3244* (2013.01); *H01L 27/3258* (2013.01); *H01L 27/3262* (2013.01); *H01L 27/3265* (2013.01); *H01L 27/3276* (2013.01); *H01L 27/3279* (2013.01); *H01L 51/5259* (2013.01); *G09G 3/2022* (2013.01); *G09G 3/22* (2013.01); *G09G 3/325* (2013.01); *G09G 2300/04* (2013.01); *G09G 2300/0426* (2013.01); *G09G 2300/0814* (2013.01); *G09G 2300/0842* (2013.01); *G09G 2300/0861* (2013.01); *G09G 2300/0866* (2013.01); *G09G 2310/027* (2013.01); *G09G 2310/0256* (2013.01); *G09G 2310/0262* (2013.01); *G09G 2310/0286* (2013.01); *G09G 2310/0291* (2013.01); *G09G 2310/08* (2013.01); *G09G 2320/0233* (2013.01); *G09G 2320/043* (2013.01); *G09G 2320/045* (2013.01); *G09G 2330/028* (2013.01); *G09G 2330/04* (2013.01); *G09G 2330/045* (2013.01); *H01L 27/1285* (2013.01); *H01L 27/13* (2013.01); *H01L 29/4908* (2013.01); *H01L 29/66757* (2013.01); *H01L 33/20* (2013.01); *H01L 33/32* (2013.01); *H01L 51/0036* (2013.01); *H01L 51/0038* (2013.01); *H01L 51/0039* (2013.01); *H01L 51/0059* (2013.01); *H01L 51/0073* (2013.01); *H01L 51/0081* (2013.01); *H01L 51/0085* (2013.01); *H01L 51/0087* (2013.01); *H01L 2227/323* (2013.01); *H01L 2251/308* (2013.01)

(58) Field of Classification Search
CPC ............ H01L 27/3262; H01L 51/5259; G09G 3/2018; G09G 3/3255; G09G 3/3233
USPC ..... 257/40, 59, 72, 79, 83; 438/48, 128.149; 345/55, 76, 94
See application file for complete search history.

(56) References Cited

U.S. PATENT DOCUMENTS

| | | |
|---|---|---|
| 5,247,190 A | 9/1993 | Friend et al. |
| 5,399,502 A | 3/1995 | Friend et al. |
| 5,414,443 A | 5/1995 | Kanatani et al. |
| 5,444,363 A | 8/1995 | Cabler |
| 5,552,678 A | 9/1996 | Tang et al. |
| 5,641,991 A | 6/1997 | Sakoh |
| 5,714,968 A | 2/1998 | Ikeda |
| 5,748,160 A | 5/1998 | Shieh et al. |
| 5,847,516 A | 12/1998 | Kishita et al. |
| 5,882,761 A | 3/1999 | Kawami et al. |
| 5,952,789 A | 9/1999 | Stewart et al. |
| 5,990,629 A | 11/1999 | Yamada et al. |
| 6,023,259 A | 2/2000 | Howard |
| 6,064,158 A | 5/2000 | Kishita et al. |
| 6,087,245 A | 7/2000 | Yamazaki et al. |
| 6,091,203 A | 7/2000 | Kawashima et al. |
| 6,121,943 A | 9/2000 | Nishioka et al. |
| 6,151,006 A | 11/2000 | Yanagi et al. |
| 6,175,345 B1 | 1/2001 | Kuribayashi et al. |
| 6,229,506 B1 | 5/2001 | Dawson et al. |
| 6,243,069 B1 | 6/2001 | Ogawa et al. |
| 6,246,179 B1 | 6/2001 | Yamada |
| 6,246,180 B1 | 6/2001 | Nishigaki |
| 6,281,552 B1 | 8/2001 | Kawasaki et al. |
| 6,351,078 B1 | 2/2002 | Wang et al. |
| 6,359,605 B1 | 3/2002 | Knapp et al. |
| 6,369,785 B1 | 4/2002 | Imai |
| 6,373,454 B1 | 4/2002 | Knapp et al. |
| 6,373,455 B1 | 4/2002 | Kuribayashi et al. |
| 6,380,672 B1 | 4/2002 | Yudasaka |
| 6,380,689 B1 | 4/2002 | Okuda |
| 6,380,876 B1 | 4/2002 | Nagao |
| 6,452,341 B1 | 9/2002 | Yamauchi et al. |
| 6,476,419 B1 | 11/2002 | Yasuda |
| 6,496,130 B2 | 12/2002 | Nagao |
| 6,501,227 B1 | 12/2002 | Koyama |
| 6,501,466 B1 | 12/2002 | Yamagishi et al. |
| 6,525,704 B1 | 2/2003 | Kondo et al. |
| 6,529,178 B1 | 3/2003 | Kimura |
| 6,535,185 B2 | 3/2003 | Kim et al. |
| 6,576,924 B1 | 6/2003 | Yamazaki et al. |
| 6,580,657 B2 | 6/2003 | Sanford et al. |
| 6,583,471 B1 | 6/2003 | Yamazaki et al. |
| 6,583,581 B2 | 6/2003 | Kaneko et al. |
| 6,583,775 B1 | 6/2003 | Sekiya et al. |
| 6,614,174 B1 | 9/2003 | Urabe et al. |
| 6,618,029 B1 | 9/2003 | Ozawa |
| 6,642,651 B2 | 11/2003 | Yudasaka |
| 6,650,060 B2 | 11/2003 | Okuda |
| 6,680,577 B1 | 1/2004 | Inukai et al. |
| 6,686,858 B2 | 2/2004 | Nagao |
| 6,700,330 B2 | 3/2004 | Koyama |
| 6,731,276 B1 | 5/2004 | Ishizuka |
| 6,738,034 B2 | 5/2004 | Kaneko et al. |
| 6,740,938 B2 | 5/2004 | Tsunoda et al. |
| 6,750,833 B2 | 6/2004 | Kasai |
| 6,753,654 B2 | 6/2004 | Koyama |
| 6,774,574 B1 | 8/2004 | Koyama |
| 6,777,710 B1 | 8/2004 | Koyama |

(56) References Cited

U.S. PATENT DOCUMENTS

| | | |
|---|---|---|
| 6,777,716 B1 | 8/2004 | Yamazakis et al. |
| 6,777,887 B2 | 8/2004 | Koyama |
| 6,781,155 B1 | 8/2004 | Yamada |
| 6,858,991 B2 | 2/2005 | Miyazawa |
| 6,859,193 B1 | 2/2005 | Yumoto |
| 6,864,863 B2 | 3/2005 | Kasai |
| 6,870,192 B2 | 3/2005 | Yamazaki et al. |
| 6,872,973 B1 | 3/2005 | Koyama et al. |
| 6,882,113 B2 | 4/2005 | Kaneko et al. |
| 6,885,148 B2 | 4/2005 | Yudasaka |
| 6,906,344 B2 | 6/2005 | Yamazaki et al. |
| 6,919,886 B2 | 7/2005 | Sato et al. |
| 6,952,023 B2 | 10/2005 | Yamazaki et al. |
| 6,958,740 B1 | 10/2005 | Nishikawa |
| 6,969,291 B2 | 11/2005 | Urabe et al. |
| 7,001,801 B2 | 2/2006 | Yamazaki et al. |
| 7,015,503 B2 | 3/2006 | Seki et al. |
| 7,046,240 B2 | 5/2006 | Kimura |
| 7,061,186 B2 | 6/2006 | Inukai et al. |
| 7,091,939 B2 | 8/2006 | Kasai |
| 7,122,832 B2 | 10/2006 | Nishikawa |
| 7,170,094 B2 | 1/2007 | Yamazaki et al. |
| 7,189,997 B2 | 3/2007 | Tsunoda et al. |
| 7,214,959 B2 | 5/2007 | Seki et al. |
| 7,230,601 B2 | 6/2007 | Yamazaki et al. |
| 7,273,801 B2 | 9/2007 | Seki et al. |
| 7,288,420 B1 | 10/2007 | Yamazaki et al. |
| 7,317,205 B2 | 1/2008 | Yamazaki et al. |
| 7,336,035 B2 | 2/2008 | Koyama |
| 7,358,531 B2 | 4/2008 | Koyama |
| 7,364,939 B2 | 4/2008 | Yudasaka |
| 7,393,707 B2 | 7/2008 | Yamazaki et al. |
| 7,397,451 B2 | 7/2008 | Ozawa |
| 7,402,467 B1 | 7/2008 | Kadono et al. |
| 7,403,179 B2 | 7/2008 | Koyama et al. |
| 7,411,586 B2 | 8/2008 | Kimura |
| 7,414,600 B2 | 8/2008 | Nathan et al. |
| 7,442,955 B2 | 10/2008 | Seki et al. |
| 7,460,094 B2 | 12/2008 | Ozawa |
| 7,462,501 B2 | 12/2008 | Yamazaki et al. |
| 7,569,849 B2 | 8/2009 | Nathan et al. |
| 7,601,572 B2 | 10/2009 | Yamazaki et al. |
| 7,719,498 B2 | 5/2010 | Koyama |
| 7,760,162 B2 | 7/2010 | Miyazawa |
| 7,795,618 B2 | 9/2010 | Yamazaki et al. |
| 7,871,936 B2 | 1/2011 | Kadono et al. |
| 7,880,167 B2 | 2/2011 | Yamazaki et al. |
| 7,932,518 B2 | 4/2011 | Seki et al. |
| 7,982,222 B2 | 7/2011 | Koyama |
| 8,159,124 B2 | 4/2012 | Yudasaka |
| 8,274,083 B2 | 9/2012 | Kadono et al. |
| 8,310,475 B2 | 11/2012 | Ozawa |
| 8,310,476 B2 | 11/2012 | Ozawa |
| 8,334,858 B2 | 12/2012 | Ozawa |
| 8,658,481 B2 | 2/2014 | Kadono et al. |
| 8,686,553 B2 | 4/2014 | Kadono et al. |
| 8,803,773 B2 | 8/2014 | Ozawa |
| 8,890,172 B2 | 11/2014 | Yamazaki et al. |
| 9,105,523 B2 | 8/2015 | Kadono et al. |
| 9,293,726 B2 | 3/2016 | Yamazaki et al. |
| 2001/0002703 A1 | 6/2001 | Koyama |
| 2001/0045558 A1 | 11/2001 | Kawasaki et al. |
| 2001/0054991 A1 | 12/2001 | Kimura et al. |
| 2001/0055828 A1* | 12/2001 | Kaneko ............... G09G 3/3233 438/34 |
| 2002/0000613 A1 | 1/2002 | Ohtani et al. |
| 2002/0089291 A1 | 7/2002 | Kaneko et al. |
| 2002/0126073 A1 | 9/2002 | Knapp et al. |
| 2003/0117083 A1 | 6/2003 | Koyama |
| 2003/0214249 A1 | 11/2003 | Kaneko et al. |
| 2004/0129933 A1 | 7/2004 | Nathan et al. |
| 2004/0196219 A1 | 10/2004 | Kaneko et al. |
| 2004/0207615 A1 | 10/2004 | Yumoto |
| 2005/0002260 A1 | 1/2005 | Koyama |
| 2005/0167691 A1 | 8/2005 | Kaneko et al. |
| 2005/0190177 A1 | 9/2005 | Yumoto |
| 2005/0200300 A1 | 9/2005 | Yumoto |
| 2009/0015524 A1 | 1/2009 | Koyama et al. |
| 2009/0021539 A1 | 1/2009 | Kimura |
| 2009/0284501 A1 | 11/2009 | Nathan et al. |
| 2010/0201721 A1 | 8/2010 | Koyama |
| 2011/0260172 A1 | 10/2011 | Koyama |
| 2015/0255524 A1 | 9/2015 | Kadono et al. |
| 2017/0047388 A1 | 2/2017 | Yamazaki et al. |

FOREIGN PATENT DOCUMENTS

| | | |
|---|---|---|
| EP | 0935229 A | 8/1999 |
| EP | 0940797 A | 9/1999 |
| EP | 0989778 A | 3/2000 |
| EP | 1006587 A | 6/2000 |
| EP | 1054512 A | 11/2000 |
| EP | 1058310 A | 12/2000 |
| EP | 1058314 A | 12/2000 |
| EP | 1061497 A | 12/2000 |
| EP | 1063630 A | 12/2000 |
| EP | 1087366 A | 3/2001 |
| EP | 1094436 A | 4/2001 |
| EP | 1102234 A | 5/2001 |
| EP | 1102317 A | 5/2001 |
| EP | 1103947 A | 5/2001 |
| EP | 1130565 A | 9/2001 |
| EP | 1164565 A | 12/2001 |
| EP | 1191512 A | 3/2002 |
| EP | 1197943 A | 4/2002 |
| EP | 1291841 A | 3/2003 |
| EP | 1505648 A | 2/2005 |
| EP | 1505650 A | 2/2005 |
| EP | 1505651 A | 2/2005 |
| EP | 1505652 A | 2/2005 |
| EP | 1622121 A | 2/2006 |
| EP | 1724927 A | 11/2006 |
| EP | 1793650 A | 6/2007 |
| EP | 2112693 A | 10/2009 |
| EP | 2180508 A | 4/2010 |
| EP | 2228783 A | 9/2010 |
| EP | 2256718 A | 12/2010 |
| EP | 2306444 A | 4/2011 |
| EP | 2372682 A | 10/2011 |
| EP | 2500941 A | 9/2012 |
| EP | 2816605 A | 12/2014 |
| JP | 07-221566 A | 8/1995 |
| JP | 09-138659 A | 5/1997 |
| JP | 09-166788 A | 6/1997 |
| JP | 10-092576 A | 4/1998 |
| JP | 11-003048 A | 1/1999 |
| JP | 11-024606 A | 1/1999 |
| JP | 11-231805 A | 8/1999 |
| JP | 11-282419 A | 10/1999 |
| JP | 2000-056847 A | 2/2000 |
| JP | 2000-214800 A | 8/2000 |
| JP | 2000-221942 A | 8/2000 |
| JP | 2000-223279 A | 8/2000 |
| JP | 2000-231347 A | 8/2000 |
| JP | 2000-268957 A | 9/2000 |
| JP | 2000-347621 A | 12/2000 |
| JP | 2000-353810 A | 12/2000 |
| JP | 2000-357584 A | 12/2000 |
| JP | 2001-005426 A | 1/2001 |
| JP | 2001-036408 A | 2/2001 |
| JP | 2001-052864 A | 2/2001 |
| JP | 2001-053287 A | 2/2001 |
| JP | 2001-060076 A | 3/2001 |
| JP | 2001-109404 A | 4/2001 |
| JP | 2001-109432 A | 4/2001 |
| JP | 2001-111053 A | 4/2001 |
| JP | 2001-142413 A | 5/2001 |
| JP | 2001-147659 A | 5/2001 |
| JP | 2001-148291 A | 5/2001 |
| JP | 2001-159878 A | 6/2001 |
| JP | 2001-175200 A | 6/2001 |
| JP | 2001-188501 A | 7/2001 |
| JP | 2001-222240 A | 8/2001 |
| JP | 2001-222255 A | 8/2001 |

(56) References Cited

FOREIGN PATENT DOCUMENTS

| JP | 2002-091376 A | 3/2002 |
|---|---|---|
| JP | 2002-169510 A | 6/2002 |
| JP | 2002-518691 | 6/2002 |
| JP | 2002-189448 A | 7/2002 |
| JP | 2002-207451 A | 7/2002 |
| JP | 2002-215095 A | 7/2002 |
| JP | 2002-251166 A | 9/2002 |
| JP | 2002-333862 A | 11/2002 |
| JP | 2002-358049 A | 12/2002 |
| JP | 2003-022049 A | 1/2003 |
| JP | 2003-022050 A | 1/2003 |
| JP | 2003-177710 A | 6/2003 |
| JP | 2004-054188 A | 2/2004 |
| JP | 2004-531751 | 10/2004 |
| JP | 3810725 | 8/2006 |
| JP | 4001801 | 10/2007 |
| WO | WO-1990/013148 | 11/1990 |
| WO | WO-1999/010862 | 3/1999 |
| WO | WO-1999/048339 | 9/1999 |
| WO | WO-1999/065011 | 12/1999 |
| WO | WO-1999/065012 | 12/1999 |
| WO | WO-2001/006484 | 1/2001 |
| WO | WO-2002/067327 | 8/2002 |

OTHER PUBLICATIONS

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.

Schenk.H et al., "Polymers for Light Emitting Diodes", Eurodisplay '99 : The 19th International Display Research Conference, Sep. 6, 1999, pp. 33-37.

Tsutsui.T et al., "Electroluminescence in Organic Thin Films", Photochemical Processes in Organized Molecular Systems, 1991, pp. 437-450.

Tsutsui.T et al., "High Quantum Efficiency in Organic Light-Emitting Devices With Iridium-Complex as a Triplet Emissive Center", Jpn. J. Appl. Phys. (Japanese Journal of Applied Physics), Dec. 15, 1999, vol. 38, No. 12B, pp. L1502-L1504.

Zou.D et al., "Improvement of Current-Voltage Characteristics in Organic Light Emitting Diodes by Application of Reversed-Bias Voltage", Jpn. J. Appl. Phys. (Japanese Journal of Applied Physics), Nov. 15, 1998, vol. 37, No. 11B, pp. L1406-L1408.

\* cited by examiner

Write Period Ta

Display Period Td

Inverted Bias Period Ti

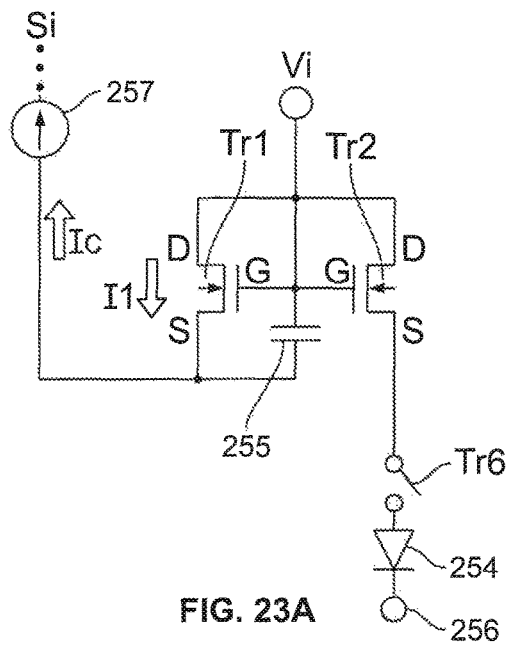
FIG. 23A Write Period Ta
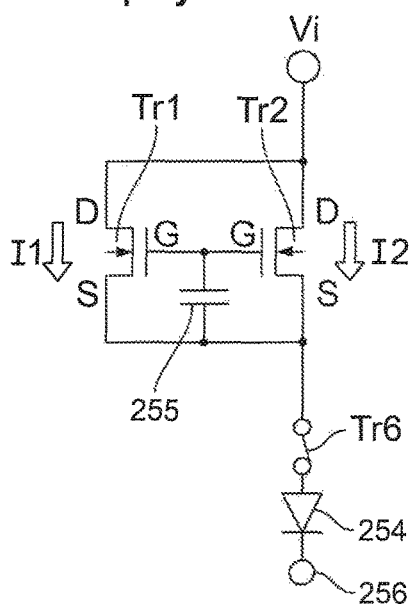
FIG. 23B Display Period Td
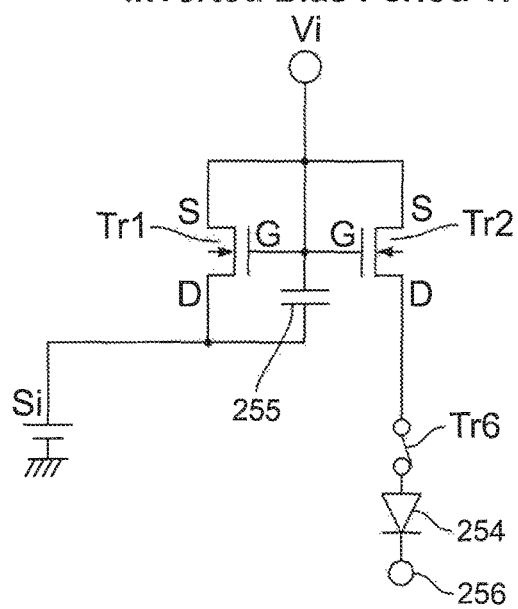
FIG. 23C Inverted Bias Period Ti Write Period Ta Display Period Td Inverted Bias Period Ti Write Period Ta Display Period Td Inverted Bias Period Ti

Write Period Ta

Display Period Td

Inverted Bias Period Ti

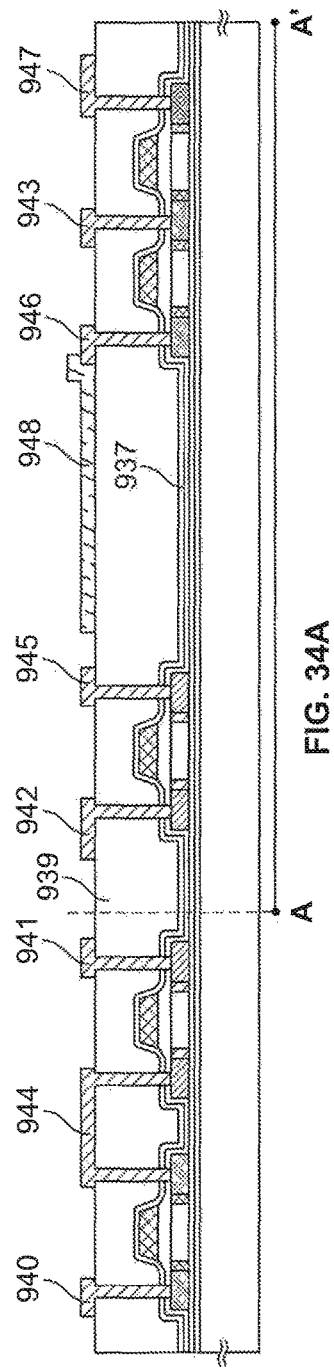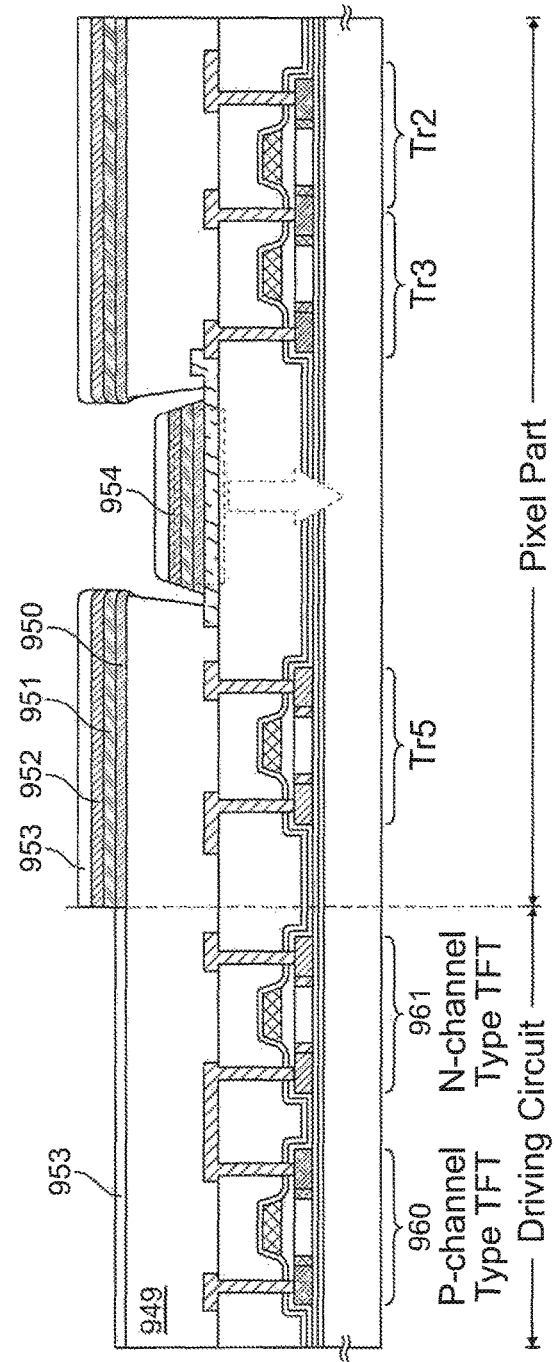
FIG. 34A
FIG. 34B

LIGHT EMITTING DEVICE, DRIVING METHOD OF LIGHT EMITTING DEVICE AND ELECTRONIC DEVICE

CROSS-REFERENCE TO RELATED APPLICATIONS

This application is a continuation of U.S. application Ser. No. 15/340,069, filed Nov. 1, 2016, now pending, which is a continuation of U.S. application Ser. No. 15/172,240, filed Jun. 3, 2016, now pending, which is a continuation of U.S. application Ser. No. 14/874,605, filed Oct. 5, 2015, now U.S. Pat. No. 9,368,527, which is a continuation of U.S. application Ser. No. 14/524,040, filed Oct. 27, 2014, now U.S. Pat. No. 9,165,952, which is a continuation of U.S. application Ser. No. 13/974,330, filed Aug. 23, 2013, now U.S. Pat. No. 8,895,983, which is a continuation of U.S. application Ser. No. 13/554,295, filed Jul. 20, 2012, now U.S. Pat. No. 8,519,392, which is a continuation of U.S. application Ser. No. 12/876,603, filed Sep. 7, 2010, now U.S. Pat. No. 8,227,807, which is a divisional of U.S. application Ser. No. 11/423,757, filed Jun. 13, 2006, now U.S. Pat. No. 7,795,618, which is a continuation of U.S. application Ser. No. 10/983,749, filed Nov. 9, 2004, now U.S. Pat. No. 7,170,094, which is a continuation of U.S. application Ser. No. 10/247,670, filed Sep. 20, 2002, now U.S. Pat. No. 6,870,192, which claims the benefit of a foreign priority application filed in Japan as Serial No, 2001-290290 on Sep. 21, 2001, all of which are incorporated by reference.

BACKGROUND OF THE INVENTION

1. Field of the Invention

The present invention relates to a light emitting panel in which a light emitting element formed on a substrate is enclosed between the substrate and a cover member. Also, the present invention relates to a light emitting module in which an IC or the like is mounted on the light emitting panel. Note that, in this specification, the light emitting panel and the light emitting module are generically called light emitting devices. The present invention further relates to a method of driving the light emitting device and an electronic appliance using the light emitting device.

2. Description of the Related Art

A light-emitting element emits light by itself, and thus has high visibility. The light-emitting element does not need a backlight necessary for a liquid crystal display device (LCD), which is suitable for a reduction of a light-emitting device in thickness. Also, the light-emitting element has no limitation on a viewing angle. Therefore, the light-emitting device using the light-emitting element has recently been attracting attention as a display device that substitutes for a CRT or the LCD.

Incidentally, the light-emitting element means an element of which a luminance is controlled by electric current or voltage in this specification. The light emitting element includes an OLED (organic light emitting diode), an MIM type electron source element (electron emitting elements) used to a FED (field emission display) and the like.

The OLED includes a layer containing an organic compound in which luminescence generated by application of an electric field (electroluminescence) is obtained (organic light emitting material) (hereinafter, referred to as organic light emitting layer), an anode layer and a cathode layer. A light emission in returning to a base state from a singlet excitation state (fluorescence) and a light emission in returning to a base state from a triplet excitation state (phosphorescence) exist as the luminescence in the organic compound. The light-emitting device of the present invention may use one or both of the above described light emissions.

Note that, in this specification, all the layers provided between an anode and a cathode of the OLED are defined as the organic light emitting layers. The organic light emitting layers specifically include a light emitting layer, a hole injecting layer, an electron injecting layer, a hole transporting layer, an electron transporting layer and the like. These layers may have an inorganic compound therein. The OLED basically has a structure in which an anode, a light emitting layer, a cathode are laminated in order. Besides this structure, the OLED may take a structure in which an anode, a hole injecting layer, a light emitting layer, a cathode are laminated in order or a structure in which an anode, a hole injecting layer, a light emitting layer, an electron transporting layer, a cathode are laminated in order.

FIG. 41 shows a configuration of a pixel of an ordinary light emitting device. The pixel shown in FIG. 41 has TFTs 50 and 51, a storage capacitor 52 and a light emitting element 53.

In the TFT 50, a gate is connected to a scan line 55, one of a source and a drain is connected to a signal line 54, and another one thereof is connected to a gate of the TFT 51. In the TFT 51, a source is connected to a power supply 56 and a drain is connected to an anode of the light emitting element 53. A cathode of the light emitting element 53 is connected to a power supply 57. A storage capacitor 52 is provided for holding a voltage between the gate and the source of the TFT 51.

When a voltage of the scan line 55 turns the TFT 50 ON, a video signal input to the signal line 54 is input to the gate of the TFT 51. When the video signal is input, a gate voltage (a voltage difference between the gate and the source) of the TFT 51 is determined in accordance with the voltage of the input video signal. A drain current of the TFT 51, which flows via the gate voltage, is supplied to the light emitting element 53, and the light emitting element 53 emits light via the supplied current.

Since a TFT formed with poly-silicone is higher than a TFT formed with amorphous silicon in the field-effect mobility and has a large ON-current, the TFT formed with poly-silicone is more suitable to a transistor for a luminescent panel than the TFT formed with amorphous silicon.

However, the electrical characteristics of the TFT utilizing the poly-silicon can not compared to the characteristics of a MOS transistor formed on a, what is called, single crystal silicon substrate. For example, the field-effect mobility of the TFT utilizing the poly-silicone is $\frac{1}{10}$ or less of the single crystal silicon. Further, the TFT utilizing the poly-silicon has such a defect as that dispersion of the characteristics is caused easily from defects formed in the boundary of crystal grains.

In the pixel shown in FIG. 41, when the characteristics such as threshold, ON-current or the like of the TFT 51 disperse at each pixel, even when the voltage of the video signal is the same, the magnitude of the drain current of the TFT 51 varies among the pixels resulting in the dispersion of the luminance of the light emitting element 53.

A problem, which resides in putting a light emitting device utilizing an OLED into practical use, is the short life of the OLED due to a deterioration of the organic luminescent layer. The organic luminescent material is weak to moisture content, oxygen, light and heat; and the deterioration thereof is accelerated thereby. Particularly, speed of the deterioration depends on the configuration of a device that drives the light emitting device, the characteristics of the organic luminescent material, the material of the electrode and the driving method of the light emitting device, or the like.

Even when the voltage impressed the organic luminescent layer is the same, when the organic luminescent layer deteriorates, the luminance of the OLED is decreased resulting in an unclearness of the displayed picture.

Further, the temperature of the organic luminescent layer depends on the temperature of outside air or the heat emitted from the OLED panel itself or the like. Generally, in the OLED, the value of the current flow varies depending on the temperature. Particularly, when the voltage is the same, when the temperature of the organic luminescent layer increases, the current that flows to the OLED becomes larger. And since the current that flows to the OLED and the luminance of the OLED are in a proportional relationship, the larger current that flows to the OLED leads to the higher luminance of the OLED. As described above, since the luminance of the OLED varies depending on the temperature of the organic luminescent layer, it is difficult to display a desired tone, and accompanying to a raise of the temperature, the current consumption of the light emitting device becomes larger.

SUMMARY OF THE INVENTION

Accordingly, in order to solve the above-described problem, it is an object of the present invention to provide a light emitting device that is capable of preventing the luminance of the light emitting element from dispersing due to the characteristics of the TFT that controls the current supplied to the light emitting element; preventing the luminance of the light emitting element from decreasing due to the deterioration of the organic luminescent layer; and further, providing a constant luminance without depending on the deterioration or the temperature changes of the organic luminescent layer, or the like.

Inventors of the present invention observed that, compared to a method of emitting light by way of preserving a certain voltage added to an OLED to be constant, a method of emitting light by way of preserving a certain amount of current flowing into the OLED could minimize possible lowering of luminance of the OLED caused by degradation of the organic light emitting layers. It should be noted that, henceforth, a current flowing into a light-emitting device is called a "drive current", whereas a voltage applied to the light-emitting device is called a "drive voltage" in the following description.

Inventors conceived that it might be possible to preserve a volume of the current flowing into light-emitting device at a desired constant value without being affected by characteristics of a TFT and also prevent the luminance of the OLED from being varied by degradation of the OLED itself by way of properly controlling the current flowing into the TFT via a signal-line drive circuit in place of a method of controlling the luminance of the light-emitting device by applying a voltage to the TFT.

As was previously introduced by a technical paper shown in "TSUTSUI T, JPN J Appl. Phys. Part 2, Vol. 37, No. 11B, Page L1406-L1408, 1998", it was detected that degradation of current/voltage characteristics of the light-emitting device can be decreased by applying a drive voltage bearing an inverse polarity to the light-emitting device per specific period of time. Utilizing the detected characteristics, in addition to the above-described configuration, the present invention provides a light-emitting device with such a voltage biasing in an inverse direction every specific period of time. Inasmuch as the light-emitting element corresponds to a diode, the light-emitting element emits light when a bias voltage is added in the normal direction, whereas it does not emit light when it receives the voltage biasing in an inverse direction.

As described above, by applying an AC-drive method for the light emitting device with which a drive voltage biasing in an inverse direction is applied every predetermined period, it is possible to minimize degradation of current/voltage characteristics of individual light emitting elements, and thus, it is possible to extend actual service life of individual light emitting elements as compared with cases where the conventional drive methods are used.

The above-described two-way configurations provide multiplied effect, whereby making it possible to prevent the luminance of the OLED from being lowered by possible degradation of the organic light-emitting layers, and it is also possible to preserve volume of current flowing into the light-emitting elements at a desired constant value without adversely being affected by characteristics of the TFT.

Further, as described above, when an image is displayed per frame period via AC-current drive, the displayed pixel may visibly generate flicker. Because of this, when applying AC-current drive, it is desired that flicker be prevented from occurrence by way of driving a light emitting element with a frequency higher than that does not cause flicker to be generated visibly via DC-current drive to which only the normal directional bias voltage is applied.

By virtue of the above arrangement, unlike a conventional light emitting device shown in FIG. 41, in the present invention, it is possible to prevent the luminance of the light emitting elements from being varied between the pixels even when characteristics of a TFT for controlling the current fed to the light emitting elements are varied per pixel. Further, unlike the case of driving such a conventional TFT 51 comprising voltage-input type pixels shown in FIG. 41 in a linear region, it is possible to prevent the luminance from being lowered via degradation of the light emitting elements. Further, even when the temperature of the organic light emitting layers is affected by the outside temperature or heat generated by the light-emitting panel itself, it is still possible to prevent the luminance of the light emitting elements from being varied, and it is also possible to prevent the current from increasingly being consumed relative to the rise of the temperature.

In the light emitting device according to the present invention, a transistor used for composing the pixel may be a single crystal silicon transistor, a thin-film transistor utilizing polysilicon or amorphous silicon, or a transistor utilizing an organic semiconductor.

Further, the transistors provided for the pixels of the light emitting device of the present invention may include a single-gate configuration, a double-gate configuration, or a multiple gate configuration incorporating more than the double-gate electrodes.

BRIEF DESCRIPTION OF THE DRAWINGS

FIGS. 23A to 23C are schematic diagrams of the pixel being operation;

FIGS. 34A to 34B are views showing a manufacturing method of the light emitting device according to the invention;

DESCRIPTION OF THE PREFERRED EMBODIMENTS

Figure 1:
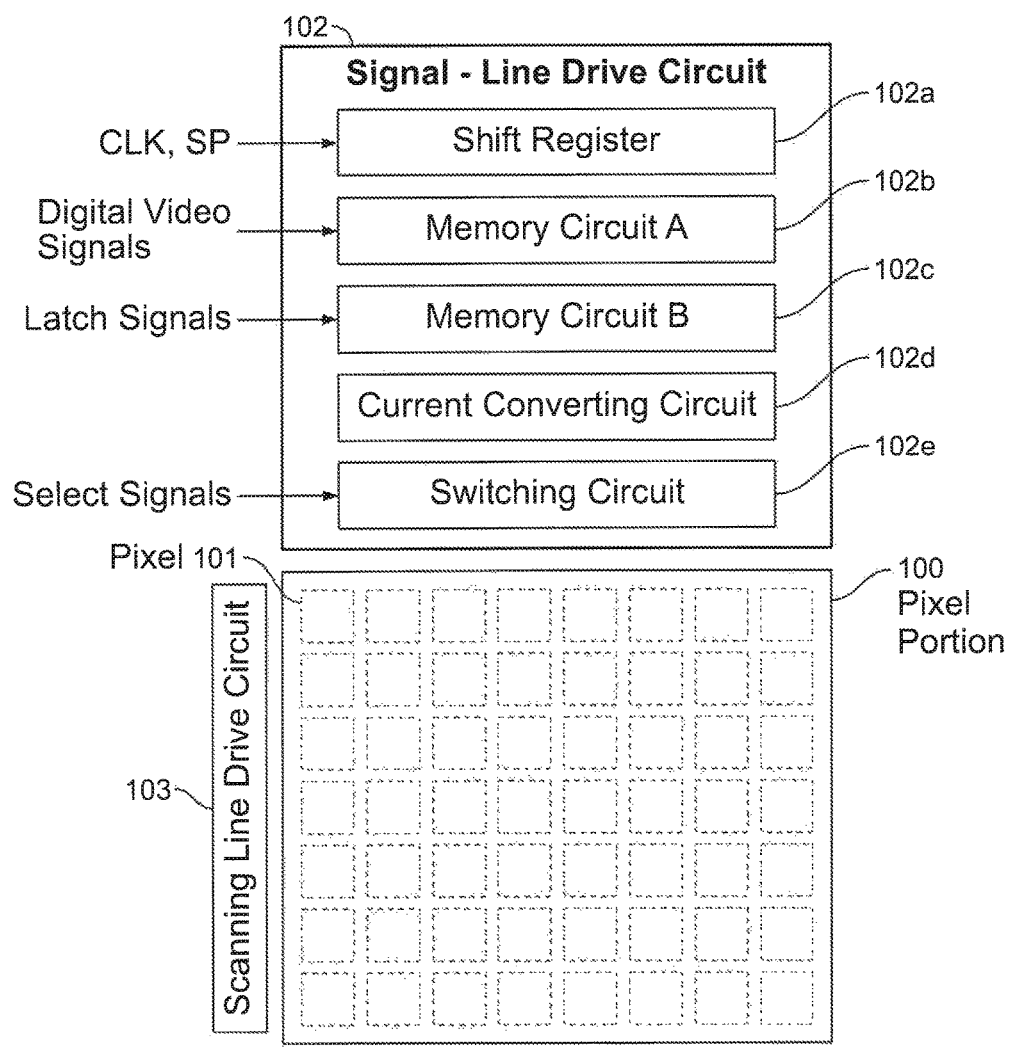
FIG. 1 is a block diagram of a light emitting device according to the invention.

FIG. 1 is a block diagram for showing a structure of the light emitting device according to the present invention. Reference numeral 100 designates a pixel portion, in which a number of pixels 101 are disposed in a matrix shape. Reference numeral 102 designates a signal-line drive circuit. Reference numeral 103 designates a scanning line drive circuit.

In FIG. 1, the signal-line drive circuit 102 and the scanning-line drive circuit 103 are formed on an identical substrate loaded with the pixel portion 100. However, the scope of the present invention is not limited to the above arrangement. Alternatively, the arrangement may also be implemented, in which the signal-line drive circuit 102 and the scanning-line drive circuit 103 are formed on a substrate different from the one loaded with the pixel portion 100 and connected to the pixel portion 100 via a connector such as an FPC. In FIG. 1, each single unit of the signal-line drive circuit 102 and the scanning-line drive circuit 103 are provided. However, the scope of the present invention is not limited to this arrangement but the number of the signal-line drive circuit 102 and the scanning-line drive circuit 103 may be defined by design engineers optionally.

Unless otherwise specifically defined, the term "connection" described in this specification means electrical connection, whereas the term "disconnection" means the state of electrical disconnection.

Although not shown in FIG. 1, the pixel portion 100 is provided with a plurality of signal lines S1-Sx, power supply lines V1-Vx, and scanning lines G1-Gy. The numbers of the signal lines and the power supply lines are not always identical to each other. Further, it not always required to jointly provide both wirings, but, aside from these, other different wirings may also be provided.

It is possible for the signal-line drive circuit 102 to feed such an amount of the current compatible with the voltage of input video signal to individual signal lines S1-Sx. In the case of feeding a voltage biasing in an inverse direction to a light emitting element shown in FIG. 2, the signal-line drive circuit 102 functions itself to apply to the gate of a corresponding TFT the voltage enough to turn ON the TFT for controlling the magnitude of the current or voltage that should be fed to the light emitting element 104. More particularly, in the present invention, the signal-line drive circuit 102 comprises the following: a shift register 102a, a memory circuit A 102b for storing a digital video signal, a memory circuit B 102c, a current converting circuit 102d for generating current compatible with a voltage borne by the digital video signal by applying a constant current supply source, and a switching circuit 102e which feeds the generated current to a signal line, and applies a voltage enough to turn ON a TFT for controlling the magnitude of current or voltage fed to the light emitting element only during a period of applying a voltage biasing in an inverse direction to the light emitting element. It should be understood that the configuration of the signal-line drive circuit 102 built in the light emitting device of the present invention is not limited to the one described above. Although FIG. 1 exemplifies the signal-line drive circuit 102 compatible with a digital video signal, the scope of the signal-line drive circuit of the present invention is not limited to the one just cited above, but the signal-line drive circuit of the present invention may also be compatible with an analog video signal as well.

Figure 2:
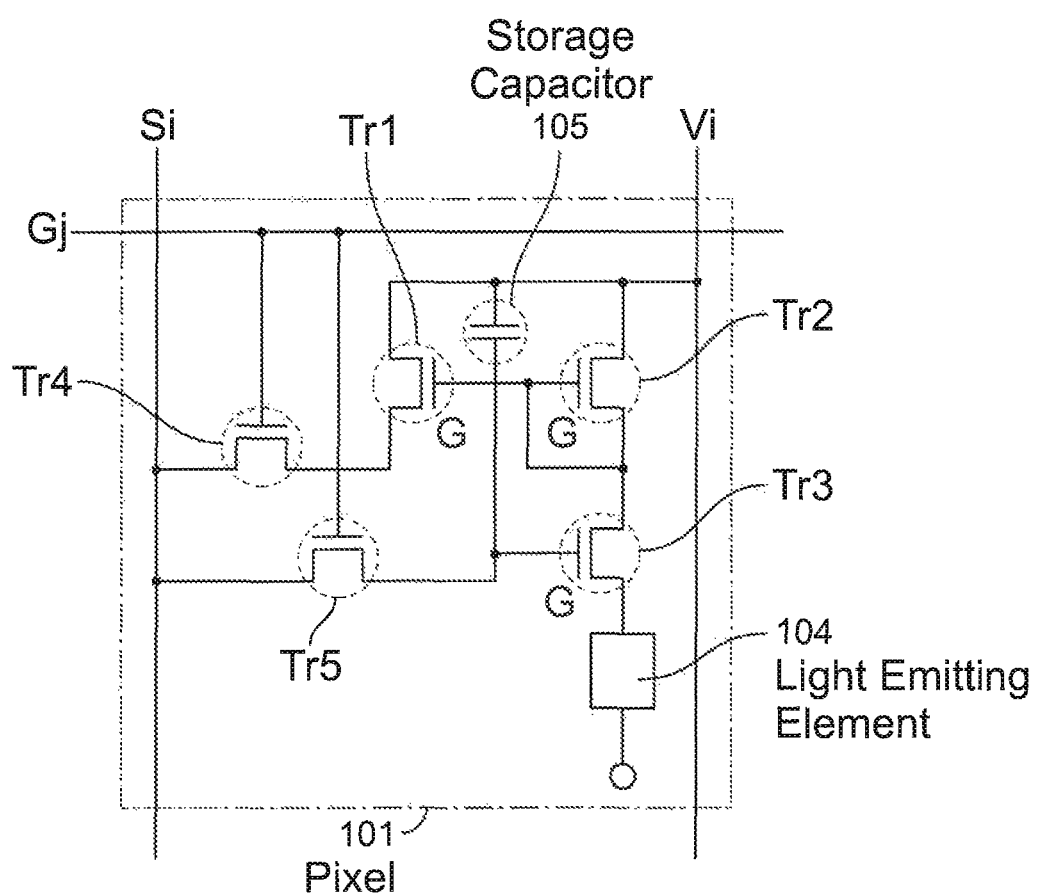
FIG. 2 is a circuit diagram of a pixel of the light emitting device according to the invention.

FIG. 2 shows a detailed structure of the pixel 101 shown in FIG. 1. The pixel 101 shown in FIG. 2 comprises a signal line Si being one of the signal-line components S1-Sx, a scanning line Gj being one of the scanning line components G1-Gy, and a power-supply line Vi being one of the power-supply line components V1-Vx. In addition, the pixel 101 further comprises transistors Tr1, Tr2, Tr3, Tr4 and Tr5, a light emitting element 104, and a storage capacitor 105. The storage capacitor 105 is provided in order to hold more securely on a predetermined gate voltage between the gates and sources of the transistors Tr1 and Tr2. However, provision of the storage capacitor 105 is not always required. Note that unless otherwise specifically defined, the term 'voltage' described in this specification means a potential difference against ground potential.

Both of gates of a transistor Tr4 and a transistor Tr5 are connected to a scan line Gj. One of a first terminal and a second terminal (either one is defined as "source"; and another one is defined as "drain") of the transistor Tr4 is connected to a signal line Si, and another one thereof is connected to a second terminal of a transistor Tr1. Also, one of a first terminal and a second terminal of the transistor Tr5 is connected to the signal line Si, and another one thereof is connected to a gate of a transistor Tr3.

Gates of the transistors Tr1 and Tr2 are connected to each other. Both of first terminals of the transistors Tr1 and Tr2 are connected to a power supply line Vi. The gate and a second terminal of the transistor Tr2 are connected to each other, and further, the second terminal is connected to a first terminal of the transistor Tr3.

A second terminal of the transistor Tr3 is connected to a pixel electrode included in a light emitting element 104. The light emitting element 104 has an anode and a cathode. Herein, when the anode is used as a pixel electrode, the cathode will be called as "counter electrode"; while when the cathode is used as a pixel electrode, the anode will be called as "counter electrode". The voltage of the counter electrode is held at a predetermined level.

The transistors Tr4 and Tr5 may be any of n-channel transistor and p-channel transistor. However, the transistors Tr4 and Tr5 have the same polarity.

Further, the transistors Tr1, Tr2 and Tr3 may be any of the n-channel transistor and the p-channel transistor. However, the transistors Tr1, Tr2 and Tr3 have the same polarity. And when the anode is used as the pixel electrode and the cathode is used as the counter electrode, it is preferred that the transistors Tr1, Tr2 and Tr3 are of the p-channel transistor. To the contrary, when the anode is used as the counter electrode and the cathode is used as the pixel electrode, it is preferred that the transistors Tr1, Tr2 and Tr3 are of the n-channel transistor.

One of two electrodes included in a storage capacitor 105 is connected to the gate of the transistor Tr3, and another one thereof is connected to the power supply line Vi. Although the storage capacitor 105 is provided to reliably maintain the voltage (gate voltage) between the gate and the source of the transistor Tr3, it is not always necessary to provide the same. Also, a storage capacitor for reliably maintaining the gate voltage of the transistors Tr1 and Tr2 may be formed.

Next, referring to FIG. 3, the operation of the light emitting device according to the mode of embodiment of the invention. The operation of the light emitting device according to the invention will be described being separated into a write period Ta, a display period Td and an inverted bias period Ti on each pixel of the respective lines. FIG. 3 is a diagram showing the connections of the transistors Tr1, Tr2, Tr3 and the light emitting element 104 during each period. Herein, an example in which Tr1, Tr2 and Tr3 are made of the p-channel type TFT, and the anode of the light emitting element 104 is used as the pixel electrode is given.

First, when the write period Ta starts at a pixel of each line, the voltage of the power supply lines V1-$V_x$ is held at a level so that the current of forward bias flows to the light emitting element when the transistors Tr1 and Tr2 are turned ON. That is to say, when Tr1, Tr2 and Tr3 are of p-channel type TFT and the anode of the light emitting element 104 is used as the pixel electrode, the voltage of the power supply line Vi is set so as to be higher than that of the counter electrode. To the contrary, when Tr1, Tr2 and Tr3 are of n-channel type TFT and the cathode of the light emitting element 104 is used as the pixel electrode, the voltage of the power supply line Vi is set so as to be lower than that of the counter electrode.

Although FIG. 1 shows a configuration of a light emitting device that displays monochrome pictures, the invention may be applied to a light emitting device for displaying color pictures. In that case, the voltage of each power supply line of V1-$V_x$ may not be held at the same level, but the voltage thereof may be changed corresponding to each color.

Scan lines of each line are selected in order by a scan line drive circuit 103, and transistors Tr4 and Tr5 are turned ON. The selected periods of the respective scan lines do not overlap with each other. When a current Ic (hereinafter, referred to as "signal current Ic") of a magnitude corresponding to the voltage of a video signal is supplied to the signal lines S1-Sx based on the video signal input to the signal line drive circuit 102, the voltage of the gate of Tr3 lowers and finally reaches to a voltage which is the voltage of the power supply line Vi subtracted by the thresholds of Tr2 and Tr3. When Tr1, Tr2 and Tr3 are of n-channel type TFT, a signal current Ic of a magnitude that the voltage of the gate of Tr3 is increased thereby is supplied to the signal lines S1-Sx, so that the voltage finally reaches to a voltage which is the voltage of the power supply line Vi added by the thresholds of Tr2 and Tr3.

Here, since the gate and the drain are connected to each other, Tr2 operates in a saturated zone. Accordingly, Tr2 and Tr3 are turned ON and a drain current begins to flow. Since Tr2 and Tr1 are connected to each other via the gates and the sources thereof, when Tr2 is turned ON, the drain current begins to flow to Tr1, too.

The drain current $I_1$ of Tr1 is held at the same magnitude as the signal current Ic being supplied to the signal line S1-Sx. At this time, a voltage, in which the gate voltage $V_{GS}$ of Tr2 and the gate voltage $V_{GS}$ of Tr3 are combined, is held in the storage capacitor 105. Accordingly, if the characteristics of Tr1, Tr2 and Tr3 are the same, since it becomes as $|V_{GS}-V_{TH}|<|V_{DS}|$, Tr1 operates in the saturated zone.

Figure 3A:
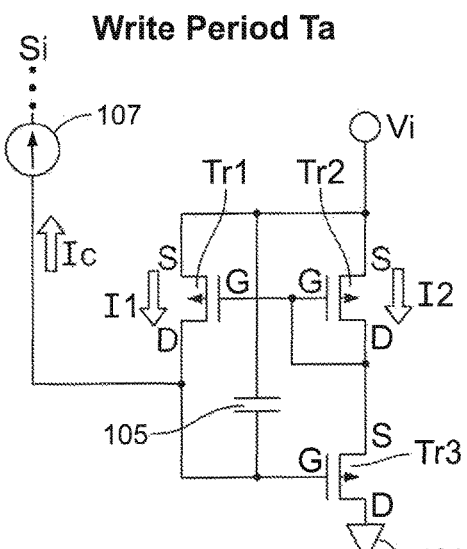
FIGS. 3A to 3C are schematic diagrams of the pixel being operation.

FIG. 3A shows a schematic diagram of a pixel 101 in the write period Ta. Reference numeral 106 denotes a terminal for connecting with a power supply that supplies a voltage to the counter electrode. Also, reference numeral 107 denotes a constant current source included in the signal line drive circuit 102.

As described above, since Tr1 operates in the saturated zone, Tr1 operates in accordance with Expression 1. Herein, "$V_{GS}$" denotes gate voltage; "$\mu$" denotes mobility; "$C_0$" denotes gate capacitance per unit area; "W/L" denotes ratio between channel width W and channel length L of area formed with the channel; "$V_{TH}$" denotes threshold and "I" denotes drain current.

$$I=\mu C_0 W/L(V_{GS}-V_{TH})^2/2 \qquad \text{[Expression 1]}$$

In Expression 1, "$\mu$", "$C_0$", "W/L" and "$V_{TH}$" are all fixed value respectively determined by each transistor. Since the signal current Ic and the drain current $I_1$ of Tr1 are equal to each other, it is demonstrated by Expression 1 that the gate voltage $V_{GS}$ of the transistor Tr1 is determined by the current value Ic of the signal current.

Since the gate of the transistor Tr2 is connected to the gate of the transistor Tr1 while the source of the transistor Tr2 is connected to the source of the transistor Tr1, the gate voltage of the transistor Tr1 is the gate voltage of transistor Tr2 as it is. Accordingly, the drain current of the transistor Tr2 is proportional to the drain current of the transistor Tr1. Particularly, when the values of $\mu C_0 W/L$ and $V_{TH}$ thereof are equal to each other, the drain currents of the transistor Tr1 and transistor Tr2 are equal to each other resulting in $I_2$=Ic.

The drain current $I_2$ of the transistor Tr2 flows to the light emitting element 104 via the area formed with the channel of the transistor Tr3. Accordingly, the drive current that flows to the light emitting element has a magnitude corresponding to the signal current Ic determined by the constant current source 107. The light emitting element 104 emits light at the luminance corresponding to the magnitude of the drive current. When the current that flows to the light emitting element 104 is extremely close to 0, or when the current that flows to the light emitting element is of inverted bias, the light emitting element 104 does not emit light.

When the drain current $I_2$ flows to the area formed with the channel of the transistor Tr3, a gate voltage of a magnitude corresponding to the value of the drain current $I_2$ is generated by the transistor Tr3 in accordance with Expression 1.

When the write period Ta has terminated, the selection of the scan lines of each line completes. When the write period Ta completes at the pixel of each line, the display period Td starts at the pixel of each line. The voltage of the power supply line Vi during the display period Td is held at the same level as the voltage during the write period Ta.

Figure 3B:
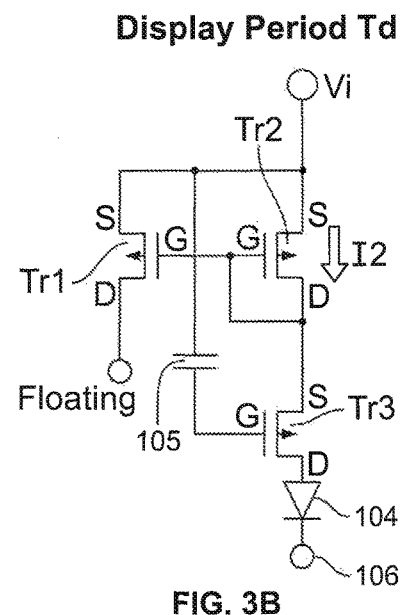

FIG. 3B shows a schematic diagram of the pixel in the display period Td. The transistor Tr4 and transistor Tr5 are in the state of OFF. Further, the sources of the transistor Tr1 and transistor Tr2 are connected to the power supply line Vi.

During the display period Td, the drain of the transistor Tr1 is in the state of, what is called, "floating" in which no voltage is given by other wiring, power supply or the like. On the other hand, in the transistors Tr2 and Tr3, $V_{GS}$ determined in the write period Ta is held. Accordingly, the value of the drain current $I_2$ of the transistor Tr2 is held at the same magnitude as Ic, and the drain current $I_2$ is supplied to the light emitting element 104 via the area formed with the channel of the transistor Tr3. Accordingly, during the display period Td, the light emitting element 104 emits light at the luminance corresponding to the magnitude of the drive current determined in the write period Ta.

Immediately after the write period Ta, always the display period Td appears. Immediately after the display period Td, the next write period Ta appears, or the inverted bias period Ti appears.

When the inverted bias period starts, the voltage of the power supply lines V1-$V_x$ is held at a level that a voltage of inverted bias is impressed to the light emitting element when the transistors Tr2 and Tr3 are turned ON. That is to say, when Tr1, Tr2 and Tr3 are of p-channel type TFT and the anode of the light emitting element 104 is used as the pixel electrode, the voltage of the power supply line Vi is set so as to be lower than that of the counter electrode. To the contrary, when Tr1, Tr2 and Tr3 are of n-channel type TFT and the cathode of the light emitting element 104 is used as the pixel electrode, the voltage of the power supply line Vi is set so as to be higher than that of the counter electrode.

The scan lines of each line are selected in order by the scan line drive circuit 103, and the transistors Tr4 and Tr5 are turned ON. And a voltage that turns ON the transistors Tr2 and Tr3 is impressed to each of the signals line S1-Sx by the signal line drive circuit 102. That is to say, a voltage lower than the voltage in which the threshold voltage $V_{TH}$ of Tr2 and the threshold voltage $V_{TH}$ of Tr3 are combined is impressed. When Tr1, Tr2 and Tr3 are of n-channel type TFT, a voltage higher than the voltage in which the threshold voltage $V_{TH}$ of Tr2 and the threshold voltage $V_{TH}$ of Tr3 are combined is impressed.

Figure 3C:
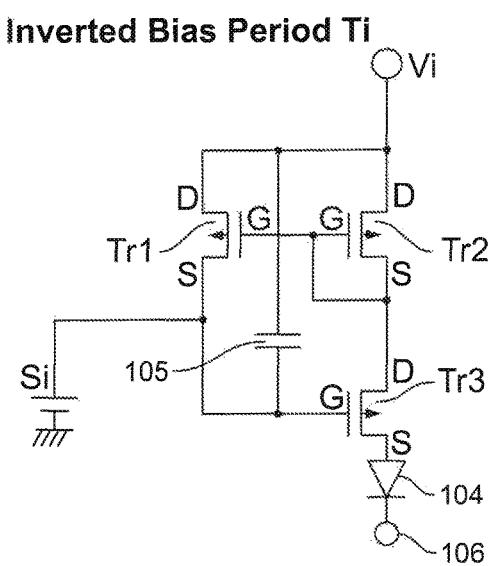

FIG. 3C shows a schematic diagram of the pixel 101 in the inverted bias period Ti. During the inverted bias period Ti, since Tr2 and Tr3 are turned ON, a voltage of inverted bias is impressed to the light emitting element 104. The light emitting element 104 gets into a state that the same does not emits light when an inverted bias voltage is impressed thereto.

In the pixel shown in FIG. 2, during the inverted bias period Ti, since Tr3 is turned ON by a voltage input to the signal line and operates in a linear zone, the voltage difference between the source and the drain becomes equal to approximately 0. However, since the gate and the source of Tr2 are connected to each other and the voltage Vi of the power supply line is lower than the voltage of the counter electrode, Tr2 is in the state of OFF, and the voltages of the source and the drain of the Tr2 do not become equal to each other. Accordingly, the voltage of the inverted bias impressed to the light emitting element 104 does not become equal to the voltage difference between the power supply line Vi and the counter electrode, but becomes to a value that is the voltage difference between the counter electrode and the power supply line Vi subtracted by $V_{DS}$ of Tr2. However, since it is possible to impress the voltage of inverted bias reliably to the light emitting element 104, it is possible to prevent the luminance from decreasing due to deterioration of the light emitting element.

It is possible for a designer to set the length of the inverted bias period Ti appropriately while taking into consideration the duty ratio (ratio of sum of the length of display periods in one frame period).

In the case of driving method of time-tone using digital video signal (digital driving method), it is possible to display a picture by making the write period Ta and the display period Td corresponding to the digital video signal of each bit appear repeatedly in one frame period. For example, when a picture is displayed by the video signal of n-bit, at least n-time write periods and n-time display periods are provided in one frame period. N-time write periods (Ta1-Tan) and n-time display periods (Td1-Tdn) correspond to each bit of the video signal.

For example, next to the write period Tam (m is any number from 1-n), a display period corresponding to the same bit-number; i.e., in this case, Tdm appears. A combination of the write period Ta and the display period Td is called as "sub-frame period SF". A sub-frame period, which includes a write period Tam corresponding to m-bit and a display period Tdm, is called as "SFm".

When the digital video signal is used, the inverted bias period Ti may be provided immediately after the display period Td1-Tdn, or the same may be provided immediately after the display period that appears in the last of a frame period within Td1-Tdn. Also, it is not always necessary to provide the inverted bias period Ti to every frame period, but the same may be provided so as to appear every several frame periods. It is possible for designer to appropriately set how many, what timing and how long period should the inverted bias period Ti appear.

Figure 4:
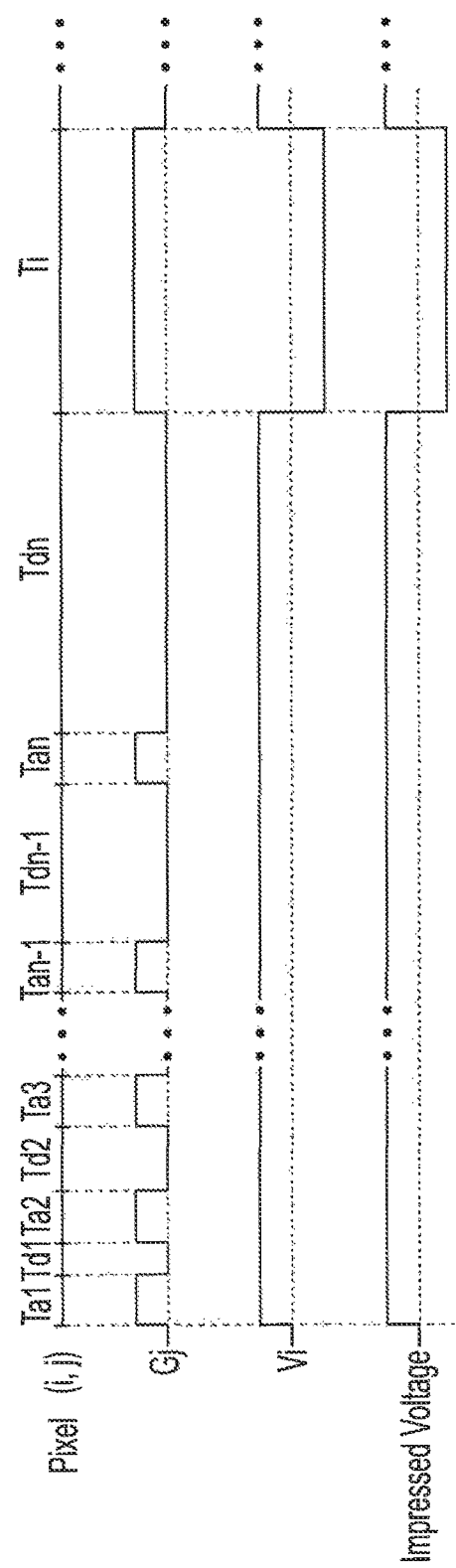
FIG. 4 is a timing chart of the voltage impressed to a scan line and a power supply line.

FIG. 4 shows a timing chart of a voltage impressed to a scan line, a voltage impressed to a power supply line and a voltage impressed to a light emitting element at a pixel (i, j) in the case that the inverted bias period Ti appears in the last of a frame period. FIG. 4 shows a case that both of Tr4 and Tr5 are of n-channel TFT; Tr1, Tr2, and Tr3 are of p-channel TFT. In every write period Ta1-Tan and the inverted bias period Ti, a scan line Gj is selected, and Tr4 and Tr5 are ON. In every display period Td1-Tdn, a scan line Gj is not selected, and Tr4 and Tr5 are OFF. Further, the voltage of the power supply line Vi is held at a level that a current of forward bias flows to the light emitting element 104 when the Tr2 and Tr3 are tuned ON in every write period Ta1-Tan and every display period Td1-Tdn; and, in the inverted bias period Ti, the voltage of the power supply line Vi is held at a level that a voltage of inverted bias is impressed to the light emitting element 104. The impressed voltage of the light emitting element is held in forward bias during every write period Te1-Tan and every display period Td1-Tdn, and is held in inverted bias during the inverted bias period Ti.

The length of the sub-frame period SF1-SFn satisfies the following conditions; i.e., SF1: SF2: . . . :SFn=$2^0$: $2^1$: . . . : $2^{n-1}$.

In every sub-frame period, it is selected whether or not the light emitting element is made to emit light by each bit of the digital video signal. And by controlling the sum of the length of display periods that light is emitted during one frame period, it is possible to the control the tone number.

In order to improve the quality of the pictures on the display, a sub-frame period having a long display period may be divided into several segments. The method of practical segmentation is disclosed in Japanese Patent Application No. 2000-267164.

Also the tone may be displayed in combination with area-tone.

In the case that the tone is displayed using an analog video signal, when write period Ta and display period Td terminate, one frame period completes. One picture is displayed in one frame period. And then, the next frame period starts, the write period Ta starts again and the above-described operation is repeated.

In the case that the analog video signal is used, the inverted bias period Ti is provided immediately after the display period Td. It is not always necessary to provide the inverted bias period Ti to every frame period, but the same may be provided so as to appear every several frame periods. It is possible for designer to appropriately set how many, what timing and how long period should the inverted bias period Ti appear.

Figure 41:
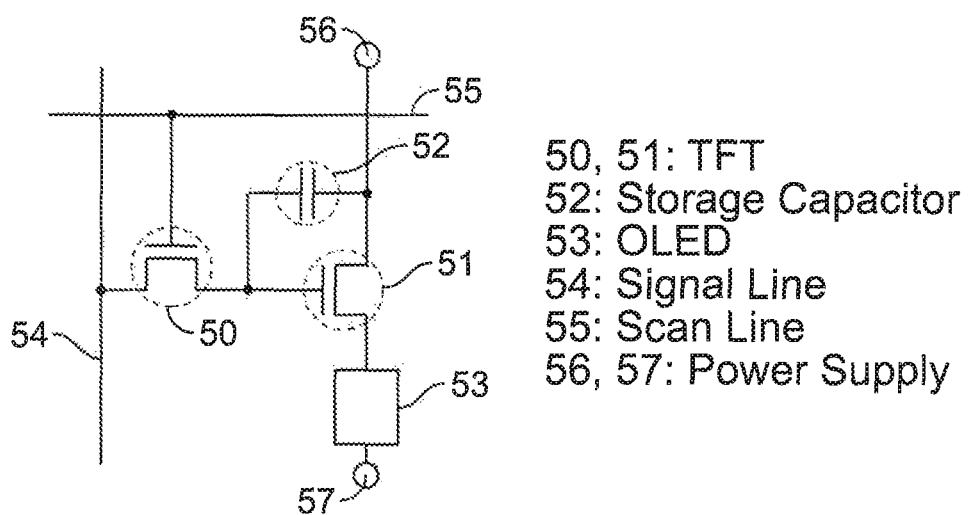
FIG. 41 is a circuit diagram of an ordinary pixel.

According to the invention, compared to an ordinary light emitting device shown in FIG. 41, even when the characteristics of the transistors Tr2 and Tr3 disperse in each pixel, it is possible to prevent the luminance of the light emitting element dispersing during the pixel. Further, compared to the case that a TFT 51 provided with a voltage input type pixel shown in FIG. 41 is operated in a linear zone, it is possible to prevent the luminance from decreasing due to deterioration of the light emitting element. Furthermore, even when the temperature of the organic luminescent layer is influenced by the outside air temperature, the heat emitted from the luminescent panel itself or the like, it is possible to prevent the luminance of the light emitting element from varying. Also, it is possible to prevent the current consumption from increasing accompanying the temperature raise.

In the pixel according to the invention, it is acceptable if Tr4 and Tr5 are connected as shown in FIG. 3A during the write period Ta; the same are connected as shown in FIG. 3B during the display period Td; and the same are connected as shown in FIG. 3C during the inverted bias period Ti.

As for the light emitting element adopted in the invention, hole injection layer, electron injection layer, hole conduction layer, electron conduction layer or the like may be formed with single inorganic compound, or with a material in which organic compound and inorganic compound are mixed. Also, a part thereof may be mixed with each other.

EXAMPLES

Hereafter, examples of the invention will be described.

Example 1

Figure 5:
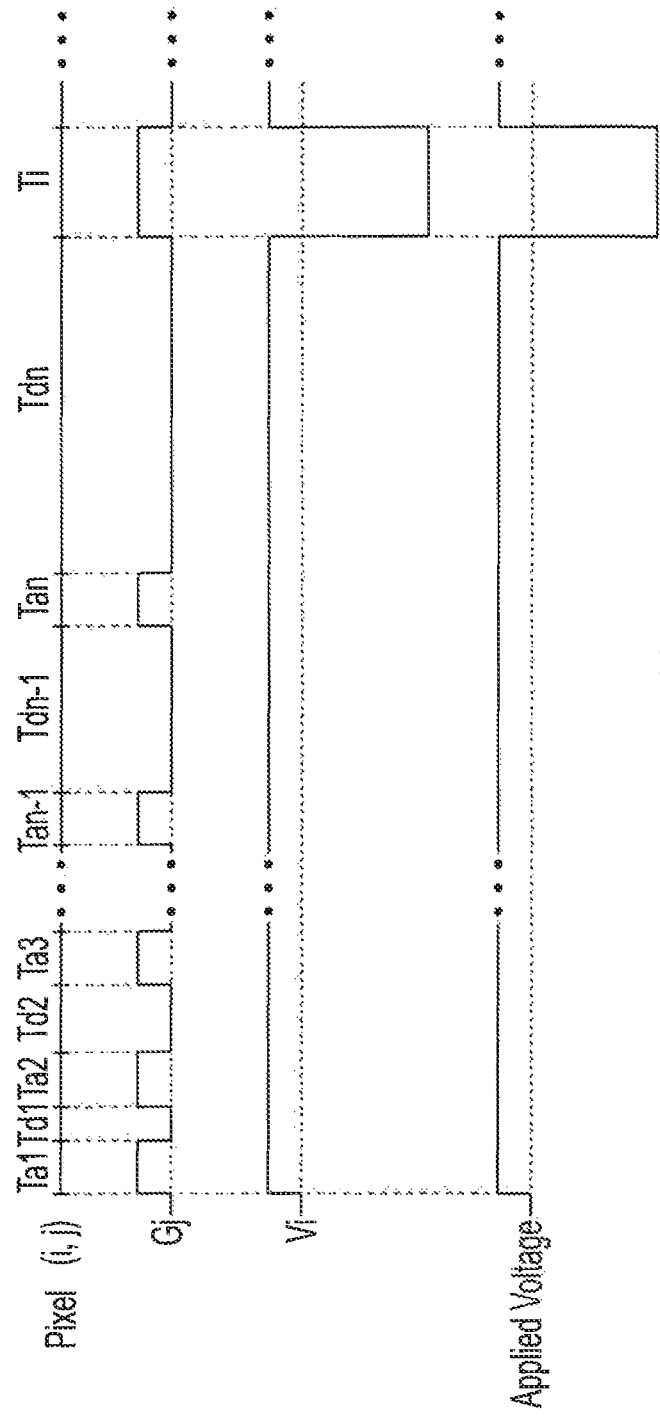
FIG. 5 is a timing chart of the voltage impressed to a scan line and a power supply line.

Taking a pixel shown in FIG. 2 for example, description on this example refers to a case in which the inverse biasing period Ti is made to appear based on a timing that differs from that shown in FIG. 4. Referring now to FIG. 5, a drive method according to this example is described below.

FIG. 5 exemplifies a timing chart of a voltage applied to individual scanning lines, a voltage applied to the power supply line, and a voltage fed to a light emitting element in a pixel (i, j) in this example. FIG. 5 exemplifies a case in which the transistors Tr1 Tr2 and Tr3 are composed of p-channel type TFTs, whereas the transistors Tr4 and Tr5 are both composed of n-channel type TFTs.

It is defined that the total length comprising the write in periods Ta1-Tan and the display periods Td1-Tdn corresponds to T_1 and a potential difference between the power supply line Vi and an opposing electrode of the light emitting element during the writing and display periods is expressed as V_1. Further, duration of the inverse biasing period Ti is expressed in terms of T_2, whereas the potential difference between the power supply line Vi and an opposing electrode of the light emitting element during the inverse biasing period Ti is expressed in terms of V_2. In this example, the voltage of the power supply line Vi is held at such a magnitude corresponding to an equation shown below.

$$|T\_1 \times V\_1| = |T\_2 \times V\_2|$$

Further, the voltage of the power supply line Vi is held at such a magnitude just enough to enable the light emitting element 104 to receive the voltage biasing in an inverse direction.

It is conceived that, by causing certain ionic impurities present in organic light emitting layers to be deposited on the side of one of electrode components, a portion bearing a certain resistance value lower than that of other portions is formed in part of the organic light emitting layers to cause current to intensely flow into the low-resistance portion, whereby expediting degradation of the organic light emitting layers. According to the present invention, it is possible to prevent such ionic impurities from being deposited on one of electrode components by applying an inverted drive method, thus further preventing the organic light emitting layers from incurring unwanted degradation. In particular, in this example of the present invention, based on the above-described configuration, rather than merely applying the inverted drive method, it is possible to prevent ionic impurities from solely being deposited on one of electrode components, whereby more securely preventing the organic light emitting layers from incurring unwanted degradation.

Example 2

Figure 6:
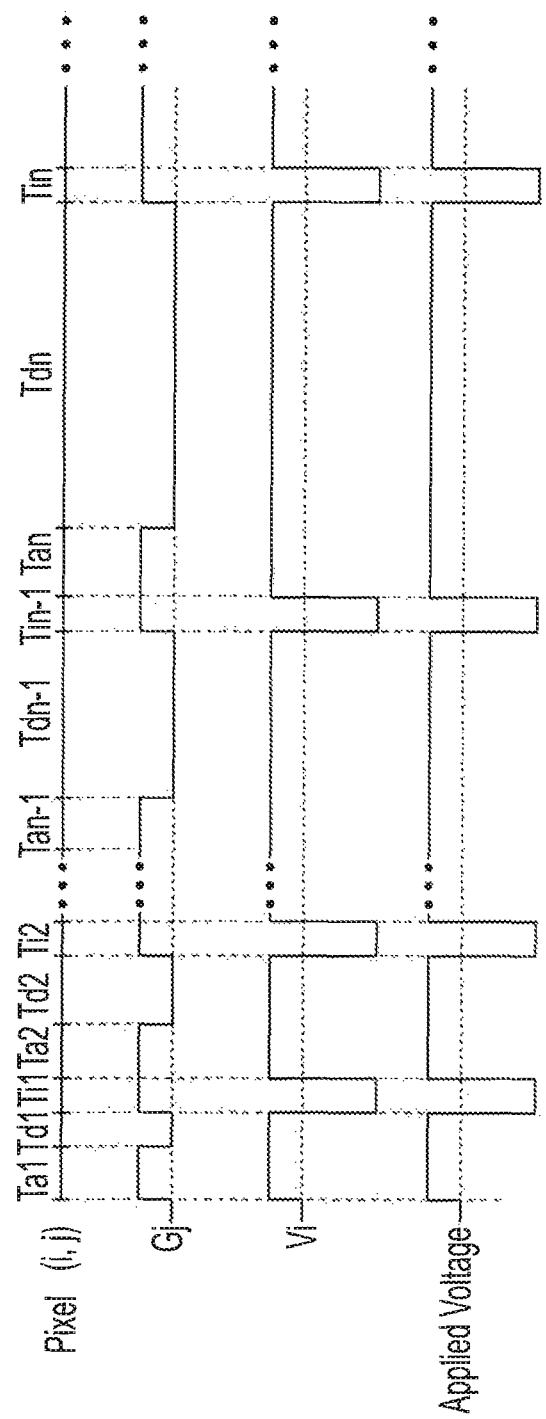
FIG. 6 is a timing chart of the voltage impressed to a scan line and a power supply line.

Taking a pixel shown in FIG. 2 for example, description on this example refers to a case in which the inverse biasing period Ti is made to appear based on a timing that differs from those shown in FIGS. 4 and 5. Referring now to FIG. 6, a drive method according to this example is described below.

FIG. 6 exemplifies a timing chart of a voltage applied to individual scanning lines, a voltage applied to the power supply line, and a voltage fed to a light emitting element in a pixel (i, j) in this example. FIG. 6 exemplifies a case in which the transistors Tr1, Tr2 and Tr3 are all composed of p-channel type TFTs, whereas the transistors Tr4 and Tr5 are both composed of n-channel type TFTs.

In this example, immediately after termination of individual display periods Td1-Tdn, in other words, immediately after terminating individual sub-frame periods, the inverse biasing periods Ti1-Tin respectively appear. For example, while the m-th sub-frame period SFm remains (where m corresponds to an optional number among 1-n of numbers), immediately after terminating the write in period Tam, the display period Tdm appears. It is so arranged that the inverse biasing period Tim appears immediately after terminating the display period Tdm.

In this example, it is such arranged that individual durations of the inverse biasing periods Ti1-Tin are exactly identical to each other, and yet, an identical magnitude of voltage of the power supply line Vi is fed during all the operating periods. However, the scope of the present invention is not limited to the above arrangement. Duration of individual inverse biasing periods Ti1-Tin and applicable voltage may optionally be set by design engineers.

Example 3

Figure 7:
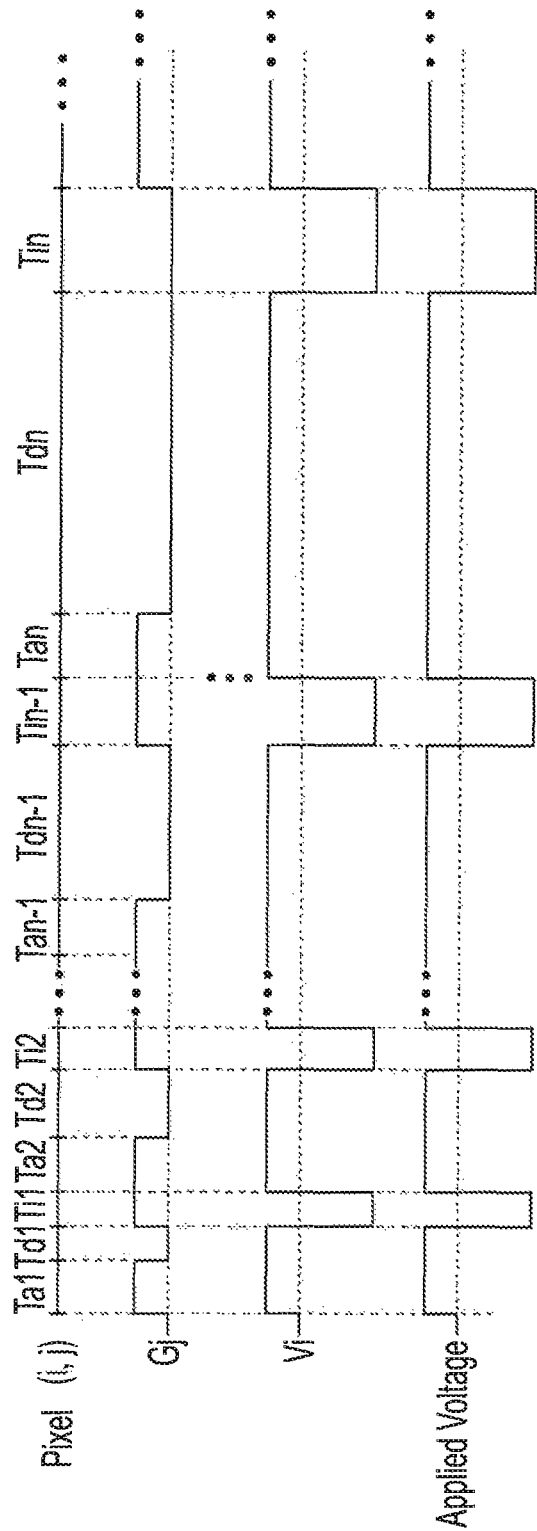
FIG. 7 is a timing chart of the voltage impressed to a scan line and a power supply line.

Taking a pixel shown in FIG. 2 for example, description on this example refers to a case in which the inverse biasing period Ti is made to appear based on a timing that differs from those shown in FIGS. 4 to 6. Referring now to FIG. 7, a drive method according in this example is described below.

FIG. 7 exemplifies a timing chart of a voltage applied to individual scanning lines, a voltage applied to the power supply line, and a voltage fed to a light emitting element in a pixel (i, j) in this example. FIG. 7 exemplifies a case in which the transistors Tr1, Tr2 and Tr3 are all composed of p-channel type TFTs, whereas the transistors Tr4 and Tr5 are both composed of n-channel type TFTs.

In this example, immediately after termination of individual display periods Td1-Tdn, in other words, immediately after terminating individual sub-frame periods, the inverse biasing periods Ti1-Tin respectively appear. For example, while the m-th sub-frame period SFm remains (where m is an arbitrary number of 1 to n), immediately after terminating the write in period Tam, the display period Tdm appears. Thus, the inverse biasing period Tim appears immediately after terminating the display period Tdm.

Further, in this example, it is so arranged that the longer the duration of the display period that appears immediately before the inverse biasing periods, the greater the absolute value of potential difference between a voltage of the power supply line Vi and a voltage of an opposing electrode of the light emitting element during individual inverse biasing periods. Identical magnitude of voltage of the power supply line Vi is used in the individual inverse biasing periods Ti1-Tin. By virtue of the above arrangement, it is possible to prevent degradation of the organic light emitting layers more effectively than a drive method shown in FIGS. 4 to 6.

Example 4

Figure 8:
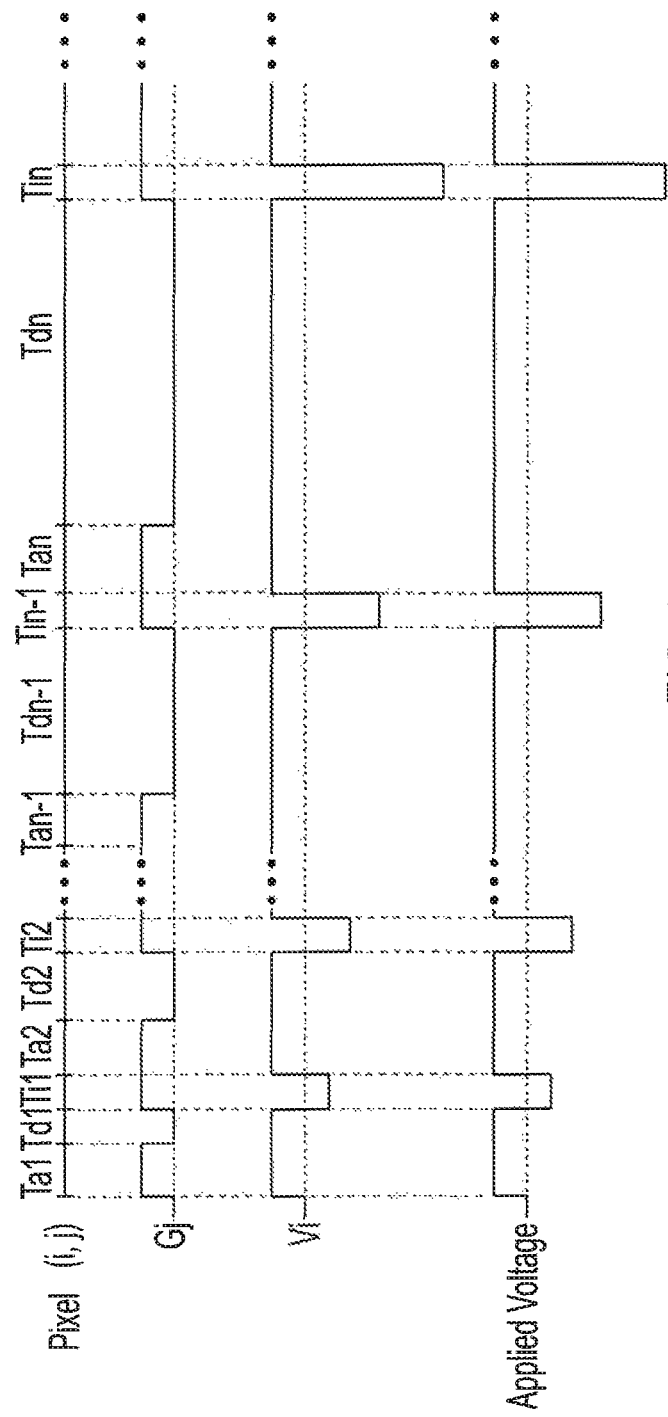
FIG. 8 is a timing chart of the voltage impressed to a scan line and a power supply line.

Taking a pixel shown in FIG. 2 for example, description on this example refers to a case in which the inverse biasing period Ti is made to appear based on a timing that differs from those shown in FIGS. 4 to 7. Referring now to FIG. 8, a drive method according in this example is described below.

FIG. 8 exemplifies a timing chart of a voltage applied to individual scanning lines, a voltage applied to the power supply line, and a voltage fed to a light emitting element in a pixel (i, j) in this example. FIG. 8 exemplifies a case in which the transistors Tr1, Tr2 and Tr3 are composed of p-channel type TFTs, whereas the transistors Tr4 and Tr5 are both composed of n-channel type TFTs.

In this example, immediately after termination of individual display periods Td1-Tdn, in other words, immediately after terminating individual sub-frame periods, the inverse biasing periods Ti1-Tin respectively appear. For example, while the m-th sub-frame period SFm remains (where m is an arbitrary number of 1 to n), immediately after terminating the write in period Tam, the display period Tdm appears. Thus, the inverse biasing period Tim appears immediately after terminating the display period Tdm.

Further, in this example, it is so arranged that the longer the duration of the display period that appears immediately before the inverse biasing periods, the greater the absolute value of potential difference between a voltage of the power supply line Vi and a voltage of an opposing electrode of the light emitting element during individual inverse biasing periods. Identical duration lasts in the individual inverse biasing periods Ti1-Tin. By virtue of the above arrangement, it is possible to prevent degradation of the organic light emitting layers more effectively than a drive method shown in FIGS. 4-6.

Example 5

The following description refers to the configurations of a signal-line drive circuit and a scanning line drive circuit provided for the light emitting device of the present invention, which is driven by a digital video signal.

Figure 9:
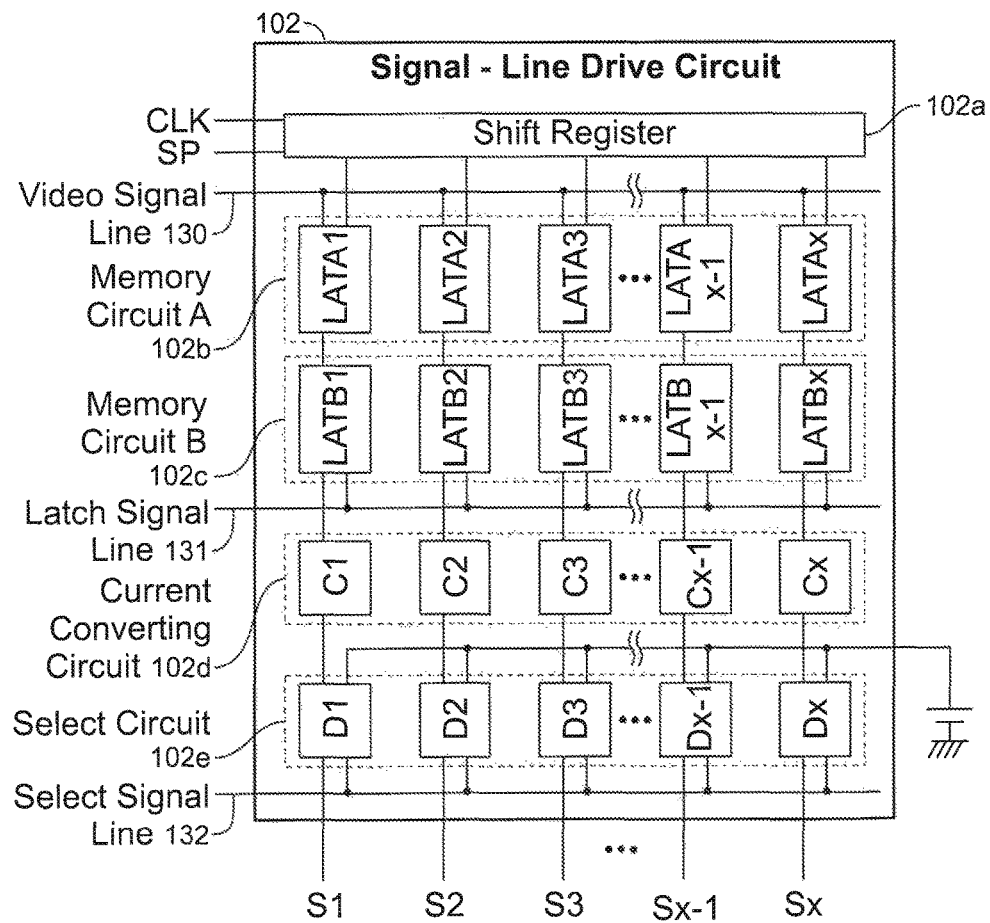
FIG. 9 is a block diagram of a signal line drive circuit according to the invention.

FIG. 9 exemplifies a schematic block diagram of a signal-line drive circuit 102 utilized for implementing the present invention. Reference numeral 102a designates a shift register, 102b a memory circuit A, 102c a memory circuit B, 102d a current converting circuit, and reference numeral 102e designates a select circuit.

A clock signal CLK and a start-up pulse signal SP are input to a shift register 102a. Digital video signals are input to a memory circuit A 102b, whereas a latch signal is input to another memory circuit B 102c. Further, a select signal is input to a select circuit 102e. Operations of individual circuits are described below in accordance with the flow of signals.

Based on the inputs of the clock signal CLK and the start-up pulse signal SP to the shift register 102a via a predetermined wiring route, a timing signal is generated. The timing signal is then delivered to each of a plurality of latches A LATA_1-LATA_x included in a memory circuit A 102b. Alternatively, the timing signal generated in the shift register 102a may be input to a plurality of latches A LATA_1-LATA_x included in a memory circuit A 102b after amplifying the timing signal via a buffering means or the like.

When the timing signal is input to the memory circuit A 102b, synchronously with the input timing signal, a plurality of digital video signals corresponding to one-bit are serially written into the above-referred plural latches A LATA_1-LATA_x for storage therein before eventually being delivered to a video signal line 130.

In this example, a plurality of digital video signals are serially written into the memory circuit A comprising LATA_1-LATA_x. However, the scope of the present invention is not solely limited to this arrangement. For example, it is also practicable to split plural stages of latches present in the memory circuit A 102b into plural groups in order to enable digital video signals to be simultaneously input to each of the individual groups in parallel with each other. This method is referred to as "division drive" for example. The number of the split groups is referred to as the division number. For example, when the latches are split into plural groups of 4-stages, this is referred to as the four-division drive.

A period of time until the completion of a process to serially write plural digital video signals into the all stages of latches present in the memory circuit A 102b is called a line period. There is a case in which the line period refers to a period in which a horizontal retracing period is added to the line period.

After terminating one line period, latch signals are delivered to a plurality of latches B LATB_1-LATB_x held in another memory circuit B 102c via a latch signal line 131. Simultaneously, a plurality of digital video signals retained by a plurality of latches LATA_1-LATA_x present in the memory circuit A 102b are written all at once into a plurality of latches B LATB_1-LATB_x present in the above referred memory circuit B 102c for storage therein.

After fully delivering the retained digital video signals to the memory circuit B 102c, synchronously with the timing signal fed from the above shift register 102a, digital video signals corresponding to the following one bit are serially written into the memory circuit A 102b. During the second-round one-line period is underway, digital video signals stored in the memory circuit B 102c are delivered to a current converting circuit 102d.

The current converting circuit 102d comprises a plurality of current setting circuits C1-Cx. Based on the binary data of 1 or 0 of the digital video signals input to each of the current setting circuits C1-Cx, magnitude of signal current Ic of signals to be delivered to the following select circuit 102e is determined. Specifically, the signal current Ic is of such a magnitude just enough to cause a light emitting element to emit light or such a magnitude that does not cause the light emitting element to emit light.

In accordance with a select signal received from a select signal line 132, the select circuit 102e determines whether the above signal current IC should be fed to a corresponding signal line or a voltage that would cause the transistor Tr2 to turn ON should be fed to the corresponding signal line.

Figure 10:
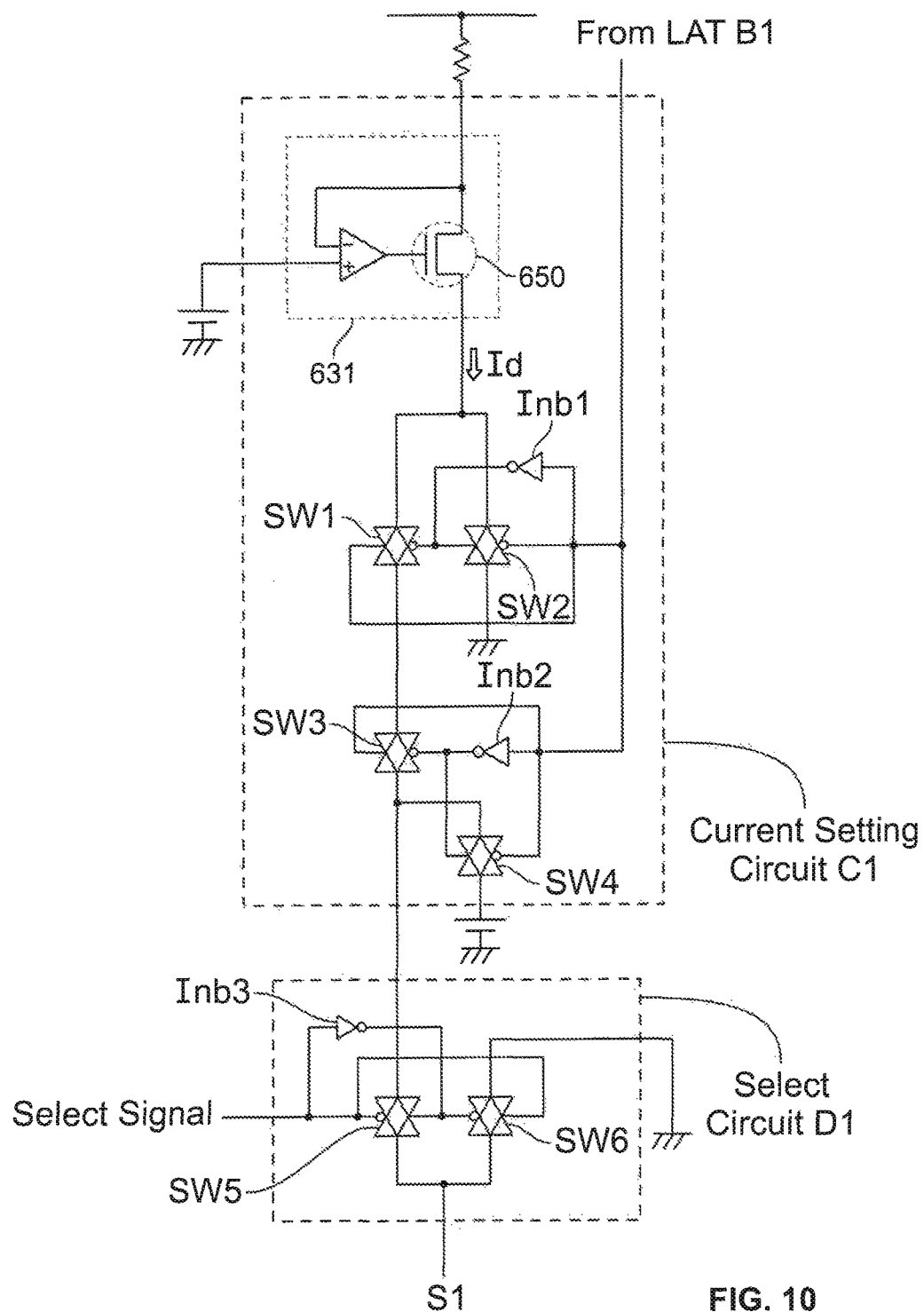
FIG. 10 is a circuit diagram of a current setting circuit and a switching circuit.

FIG. 10 exemplifies concrete configurations of the current setting circuit C1 and the select circuit D1 described above. It should be understood that each of current setting circuits C2-Cx has a configuration identical to that of the above current setting circuit C1. Likewise, each of current setting circuits D2-Dx has a configuration identical to that of a current setting circuit D1.

The current setting circuit C1 comprises the following: a constant-current supply source 631, four transmission gates SW1-SW4, and a pair of inverters Inb1 and Inb2. It should be noted that polarity of a transistor 650 provided for the constant-current supply source 631 is identical to those of the above-referred transistors Tr1 and Tr2 provided for an individual pixel.

Switching operations of the transmission gates SW1-SW4 are controlled by the digital video signal output from the latch LATB_1 present in the memory circuit B 102c. Those digital video signals delivered to the transmission gates SW1 and SW3 and those digital video signals delivered to the transmission gates SW2 and SW4 are respectively inverted by the inverters Inb1 and Inb2. Because of this arrangement, while the transmission gates SW1 and SW3 remain ON, transmission gates SW2 and SW4 are turned OFF, and vice versa.

While the transmission gates SW1 and SW3 remain ON, current Id of a predetermined value other than 0 is fed from the constant-current supply source 631 to the select circuit D1 as signal current Ic via the transmission gates SW1 and SW3.

Conversely, while the transmission gates SW2 and SW4 are held ON, current Id output from the constant-current supply source 631 is grounded via the transmission gate SW2. Further, power supply voltage flowing through power supply lines V1-Vx is applied to the select circuit D1 via the transmission gate SW4, thereby entering into a condition where IC0

The select circuit D1 comprises a pair of transmission gates SW5 and SW6 and an inverter Inb3. Switching operations of the transmission gates SW5 and SW6 are controlled by switching signals. Polarities of the switching signals respectively fed to the transmission gates SW5 and SW6 are inverted with respect to each other by the inverter Inb3, and thus, while the transmission gate SW5 remains ON, the other gate SW6 remains OFF, and vice versa. While the transmission gate SW5 remains ON, the above signal current Ic is delivered to the signal line S1. While the transmission gate SW6 remains ON, a voltage sufficient to turn ON the above transistor Tr2 is fed to the signal line S1.

Referring to FIG. 9 again, the above serial processes are simultaneously executed within one-line period in all the current setting circuits C1-Cx present in the current converting circuit 102d. As a result, actual value of the signal current Ic to be delivered to all the signal lines is selected by the corresponding digital video signals.

Configuration of the drive circuit used for embodying the present invention is not solely limited to those which are cited in the above description. Further, the current converting circuit exemplified in the above description is not solely limited to the structure shown in FIG. 10. Insofar as the current converting circuit utilized for the present invention is capable of enabling digital video signals to be used to select either of binary values that the signal current Ic may take and then feeding a signal current bearing the selected value to a signal line, any configuration may be employed therefor. Further, insofar as a select circuit can select either to feed signal current Ic to a signal line or to deliver a certain voltage sufficient to turn ON the transistor Tr2 to the signal line, any configuration may also be employed for the select circuit 10 in addition to that shown in FIG. 10.

In place of a shift register, it is also practicable to utilize a different circuit like a decoder circuit capable of selecting any of signal lines.

Next, configuration of a scanning line drive circuit is described below.

Figure 11:
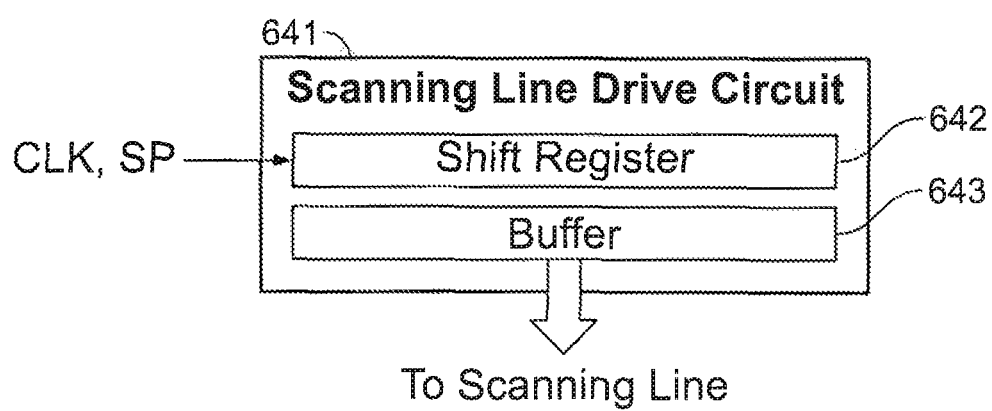
FIG. 11 is a block diagram of a scan line drive circuit.

FIG. 11 exemplifies a block diagram of a scanning line drive circuit 641 comprising a shift register 642 and a buffer circuit 643. If deemed necessary, a level shifter may also be provided.

In the scanning line drive circuit 641, upon the input of a clock signal CLK and a start-up pulse signal SP, a timing signal is generated. The generated timing signal is buffered and amplified by the buffer circuit 643 and then delivered to a corresponding scanning line.

A plurality of gates of those transistors composing pixels corresponding one-line are connected to individual scanning line. Since it is required to simultaneously turn ON a plurality of transistors included in pixels corresponding to one line, the buffer circuit 643 is capable of accommodating flow of a large current.

It should be noted that configuration of the scanning line drive circuit 641 provided for the light emitting device of the present invention is not solely limited to the one shown in FIG. 11. For example, in place of the above-referred shift register, it is also practicable to utilize a different circuit like a decoder circuit capable of selecting any of scanning lines.

The configuration based on this example may also be realized by being freely combined with Examples 1 to 4.

Example 6

The following description refers to the configuration of a signal-line drive circuit provided for the light emitting device of the present invention, which is driven by an analog drive method. Since the scanning line drive circuit in this example utilizes the configuration shown in the preceding Example 5, further description is omitted.

Figure 12:
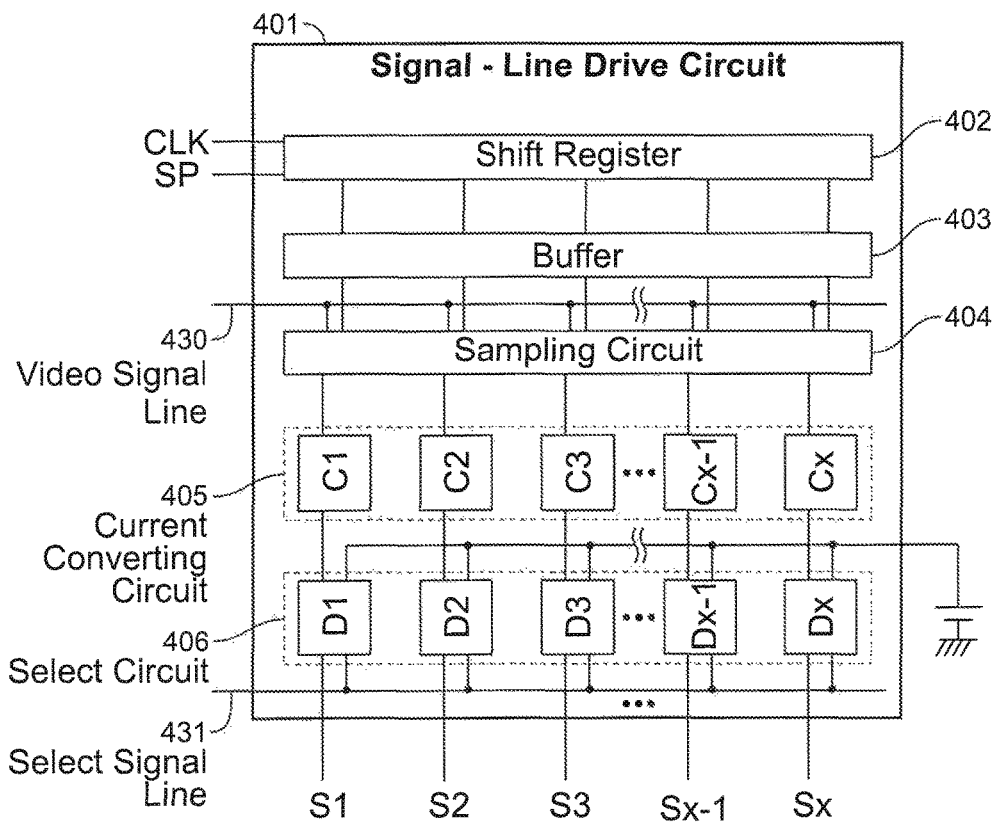
FIG. 12 is a block diagram of a signal line drive circuit according to the invention.

FIG. 12 exemplifies a schematic block diagram of a signal-line drive circuit 401 utilized for implementing the present invention. Reference numeral 402 designates a shift register, 403 a buffer circuit, 404 a sampling circuit, 405 a current converting circuit, and reference numeral 406 designates a select circuit.

A clock signal CLK and a start-up pulse signal SP are input to the shift register 402. Upon the input of the clock signal CLK and the start-up pulse signal SP into the shift register 402, a timing signal is generated.

The generated timing signal is amplified or buffered and amplified by the buffer circuit 403 and then input to the sampling circuit 404. It is also practicable to replace the buffer circuit 404 with a level shifter to amplify the timing signal. Alternatively, both the buffer circuit and the level shifter may be provided.

Next, synchronously with the timing signal, the sampling circuit 404 delivers analog video signals fed from a video signal line 430 to the current converting circuit 405 located at the subsequent stage.

The current converting circuit 405 generates a signal current Ic of a magnitude corresponding to a voltage of the input analog video signal and then delivers the generated signal current Ic to the following select circuit 406. The select circuit 406 selects either to deliver the signal current Ic to the signal line or to deliver a voltage that would cause the transistor Tr2 to turn OFF, to the signal line.

Figure 13:
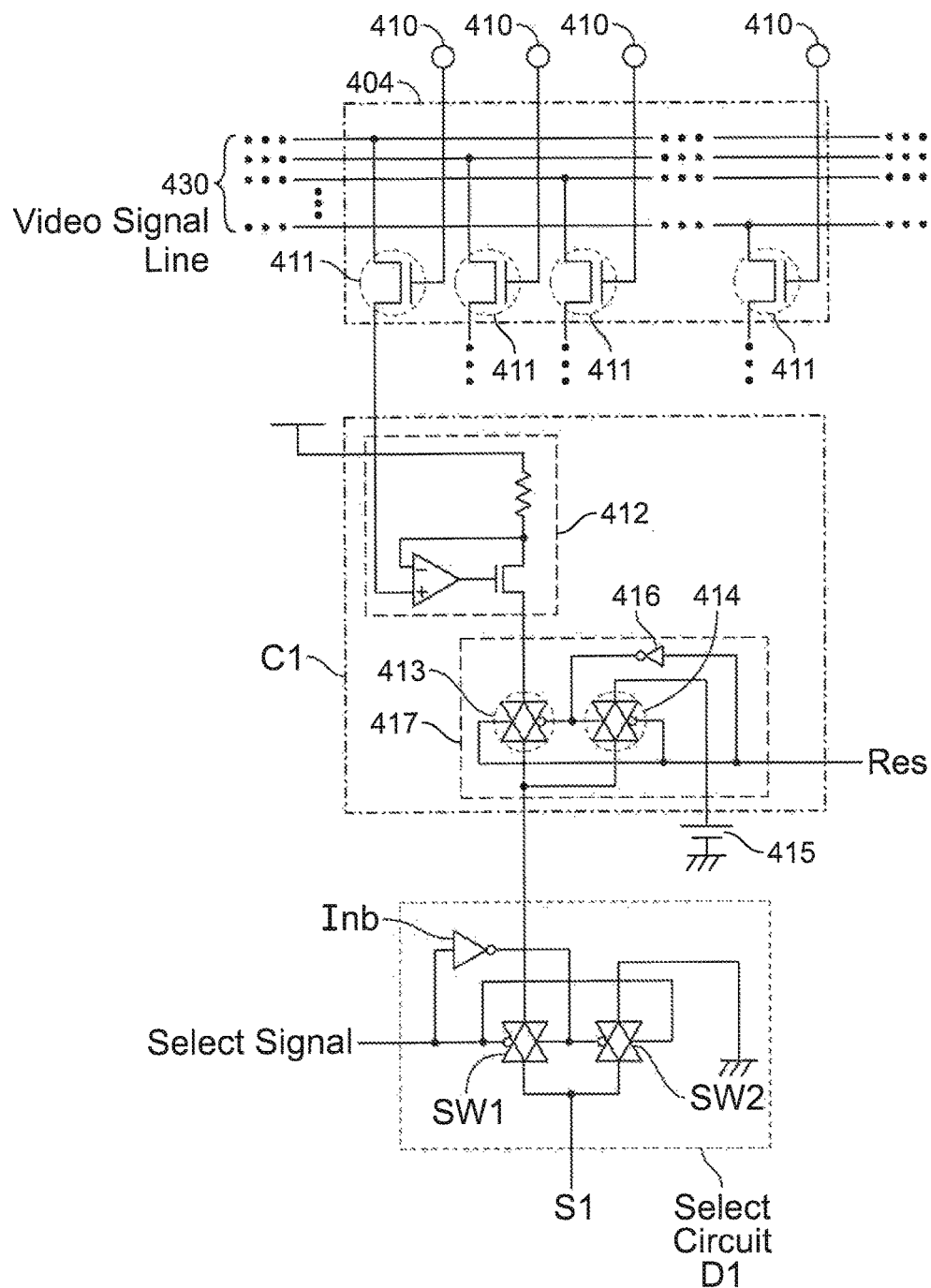
FIG. 13 is a circuit diagram of a current setting circuit and a switching circuit.

FIG. 13 shows concrete configurations of the sampling circuit 404 and a plurality of current setting circuits C1-Cx provided for the current converting circuit 405. The sampling circuit 404 is connected to the buffer circuit 403 via a terminal 410.

The sampling circuit 404 is provided with a plurality of switches 411. The sampling circuit 404 receives analog video signals fed from a video signal line 430. Synchronously with the timing signal, the switches 411 individually sample the input analog video signals and then deliver the sampled analog video signals to the current setting circuit C1 located at the subsequent stage. It should be noted that FIG. 13 solely exemplifies the current setting circuit C1 connected to one of the switches 411 built in the sampling circuit 404 among the above-referred current setting circuits C1-Cx. However, it is assumed that the current setting circuit C1 shown in FIG. 13 is connected to each of the individual switches 411 at their subsequent stages provided for the sampling circuit 404.

In this example, only one transistor is utilized for an individual switch 411. It should be understood that, however, insofar as analog video signal can properly be sampled synchronously with the timing signal, there is no restriction on the configuration of the switches 411 described above.

The sampled analog video signals are then input to a current output circuit 412 provided for the current setting circuit C1. The current output circuit 412 outputs a signal current of a value corresponding to the voltage borne by the input analog video signals. In FIG. 12, the current output circuit 412 is formed by using an amplifier and a transistor. However, the scope of the present invention is not solely limited to this configuration but any circuit capable of outputting current corresponding to the voltage of the input analog video signal may also be utilized.

The above-referred signal current is delivered to a reset circuit 417 present in the current setting circuit C1, where the reset circuit 417 comprises a pair of transmission gates 413 and 414, and an inverter 416.

A reset signal (Res) is input to the transmission gate 414, whereas the other transmission gate 413 receives a reset signal (Res) inverted by the inverter 416. The transmission gate 413 and the other transmission gate 414 are individually operated synchronously with the inverted reset signal and the rest signal, respectively, and thus, while either of the transmission gates 413 and 414 remains ON, the other remains OFF.

While the transmission gate 413 remains ON, the signal current is delivered to the following select circuit D1. On the other hand, while the transmission gate 414 remains ON, a voltage of the power supply 415 is delivered to the select circuit D1 located at the subsequent stage. It is desired that the signal line be reset during the retracing period. However, except for a period during display of pixel, it is also practicable to reset the signal line in such a period other than the retracing period as required.

The select circuit D1 comprises a pair of transmission gates SW1 and SW2 and an inverter Inb. Switching operations of the transmission gates SW1 and SW2 are controlled by switching signals. Polarities of the switching signals respectively fed to the transmission gates SW1 and SW2 are inverted with respect to each other by the inverter Inb, and thus, while the transmission gate SW1 remains ON, the other gate SW2 remains OFF, and vice versa. While the transmission gate SW1 remains ON, the above signal current Ic is delivered to the signal line S1. While the transmission gate SW2 remains ON, a voltage sufficient to turn ON the above transistor Tr2 is fed to the signal line S1.

In place of a shift register, it is also practicable to utilize such a different circuit like a decoder circuit capable of selecting any of signal lines.

Practical configuration of the signal-line drive circuit for driving the light emitting device of the present invention is not solely limited to the one exemplified in this example. The configuration based on this example may also be realized by being freely combined with those configurations exemplified in the preceding examples 1-4.

Example 7

In this example, configuration of a pixel of a light emitting device according to the invention, which is different from that in FIG. 2.

Figure 14:
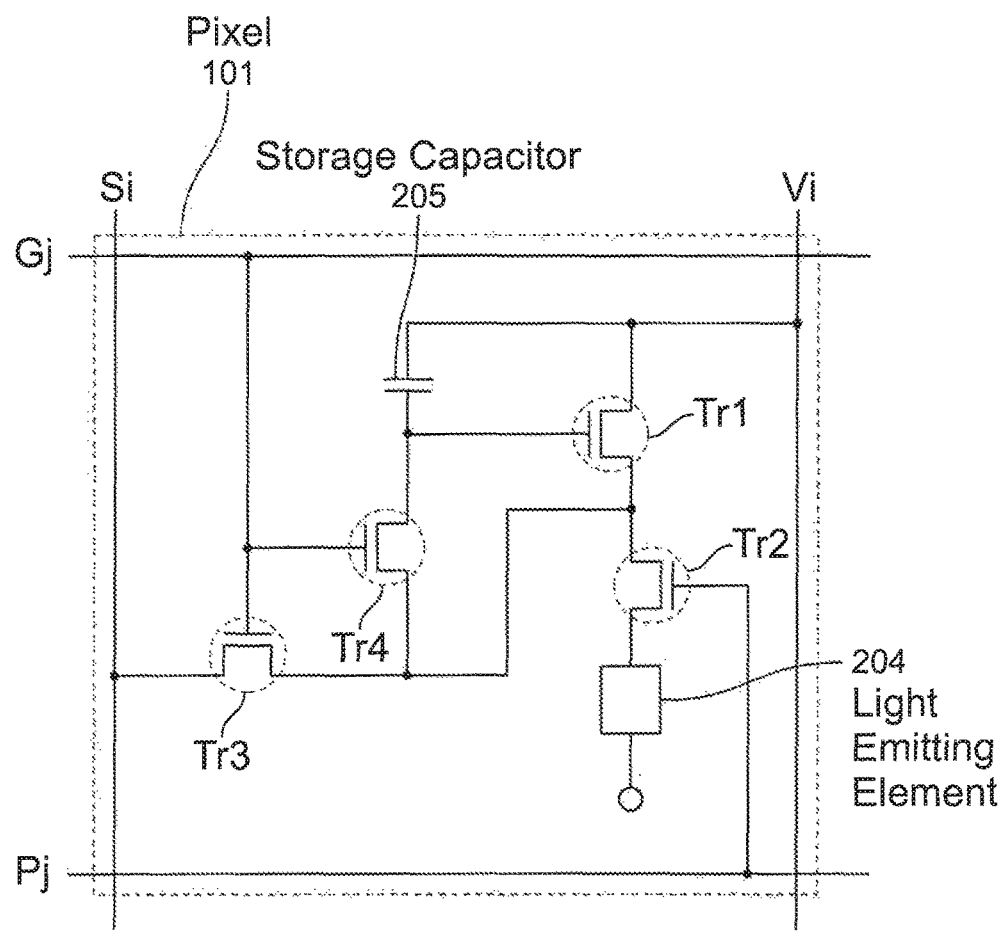
FIG. 14 is a circuit diagram of a pixel of the light emitting device according to the invention.

FIG. 14 shows configuration of a pixel of Example 7. A pixel 101 shown in FIG. 1 has a signal line Si (one of the S1-Sx), a first scan line Gj (one of the G1-Gy), second scan line P (one of the P1-Py) and a power supply line Vi (one of the V1-$V_x$).

The pixel 101 has TFTs, such as Tr1, Tr2, Tr3 and Tr4, a light emitting element 204 and a storage capacitor 205.

Both of the gates of the Tr3 and the Tr4 are connected to first scan line Gj. One of the first terminal and the second terminal of the Tr3 is connected to the signal line Si, and another one thereof is connected to the first terminal of the Tr2. Further, one of the first terminal and the second terminal of the Tr4 is connected to the first terminal of Tr2, while another one thereof is connected the gate of the Tr1. In other words, either of the first terminal and the second terminal of the Tr3 is connected to either of the first terminal and the second terminal of the Tr4.

A first terminal of the Tr1 is connected to the power supply line Vi and a second terminal is connected to a first terminal of the Tr2. The gate of the Tr2 is connected to the second scan line Pj. A second terminal of the Tr2 is connected to a pixel electrode included in the light emitting element 204, the light emitting element 204 has a pixel electrode, a counter electrode, and an organic light emitting layer provide between the pixel electrode and the counter electrode. The counter electrode of the light emitting element 204 is fed by a constant voltage from a power supply provided at external part of the light emitting panel.

The Tr3 and the Tr4 may be either of an n-channel TFT and a p-channel TFT. However, the Tr3 and the Tr4 have the same polarity. Also, the Tr1 may be either of an n-channel TFT and a p-channel TFT. Further, the Tr2 may be either of an n-channel TFT and a p-channel TFT. For the pixel electrode and the counter electrode of the light emitting element, one of which is an anode while the other is a cathode. In case of Tr2 being the p-channel TFT, it is preferred that the anode is used as a pixel electrode and the cathode is used as a counter electrode. Conversely, in case of Tr2 being the n-channel TFT, it is preferred that the cathode is used as the pixel electrode and the anode is used as the counter electrode.

The storage capacitor 205 is formed between the gate and the source of the Tr1. Although the storage capacitor 205 is provided to certainly maintain the voltage (gate voltage) between the gate and the source of the Tr1, it is not always necessary to provide the storage capacitor.

Next, referring to FIG. 15, the operation of the light emitting device according to the example will be described. The operation of the light emitting device according to the invention will be described being separated into the write period Ta, the display period Td and the inverted bias period Ti on the basis of each pixel of the respective lines. FIG. 15 briefly shows the connection among the transistors Tr1, Tr2 and the light emitting element 204 in the respective periods. Herein, the case that the Tr1 is the p-channel type TFT and the anode of the light emitting element 204 is used as the pixel electrode is given as an example.

First, when the write period Ta starts at a pixel of each line, the voltage of the power supply lines V1-$V_x$ is held at a level so that the current of forward bias flows to the light emitting element when the transistors Tr2 and Tr3 are turned ON. That is to say, when the Tr1 is the p-channel type TFT and the anode of the light emitting element 204 is used as the pixel electrode, the voltage of the power supply line Vi is set so as to be higher than that of the counter electrode. To the contrary, when the Tr1 is the n-channel type TFT and the cathode of the light emitting element 204 is used as the pixel electrode, the voltage of the power supply line Vi is set so as to be lower than that of the counter electrode.

The first scan line of each line is selected in order by a scan line drive circuit 103, the transistors Tr3 and Tr4 become ON. However, the selected period of each first scan line does not overlaps with each other. Further, the second scan lines P1-Py are not selected. Based on the voltage of a video signal input to signal line drive circuit 102, signal current Ic corresponding to the video signal respectively flows between the signal lines S1-Sx and the power supply lines V1-$V_x$.

Figure 15A:
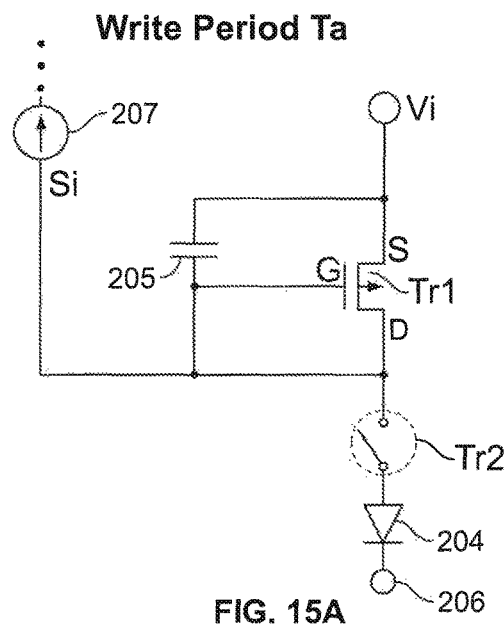
FIGS. 15A to 15C are schematic diagrams of the pixel being operation.

FIG. 15A shows a schematic diagram of the pixel 101 when the signal current Ic flows to the signal line Si during the write period Ta. The reference numeral 206 denotes a terminal using for connecting to the power supply that provides the voltage to the counter electrode. Further, the reference numeral 207 denotes a constant current source included in the signal line drive circuit 102.

Since the transistors Tr3 and Tr4 are in the state of ON, when the signal current Ic flows to the signal line Si, the signal current Ic flows between the drain and the first terminal of the transistor Tr1. At this time, the first terminal of Tr1 is connected to the power supply line Vi.

Since the gate and the drain are connected, the transistor Tr1 operates in the saturated zone. Accordingly, as demonstrated by the Expression 1, the gate voltage $V_{GS}$ of the transistor Tr1 is determined by the value of the signal current Ic.

When the write period Ta has completed, the display period Td starts. The voltage of the power supply line Vi during the display period Td is held at the same level as the voltage during the write period Ta. Further, during the display period Td, the entire first scan lines G1-Gy are not selected but the entire second scan lines P1-Py are selected.

Figure 15B:
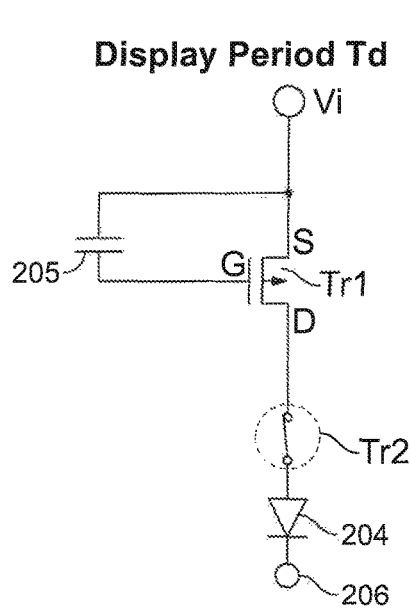

FIG. 15B shows a schematic diagram of the pixel during the display period Td. The transistor Tr3 and the transistor Tr4 are at OFF state. Further, the source of the Tr1 is connected to the power supply line Vi. During the display period Td, the $V_{GS}$ determined in the write period Ta is held as it was, accordingly, the drive current of the same magnitude as the write period Ta flows to the light emitting element 204, and the light emitting element 204 emits light at the luminance according to the magnitude of the drive current.

Immediately after the write period Ta, always the display period Td follows. Immediately after the display period Td, the next write period Ta or the inverted bias period Ti follows.

When the inverted bias period starts, the voltage of the power supply lines V1-$V_x$ is held at a level so that the voltage of the inverted bias is impressed to the light emitting element when the transistors Tr1 and Tr2 are turned ON. That is to say, when the Tr1 is the p-channel type TFT and the anode of the light emitting element 204 is used as the pixel electrode, the voltage of the power supply line Vi is set so as to be lower than that of the counter electrode. To the contrary, when the Tr1 is the n-channel type TFT and the cathode of the light emitting element 204 is used as the pixel electrode, the voltage of the power supply line Vi is set so as to be higher than that of the counter electrode.

According to the example, during the inverted bias period, same as the display period Td, the transistors Tr3 and Tr4 are in the state of OFF and the Tr2 is in the state of ON.

Figure 15C:
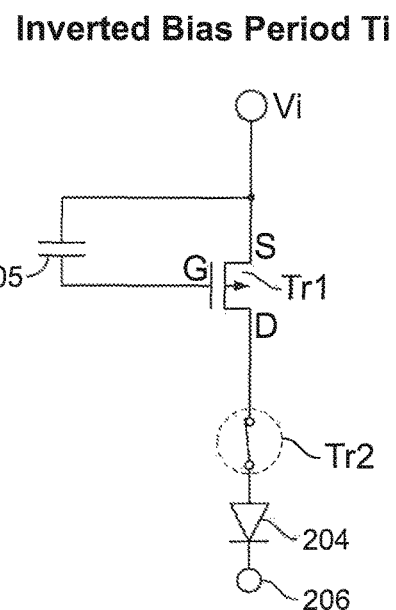

FIG. 15C shows a schematic diagram of the pixel 101 during the inverted bias period Ti. The light emitting element 204 gets into a state that the same does not emit light when the voltage of the inverted bias is impressed thereto. During the write period Ta, when the Tr1 completely turns ON and if the voltage difference between the source and the drain of the Tr1 is substantially equal to 0, the voltage difference between the power supply line Vi and the counter electrode is impressed to the light emitting element 204 as it is.

It is possible for a designer to determine a desired duration of the inverted bias period Ti taking into the consideration the relationship with the duty ratio (the ratio of the total sum of the duration of the display period in one frame period).

In the light emitting device according to the example, it is possible to display using not only digital video signals but also analog video signals.

This example is possible to be implemented in combination with the examples 1-6.

Example 8

In this example, configuration of a pixel of a light emitting device according to the invention, which is different from those in FIG. 2 and FIG. 14.

Figure 16:
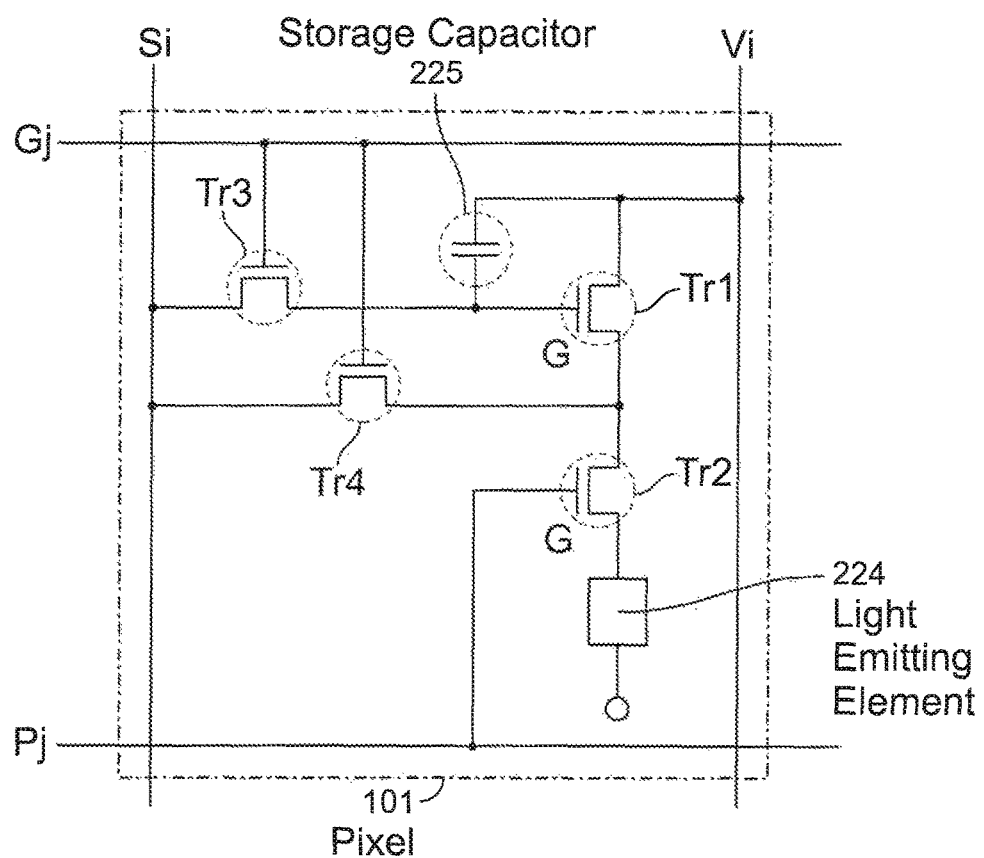
FIG. 16 is a circuit diagram of a pixel of the light emitting device according to the invention.

FIG. 16 shows detailed configuration of a pixel 101 shown in FIG. 1. The pixel 101 shown in FIG. 16 has a signal line Si (one of the S1-Sx), a first scan line Gj (one of the G1-Gy), second scan line Pj (one of the P1-Py) and a power supply line Vi (one of the V1-V$_x$).

The pixel 101 according to the example has transistors Tr1, Tr2, Tr3 and Tr4, a light emitting element 224 and a storage capacitor 225.

Both of the gates of the transistor Tr3 and the transistor Tr4 are connected to first scan line Gj. One of the first terminal and the second terminal of the transistor Tr3 is connected to the signal line Si, and another one thereof is connected to the gate of the transistor Tr1. Further, one of the first terminal and the second terminal of the transistor Tr4 is connected to the signal line Si, and another one thereof is connected the second terminal of the transistor Tr1.

A first terminal of the transistor Tr1 is connected to the power supply line Vi and a second terminal is connected to a first terminal of the transistor Tr2. The gate of the transistor Tr2 is connected to the second scan line Pj. A second terminal of the transistor Tr2 is connected to a pixel electrode included in the light emitting element 224, the voltage of the counter electrode is held at a predetermined level.

The transistor Tr3 and the transistor Tr4 may be any of an n-channel transistor and a p-channel transistor. However, the transistor Tr3 and the transistor Tr4 have the same polarity.

Also, the transistors Tr1 and Tr2 may be any of an n-channel transistor and a p-channel transistor. However, the transistors Tr1 and Tr2 have the same the polarity. When the anode is used as a pixel electrode and the cathode is used as an counter electrode, it is preferred that the transistors Tr1 and Tr2 are the p-channel transistors. To the contrary, when the anode is used as the counter electrode and the cathode is used as the pixel electrode, it is preferred that the transistors Tr1 and Tr2 are the n-channel transistors.

The storage capacitor 225 is formed between the gate and the source of the transistor Tr1. Although the storage capacitor 225 is provided to maintain the voltage (gate voltage) between the gate and the source of the transistor Tr1, it is not always necessary to provide the storage capacitor.

Next, referring to FIG. 17, the operation of the light emitting device according to the example will be described. The operation of the light emitting device according to the invention will be described being separated into the write period Ta, the display period Td and the inverted bias period Ti on the basis of each pixel of the respective lines. FIG. 17 briefly shows the connection among the transistors Tr1, Tr2 and the light emitting element 224 in the respective periods. Herein, the case that the Tr1 is the p-channel type TFT and the anode of the light emitting element 224 is used as the pixel electrode is given as an example.

First, in the write period Ta, when the write period Ta starts at a pixel of each line, the voltage of the power supply lines V1-V$_x$ is held at a level so that the current of forward bias flows to the light emitting element when the transistors Tr1 and Tr2 are turned ON. That is to say, when the Tr1 is the p-channel type TFT and the anode of the light emitting element 224 is used as the pixel electrode, the voltage of the power supply line Vi is set so as to be higher than that of the counter electrode. To the contrary, when the Tr1 is the n-channel type TFT and the cathode of the light emitting element 224 is used as the pixel electrode, the voltage of the power supply line Vi is set so as to be lower than that of the counter electrode.

The first scan line of each line is selected in order by a scan line drive circuit 103, the transistors Tr3 and Tr4, of which gates are connected to the first scan line Gj, becomes ON. The selected period of each first scan line does not overlaps with each other. In the write period Ta, the second scan line Pj is not selected and the Tr2 is OFF.

Based on the voltage of a video signal input to signal line drive circuit 102, signal current Ic corresponding to the video signal respectively flows between the signal lines S1-Sx and the power supply lines V1-V$_x$.

Figure 17A:
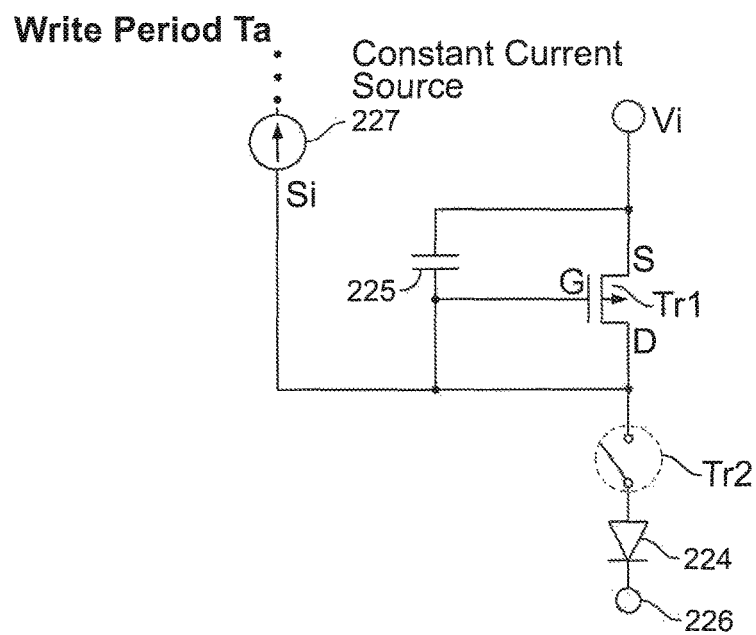
FIGS. 17A to 17C are schematic diagrams of the pixel being operation.

FIG. 17A shows a schematic diagram of the pixel 101 when the signal current Ic flows to the signal line Si during the write period Ta. The reference numeral 227 denotes the constant current source included in the signal line drive circuit 102. Further, the reference numeral 226 denotes a terminal for connecting to the power supply that provides the voltage to the counter electrode.

In the write period Ta, since the transistors Tr3 and Tr4 are in the state of ON, when the signal current Ic flows to the signal line Si, the signal current Ic flows between the source and the drain of the transistor Tr1. At this time, since the gate and the drain are connected, the transistor Tr1 operates in the saturated zone. Accordingly, as demonstrated by the Expression 1, the gate voltage V$_{GS}$ of the transistor Tr1 is determined by the value of the signal current Ic.

When the write period Ta has completed, the display period Td starts. The voltage of the power supply line Vi during the display period Td is held at the same level as the voltage during the write period Ta. Further, during the display period Td, the first scan line Gj is not selected but the second scan line Pj is selected.

Figure 17B:
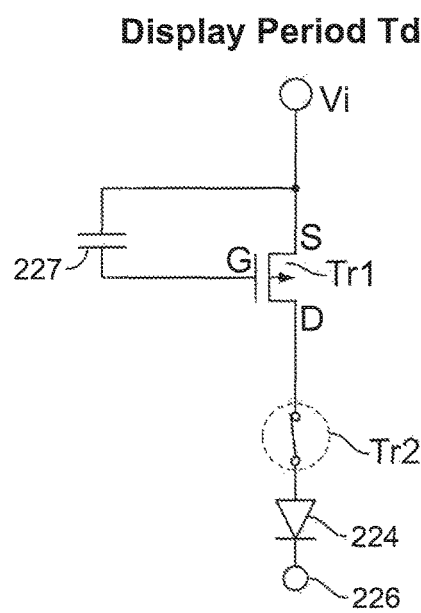

FIG. 17B shows a schematic diagram of the pixel during the display period Td. The transistor Tr3 and the transistor Tr4 are OFF. Further, the transistor Tr2 is ON.

During the display period Td, at the transistor Tr1, the $V_{GS}$ determined in the write period Ta is held as it was. Accordingly, the drain current of the transistor Tr1 is held to the same value as the signal current Ic. Further, since the transistor Tr2 is ON, the drain current flows to the light emitting element 224 via the transistor Tr2. Therefore, during the display period Td, the drive current of the same magnitude as the signal current Ic flows to the light emitting element 224, and the light emitting element 224 emits light at the luminance according to the magnitude of the drive current.

Immediately after the write period Ta, always the display period Td follows. Immediately after the display period Td, the next write period Ta or the inverted bias period Ti follows.

When the inverted bias period starts, the voltage of the power supply lines V1-$V_x$ is held at a level so that the voltage of the inverted bias is impressed to the light emitting element when the transistors Tr1 and Tr2 are turned ON. That is to say, when the Tr1 is the p-channel type TFT and the anode of the light emitting element 224 is used as the pixel electrode, the voltage of the power supply line Vi is set so as to be lower than that of the counter electrode. To the contrary, when the Tr1 is the n-channel type TFT and the cathode of the light emitting element 224 is used as the pixel electrode, the voltage of the power supply line Vi is set so as to be higher than that of the counter electrode.

According to the example, during the inverted bias period, same as the display period Td, the transistors Tr3 and Tr4 are in the state of OFF and the Tr2 is in the state of ON.

Figure 17C:
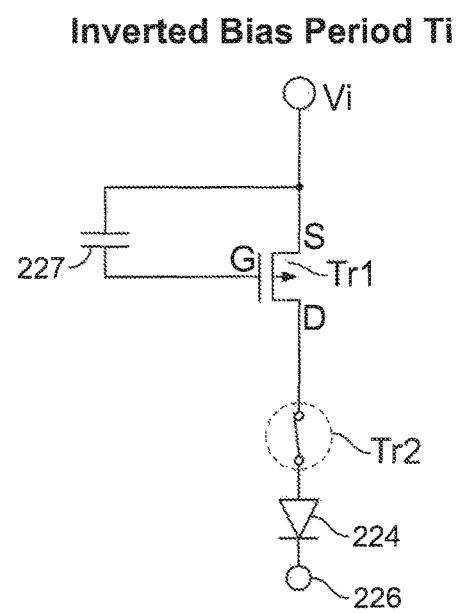

FIG. 17C shows a schematic diagram of the pixel 101 during the inverted bias period Ti. The light emitting element 224 gets into a state that the same does not emit light when the voltage of the inverted bias is impressed thereto. During the write period Ta, when the Tr1 completely turns ON and if the voltage difference between the source and the drain of the Tr1 is substantially equal to 0, the voltage difference between the power supply line Vi and the counter electrode is impressed to the light emitting element 224 as it is.

It is possible for a designer to determine a desired duration of the inverted bias period Ti taking into the consideration the relationship with the duty ratio (the ratio of the total sum of the duration of the display period in one frame period).

In the light emitting device according to the example, it is possible to display using not only digital video signals but also analog video signals.

This example is possible to be implemented in combination with the examples 1-6.

Example 9

The configuration of a pixel of a light emitting device according to another example of the invention, which is different from those shown in FIG. 2, FIG. 14, and FIG. 16, will be described.

Figure 18:
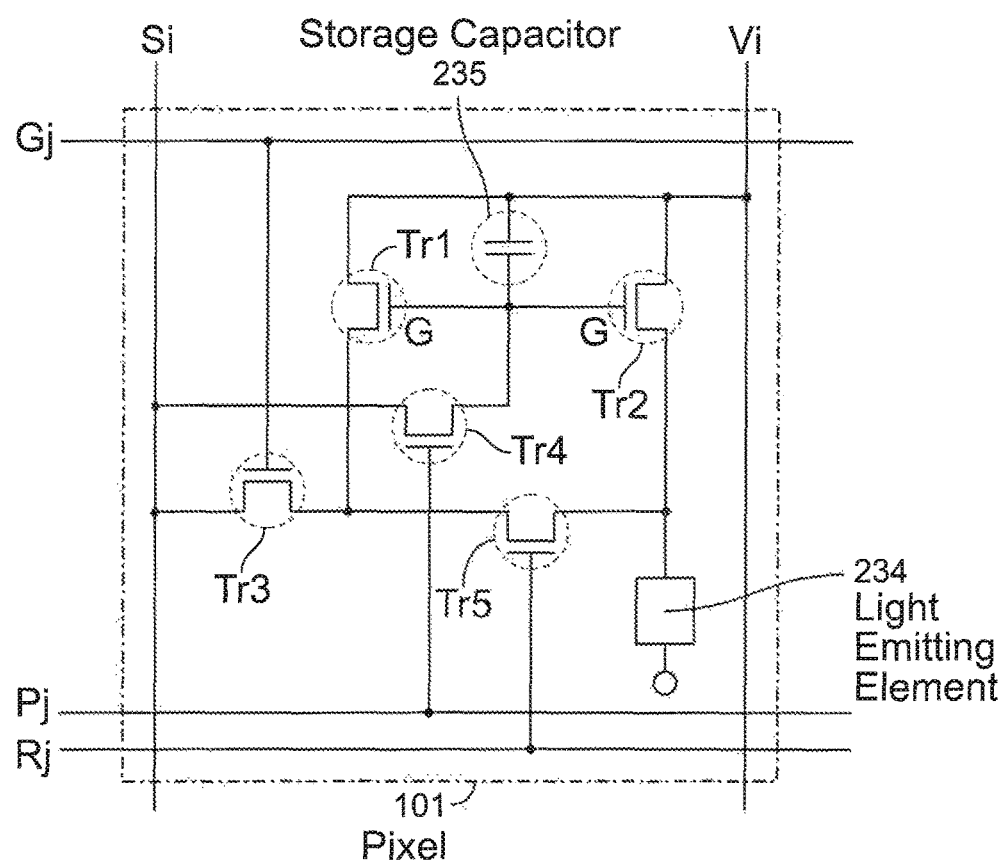
FIG. 18 is a circuit diagram of a pixel of the light emitting device according to the invention.

FIG. 18 shows a detailed configuration of the pixel 101 shown in FIG. 1. The pixel 101 shown in FIG. 18 has a signal line Si (one of the S1-Sx), a first scan line Gj (one of the G1-Gy), a second scan line Pj (one of the P1-Py), a third scan line Rj (one of the R1-Ry) and a power supply line Vi (one of the V1-$V_x$).

Further, the pixel 101 has transistors Tr1, Tr2, Tr3, Tr4, and Tr5, a light emitting element 234 and a storage capacitor 235. The storage capacitor 235 is provided in order to maintain the gate voltage between the gate and source of the transistor Tr1 and Tr2 with a higher reliability, but it is not always necessary to provide the same.

A gate of the transistor Tr3 is connected to the first scan line Gj. One of a first terminal and a second terminal of the transistor Tr3 is connected to the signal line Si, and another one thereof is connected to second terminal of the transistor Tr1.

A gate of the transistor Tr4 is connected to the second scan line Pj. One of a first terminal and a second terminal of the transistor Tr4 is connected to the signal line Si, and another one thereof is connected to the gates of the transistors Tr1 and Tr2

A gate of the transistor Tr5 is connected to a third scan line Rj. One of a first terminal and a second terminal of the transistor Tr5 is connected to the second terminals of the transistor Tr1, and another one thereof is connected to the second electrode terminal of the transistor Tr2.

The gates of the transistor Tr1 and the transistor Tr2 are connected to each other. And both of the first terminal of the transistor Tr1 and transistor Tr2 are connected to the power supply line Vi. Further, the second terminal of the transistor Tr2 is connected to the pixel electrode of the light emitting element 234. Further, the counter electrode is held at a predetermined voltage.

One of the two electrodes included in a storage capacitor 235 is connected to the gates of the transistors Tr1 and Tr2, and another one thereof is connected to the power supply line Vi.

The transistors Tr1 and Tr2 may be either of an n-channel transistor and a p-channel transistor. However, the polarity of the transistors Tr1 and Tr2 are the same. When the anode is used as the pixel electrode and the cathode is used as the counter electrode, it is preferred that the transistors Tr1 and Tr2 are the p-channel transistors. To the contrary, when the anode is used as the counter electrode and the cathode is used as the pixel electrode, it is preferred that the transistors Tr1 and Tr2 are the n-channel transistors.

The transistors Tr3, Tr4, and Tr5 may be either of the n-channel transistor and the p-channel transistor.

Next, referring to FIG. 19, the operation of the light emitting device according to the example will be described.

The operation of the light emitting device according to the invention will be described being separated into a write period Ta, a display period Td and a inverted bias period Ti on the basis of each pixel of the respective lines. FIG. 19 is a diagram briefly showing the connections of the transistor Tr1, Tr2 and the light emitting element 234 during the respective periods. Herein, the case that the Tr1 and Tr2 are of the p-channel type TFT, and the anode of the light emitting element 234 is used as the pixel electrode is given as an example.

First, when the write period Ta starts at a pixel of each line, the voltage of the power supply lines V1-$V_x$ is held at a level so that the current of the forward bias flows to the light emitting element when the transistors Tr2 is turned ON. That is to say, when the Tr1 and Tr2 are of the p-channel type TFT and the anode of the light emitting element 234 is used as the pixel electrode, the voltage of the power supply line Vi is set to be higher than that of the counter electrode. To the contrary, when the Tr1 and Tr2 are of the n-channel type TFT and the cathode of the light emitting element 234 is used as the pixel electrode, the voltage of the power supply line Vi is set to be lower than that of the counter electrode.

The first scan line and the second scan line of each line are selected in order by the scan line drive circuit 103. Accordingly, the transistors Tr3 and Tr4 are turned ON. Since the third scan line is not selected, the transistor Tr5 is OFF. Each of the selected periods of the first and the second scan line do not overlap with each other.

Based on video signal, which is input to a signal line drive circuit 102, signal current Ic corresponding to the video signal respectively flows between the signal lines S1-Sx and the power supply lines V1-$V_x$.

Figure 19A:
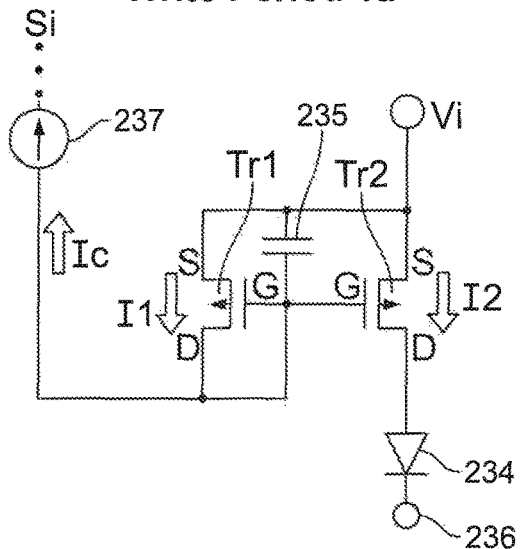
FIGS. 19A to 19C are schematic diagrams of the pixel being operation.

FIG. 19A shows a schematic diagram of the pixel 101 when the signal current Ic corresponding to the video signal flows to the signal line Si during the write period Ta. Reference numeral 236 denotes a terminal for connecting to a power supply that provides a voltage to the counter electrode. Reference numeral 237 denotes a constant current source included in the signal line drive circuit 102.

Since the transistor Tr3 is ON, when the signal current Ic corresponding to the video signal flows to the signal line Si, the signal current Ic flows between a drain and the source of the transistor Tr1. At this time, since the gate and the drain are connected, the transistor Tr1 operates in a saturated zone and Expression 1 is satisfied. Accordingly, gate voltage $V_{GS}$ of the transistor Tr1 is determined depending on the current value Ic.

The gate of the transistor Tr2 is connected to the gate of the transistor Tr1. Further, the source of the transistor Tr2 is connected to the source of the transistor Tr1. Accordingly, the gate voltage of the transistor Tr1 is the gate voltage of the transistor Tr2 as it is. Accordingly, the drain current of the transistor Tr2 becomes to a magnitude proportional to the drain current of the transistor Tr1. Particularly, when $\mu C_0 W/L$ and $V_{TH}$ are equal to each other, the drain currents of the transistor Tr1 and the transistor Tr2 become equal to each other resulting in $I_2=I_1=Ic$.

Further, the drain current of the transistor Tr2 flows to the light emitting element 234. The magnitude of the current which flows to the light emitting element corresponds to the predetermined signal current Ic in the constant current source 237, and the light emitting element 234 emits light at the luminance according to the magnitude of the current that flows to the light emitting element. In a case of that the current that flows to the light emitting element approaching to 0 unlimitedly, or in a case of that the current that flows to the light emitting element is inverted bias, light emitting element doesn't emit light.

When the write period Ta has completed at the pixel of each line, the selection of the first scan line and the second scan line complete. At this time, it is preferred that the selection of the second scan line completes prior to the selection of the first scan line. The reason of this is why, if the transistor Tr3 turns OFF earlier, the electric charge of the storage capacitor 235 leaks through the Tr4.

When the write period Ta has completed, the display period Td starts. The voltage of the power supply line Vi during the display period Td is held at the same level as the voltage during the write period Ta. When the display period Td starts, the third scan line is selected in order, and the transistors Tr5 is turned ON. Since the first scan line and second scan line are not selected, the transistors Tr3 and Tr4 are OFF.

Figure 19B:
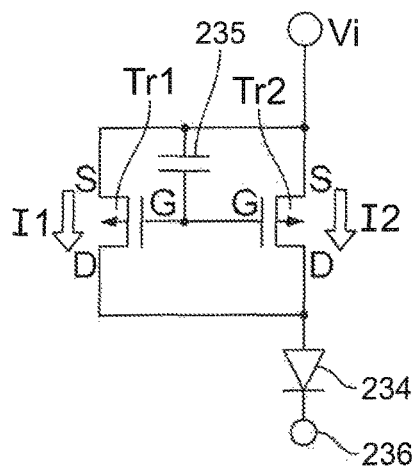

FIG. 19B shows a schematic diagram of the pixel during the display period Td. The transistor Tr3 and the transistor Tr4 are in a state of OFF. Further, the sources of the transistor Tr1 and the transistor Tr2 are connected to the power supply line Vi.

In the transistors Tr1 and Tr2, the $V_{GS}$, which has been determined in the write period Ta, is held as it is. Accordingly, the magnitudes of the drain current $I_1$ of the transistor Tr1 and the drain current $I_2$ of the transistor Tr2, both of which correspond to the signal current Ic, are held as they are. Since the transistor Tr5 is ON, both of the drain current $I_1$ of the transistor Tr1 and the drain current $I_2$ of the transistor Tr2 flow to the light emitting element 234. The light emitting element 234 emits light at the luminance according to the magnitude of a combined current of the drain current $I_1$ and the drain current $I_2$.

Immediately after the write period Ta, always the display period Td appears. Immediately after the display period Td, the next write period Ta or the inverted bias period Ti appears.

When the inverted bias period Ti starts, the voltage of the power supply lines V1-$V_x$ is held at a level that the voltage of inverted bias is impressed to the light emitting element when the transistors Tr2 is turned ON. That is to say, when the Tr1 and the Tr2 are of the p-channel type TFT and the anode of the light emitting element 234 is used as the pixel electrode, the voltage of the power supply line Vi is set so as to be lower than that of the counter electrode. To the contrary, when the Tr1 and the Tr2 are of the n-channel type TFT and the cathode of the light emitting element 234 is used as the pixel electrode, the voltage of the power supply line Vi is set so as to be higher than that of the counter electrode.

The first, second and third scan lines of each line are selected in order by the scan line drive circuit 103 and the transistors Tr3, Tr4, and Tr5 are turned ON. And a voltage of a level that the transistors Tr1 and the Tr2 are turned ON is impressed to each of the signal lines S1-Sx by the signal line drive circuit 102.

Figure 19C:
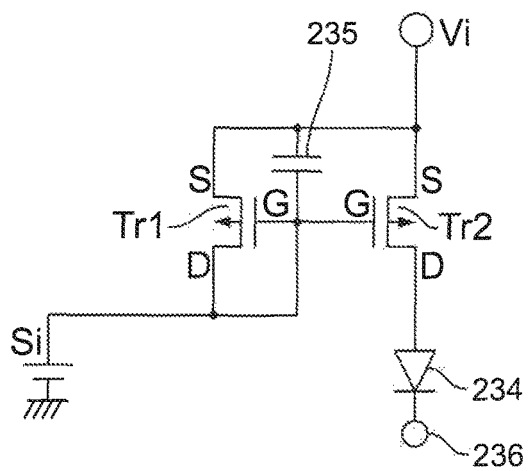

FIG. 19C shows a schematic diagram of the pixel 101 during the inverted bias period Ti. During the inverted bias period Ti, the Tr1, Tr2 are turned ON, and a voltage of inverted bias is impressed to the light emitting element 234. And the light emitting element 234 gets into a state that the same does not emit light when the voltage of inverted bias is impressed.

It is acceptable if the voltage of the power supply line is at a level that a voltage of inverted bias is impressed to the light emitting element when the transistors Tr1, Tr2 are turned ON. Also, it is possible for a designer to determine the length of the inverted bias period Ti appropriately while taking the relationship with the duty ratio (a ratio of the sum of the length of display period during one frame period) into consideration.

Since the light emitting element 234 emits light at the luminance corresponding to the magnitude of the current that flows to the light emitting element, the tone of each pixel depends on the magnitude of the current that flows to the light emitting element during the display period Td. Although the light emitting element also emits light during a writing period Ta at a luminance according to the amount of drain current $I_1$, the influence of this light on gray scale is considered small enough to be ignored in an actual display panel. This is because, in the case of a VGA level display panel, for example, its pixel portion has 480 lines of pixels and a writing period Ta for one line of pixels is as short as 1/480 of one frame period. Of course the amount of signal current Ic may be corrected by taking into account the influence of current flowing into the light emitting element during a writing period Ta on gray scale.

In the pixel according to the example, the current that flows to light emitting element during the display period is the sum of the drain current $I_1$ and the drain current $I_2$. Accordingly, the current that flows to the light emitting element does not depend on the drain current $I_2$ only.

Therefore, even when the characteristics of the transistor Tr1 and the transistor Tr2 get different from each other, and a difference of the ratio of the drain current $I_2$ of the transistor Tr2 with respect to the drain current $I_1$ of the transistor Tr1 is resulted in among the pixels, it is possible to prevent the value of the current that flows to light emitting element from getting different among the pixels. As a result, it is possible to prevent the fluctuation of the luminance being recognized visually.

Further, in the pixel according to the example, during the write period Ta, the drain current of the transistor Tr1 does not flow to the light emitting element. Accordingly, the time, from a point when a current is supplied to the pixel by the signal line drive circuit, and drain current of transistor Tr1 flows and the gate voltage begins to change to a point when the value of the voltage gets stable, does not depend on the capacity of the light emitting element. Therefore, since the voltage converted from a supplied current gets stable swiftly, it is possible to shorten the time for writing the current. As a result, it is possible to prevent an afterimage from being recognized visually during motion picture display.

In this example, one of the first terminal and the second terminal of the transistor Tr4 is connected to the signal line Si and another one thereof is connected to the gate of the transistor Tr1. However, this example is not limited to this configuration. In this example, as for the pixel, it is acceptable if the transistor Tr4 is connected to another element or wiring so that the gate and the drain of the transistor Tr1 are connected to each other during the write period Ta, and the gate and the drain of the transistor Tr1 are separated from each other during the display period.

That is to say, it is acceptable if Tr3, Tr4, and Tr5 are connected as shown in FIG. 19A during Ta; during Td, they are connected as shown in FIG. 19B; and during Ti, they are connected as shown in FIG. 19C. Also, although Gj, Pj and Rj are given with three separated wirings, they may be integrated into one or two wirings.

The light emitting device according to the example is capable of performing display using any of digital video signal and analog video signal.

This example may be implemented in combination with the examples 1-6.

Example 10

The configuration of a pixel of a light emitting device according to another example of the invention, which is different from those shown in FIG. 2, FIG. 14, FIG. 16 and FIG. 18, will be described.

Figure 20:
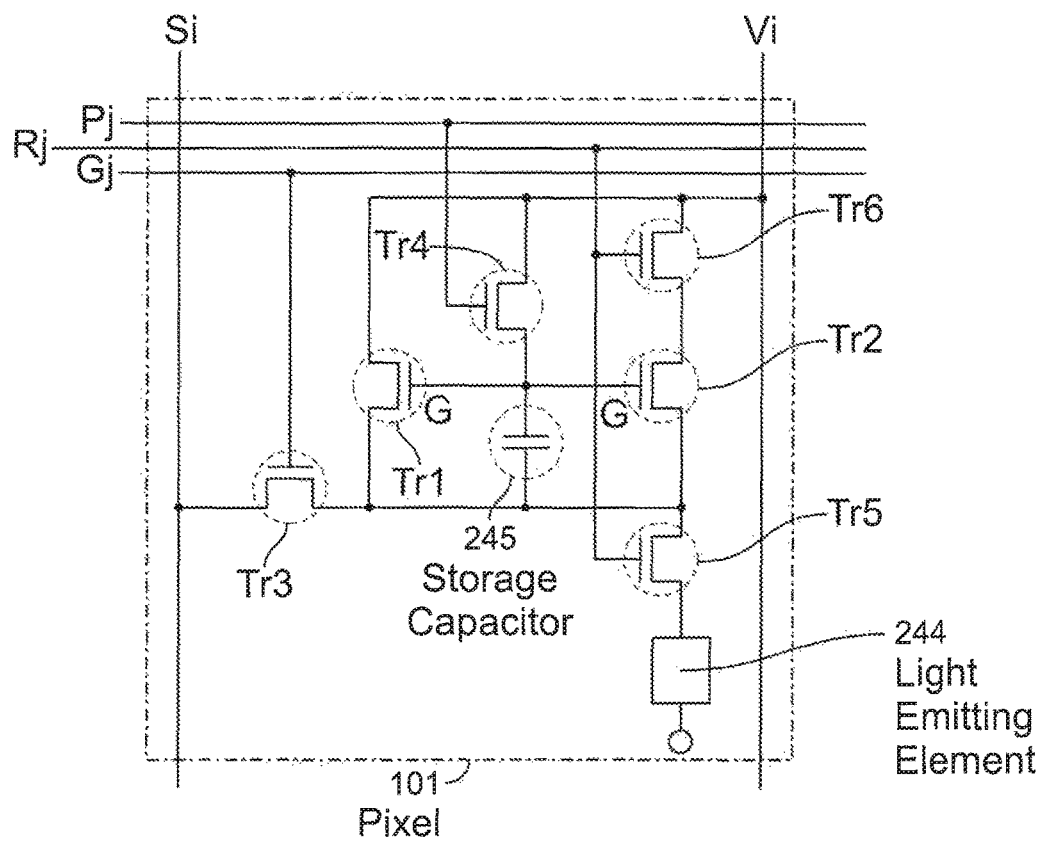
FIG. 20 is a circuit diagram of a pixel of the light emitting device according to the invention.

FIG. 20 shows a detailed configuration of the pixel 101 shown in FIG. 1. The pixel 101 shown in FIG. 20 has a signal line Si (one of the S1-Sx), a first scan line Gj (one of the G1-Gy), a second scan line Pj (one of the P1-Py), a third scan line R (one of the R1-Ry) and a power supply line Vi (one of the V1-$V_x$).

Further, the pixel 101 has transistors Tr1, Tr2, Tr3, Tr4, Tr5 and Tr6, a light emitting element 244 and a storage capacitor 245. The storage capacitor 245 is provided in order to maintain the gate voltage of the transistor Tr1 and Tr2 with a higher reliability, but it is not always necessary to provide the same.

A gate of the transistor Tr3 is connected to the first scan line Gj. One of a first terminal and a second terminal of the transistor Tr3 is connected to the signal line Si, and another one thereof is connected to first terminals of the transistors Tr1 and Tr2.

A gate of the transistor Tr4 is connected to the second scan line Pj. One of a first terminal and a second terminal of the transistor Tr4 is connected to the power supply line Vi, and another one thereof is connected to the gates of the transistors Tr1 and Tr2.

A gate of the transistor Tr5 is connected to a third scan line Rj. One of a first terminal and a second terminal of the transistor Tr5 is connected to the first terminals of the transistors Tr1 and Tr2, and another one thereof is connected to a pixel electrode of a light emitting element 244.

A gate of the transistor Tr6 is connected to the third scan line Rj. One of a first terminal and a second terminal of the transistor Tr6 is connected to the power supply line Vi, and another one thereof is connected to a second terminal of the transistor Tr2.

The gates of the transistor Tr1 and the transistor Tr2 are connected to each other. And the second terminal of the transistor Tr1 is connected to the power supply line Vi.

One of the two electrodes included in a storage capacitor 245 is connected to the gates of the transistors Tr1 and Tr2, and another one thereof is connected to sources of the transistors Tr1 and Tr2. An counter electrode is held at a predetermined voltage.

The transistors Tr1 and Tr2 may be any of an n-channel transistor and a p-channel transistor. However, the polarity of the transistors Tr1 and Tr2 are the same. When the anode is used as the pixel electrode and the cathode is used as the counter electrode, it is preferred that the transistors Tr1 and Tr2 are the n-channel transistors. To the contrary, when the anode is used as the counter electrode and the cathode is used as the pixel electrode, it is preferred that the transistors Tr1 and Tr2 are the p-channel transistors.

The transistors Tr3, Tr4, Tr5 and Tr6 may be any of the n-channel transistor and the p-channel transistor. However, since both of the gates of the transistors Tr5 and Tr6 are connected to the third scan line Rj, it is necessary that the polarity thereof is the same. When the gates of the transistors Tr5 and Tr6 are not connected to the same wiring, the polarity thereof may not the same.

Next, referring to FIG. 21, the operation of the light emitting device according to the example will be described. The operation of the light emitting device according to the invention will be described being separated into a write period Ta, a display period Td and a inverted bias period Ti on the basis of each pixel of the respective lines. FIG. 21 is a diagram briefly showing the connections of the transistor Tr1, Tr2, Tr5 and the light emitting element 244 during the respective periods. Herein, the case that the Tr1 and Tr2 are of the n-channel type TFT, and the anode of the light emitting element 244 is used as the pixel electrode is given as an example.

First, when the write period Ta starts at a pixel of each line, the voltage of the power supply lines V1-$V_x$ is held at a level so that the current of the forward bias flows to the light emitting element when the transistors Tr2, Tr5 and Tr6 are turned ON. That is to say, when the Tr1 and Tr2 are of the n-channel type TFT and the anode of the light emitting element 244 is used as the pixel electrode, the voltage of the power supply line Vi is set to be higher than that of the counter electrode. To the contrary, when the Tr1 and Tr2 are of the p-channel type TFT and the cathode of the light emitting element 244 is used as the pixel electrode, the voltage of the power supply line Vi is set to be lower than that of the counter electrode.

The first scan line and the second scan line of each line are selected in order. Accordingly, the transistors Tr3 and Tr4 are turned ON. The selected periods of the first and the second scan line do not overlap with each other. Since the third scan line is not selected, the transistors Tr5 and Tr6 are OFF.

Based on video signal, which is input to a signal line drive circuit 102, signal current Ic corresponding to the video signal respectively flows between the signal lines S1-Sx and the power supply lines V1-$V_x$.

Figure 21A:
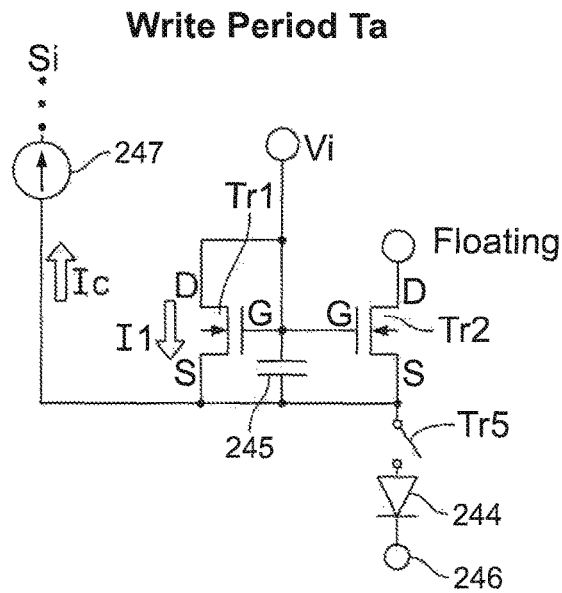
FIGS. 21A to 21C are schematic diagrams of the pixel being operation.

FIG. 21A shows a schematic diagram of the pixel 101 when the signal current Ic flows to the signal line Si during the write period Ta. Reference numeral 246 denotes a terminal for connecting to a power supply that provides a voltage to the counter electrode. Reference numeral 247 denotes a constant current source included in the signal line drive circuit 102.

Since the transistor Tr3 is ON, when the signal current Ic flows to the signal line Si, the signal current Ic flows between a drain and the source of the transistor Tr1. At this time, since the gate and the drain are connected, the transistor Tr1 operates in a saturated zone and Expression 1 is satisfied. Accordingly, gate voltage $V_{GS}$ of the transistor Tr1 is determined depending on the current value Ic.

The gate of the transistor Tr2 is connected to the gate of the transistor Tr1. Further, the source of the transistor Tr2 is connected to the source of the transistor Tr1. Accordingly, the gate voltage of the transistor Tr1 is the gate voltage of the transistor Tr2 as it is.

During the write period Ta, the drain of the transistor Tr2 is in a state of, what is called, floating in which the drain is not provided with any voltage from other wiring, power supply or the like. Accordingly, no drain current flows to the transistor Tr2.

When the write period Ta completes, the selection of the first scan line and the second scan line of each line complete in order. At this time, it is preferred that the selection of the second scan line completes prior to the selection of the first scan line. This is because, if the transistor Tr3 turns OFF earlier, the electric charge of the storage capacitor 245 leaks through the Tr4.

On the other hand, when the write period Ta has completed at the pixel of each line, the display period Td starts. The voltage of the power supply line Vi during the display period Td is held at the same level as the voltage during the write period Ta. When the display period Td starts, the third scan line of each line is selected in order, and the transistors Tr5 and Tr6 are turned ON. Since the first scan line and second scan line are not selected, the transistors Tr3 and Tr4 are OFF.

Figure 21B:
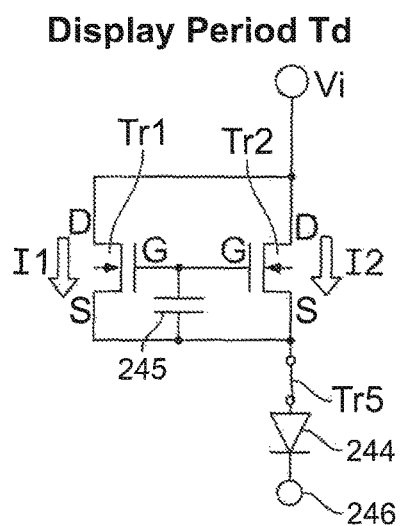

FIG. 21B shows a schematic diagram of the pixel during the display period Td. The transistor Tr3 and the transistor Tr4 are in a state of OFF. Further, the drains of the transistor Tr1 and the transistor Tr2 are connected to the power supply line Vi.

On the other hand, in the transistors Tr1 and Tr2, the $V_{GS}$, which has been determined in the write period Ta, is held as it is. Accordingly, the gate voltage same as the transistor Tr1 is given to the transistor Tr2. Furthermore, since the transistor Tr6 turns ON and the drain of the transistor Tr2 is connected to power supply line Vi, the drain current of the transistor Tr2 becomes to a magnitude proportional to the drain current of the transistor Tr1. Particularly, when $\mu C_0 W/L$ and $V_{TH}$ are equal to each other, the drain currents of the transistor Tr1 and the transistor Tr2 become equal to each other resulting in $I_2=I_1=Ic$.

Further, since the transistor Tr5 is ON, the drain current $I_1$ of the transistor Tr1 and the drain current $I_2$ of the transistor Tr2 flow to the light emitting element 244 as the current that both of them flow to the light emitting element.

Accordingly, during the display period Td, a current of a magnitude that the drain current $I_1$ and the drain current $I_2$ are combined flows to the light emitting element 244, and the light emitting element 244 emits light at the luminance according to the magnitude of the current that flows to the light emitting element.

Immediately after the write period Ta, always the display period Td appears. Immediately after the display period Td, the next write period Ta or the inverted bias period Ti appears.

When the inverted bias period Ti starts, the voltage of the power supply lines V1-$V_x$ is held at a level that the voltage of inverted bias is impressed to the light emitting element when the transistors Tr2, Tr5 and Tr6 are turned ON. That is to say, when the Tr1 and the Tr2 are of the n-channel type TFT and the anode of the light emitting element 244 is used as the pixel electrode, the voltage of the power supply line Vi is set so as to be lower than that of the counter electrode. To the contrary, when the Tr1 and the Tr2 are of the p-channel type TFT and the cathode of the light emitting element 244 is used as the pixel electrode, the voltage of the power supply line Vi is set so as to be higher than that of the counter electrode.

The first, second and third scan lines of each line are selected in order by the scan line drive circuit 103 and the transistors Tr3, Tr4, Tr5 and Tr6 are turned ON. And a voltage of a level that the transistors Tr1 and the Tr2 are turned ON is impressed to each of the signal lines S1-Sx by the signal line drive circuit 102.

Figure 21C:
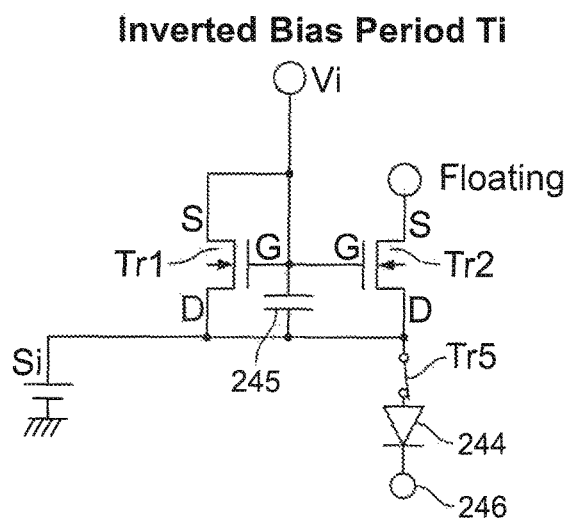

FIG. 21C shows a schematic diagram of the pixel 101 during the inverted bias period Ti. During the inverted bias period Ti, the Tr2, Tr5 and Tr6 are turned ON, and a voltage of inverted bias is impressed to the light emitting element 244. And the light emitting element 244 gets into a state that the same does not emit light when the voltage of inverted bias is impressed.

It is acceptable if the voltage of the power supply line is at a level that a voltage of inverted bias is impressed to the light emitting element when the transistors Tr2, Tr5 and Tr6 are turned ON. Also, it is possible for a designer to determine the length of the inverted bias period Ti appropriately while taking the relationship with the duty ratio (a ratio of the sum of the length of display period during one frame period) into consideration.

Since the light emitting element 244 emits light at the luminance corresponding to the magnitude of the current that flows to the light emitting element, the tone of each pixel depends on the magnitude of the current that flows to the light emitting element during the display period Td.

In the pixel according to the example, the current that flows to light emitting element during the display period is the sum of the drain current $I_1$ and the drain current $I_2$. Accordingly, the current that flows to the light emitting element does not depend on the drain current $I_2$ only. Therefore, even when the characteristics of the transistor Tr1 and the transistor Tr2 get different from each other, and a difference of the ratio of the drain current $I_2$ of the transistor Tr2 with respect to the drain current $I_1$ of the transistor Tr1 is resulted in among the pixels, it is possible to prevent the value of the current that flows to light emitting element from getting different among the pixels. As a result, it is possible to prevent the fluctuation of the luminance being recognized visually.

Further, in the pixel according to the example, during the write period Ta, the drain current of the transistor Tr1 does not flow to the light emitting element. Accordingly, the time, from a point when a current is supplied to the pixel by the signal line drive circuit, and drain current of transistor Tr1 flows and the gate voltage begins to change to a point when the value of the voltage gets stable, does not depend on the capacity of the light emitting element. Therefore, since the voltage converted from a supplied current gets stable swiftly, it is possible to shorten the time for writing the current. As a result, it is possible to prevent an afterimage from being recognized visually during motion picture display.

In this example, one of the first terminal and the second terminal of the transistor Tr4 is connected to the second terminal of the transistor Tr1 and another one thereof is connected to the gate of the transistor Tr1 and the gate of the transistor Tr2. However, this example is not limited to this configuration. In this example, as for the pixel, it is acceptable if the transistor Tr4 is connected to another element or wiring so that the gate and the drain of the transistor Tr1 are connected to each other during the write period Ta, and the gate and the drain of the transistor Tr1 are separated from each other during the display period.

That is to say, it is acceptable if Tr3, Tr4, Tr5 and Tr6 are connected as shown in FIG. 21A during Ta; during Td, they are connected as shown in FIG. 21B; and during Ti, they are connected as shown in FIG. 21C. Also, although Gj, Pj and Rj are given with three separated wirings, they may be integrated into one or two wirings.

Further, the transistor Tr5 is provided in order to make the signal current Ic and the drain current $I_1$ of the transistor Tr1 closer to the same value during write period Ta. It is not always necessary that one of the first terminal and the second terminal of the transistor Tr5 is connected to the first terminals of the transistor Tr1 and Tr2, and another one thereof is connected to the pixel electrode of the light emitting element 244. It is acceptable if the transistor Tr5 is connected to another wiring or element so that the source of the transistor Tr2 is connected to any one of the pixel electrode and the signal line Si of the light emitting element 244 during the write period Ta.

That is to say, it is acceptable if all of the current that flows through the Tr1 flows to the current source, and all of the current that flows through the current source flows to the Tr1 during the Ta. And during the Td, it is acceptable if the current that flows through the Tr1 and Tr2 flows to the light emitting element.

The light emitting device according to the example is capable of performing display using any of digital video signal and analog video signal.

This example may be implemented in combination with the examples 1-6.

Example 11

The configuration of a pixel of a light emitting device according to still another example of the invention, which is different from those shown in FIG. 2, FIG. 14, FIG. 16, FIG. 18 and FIG. 20, will be described.

Figure 22:
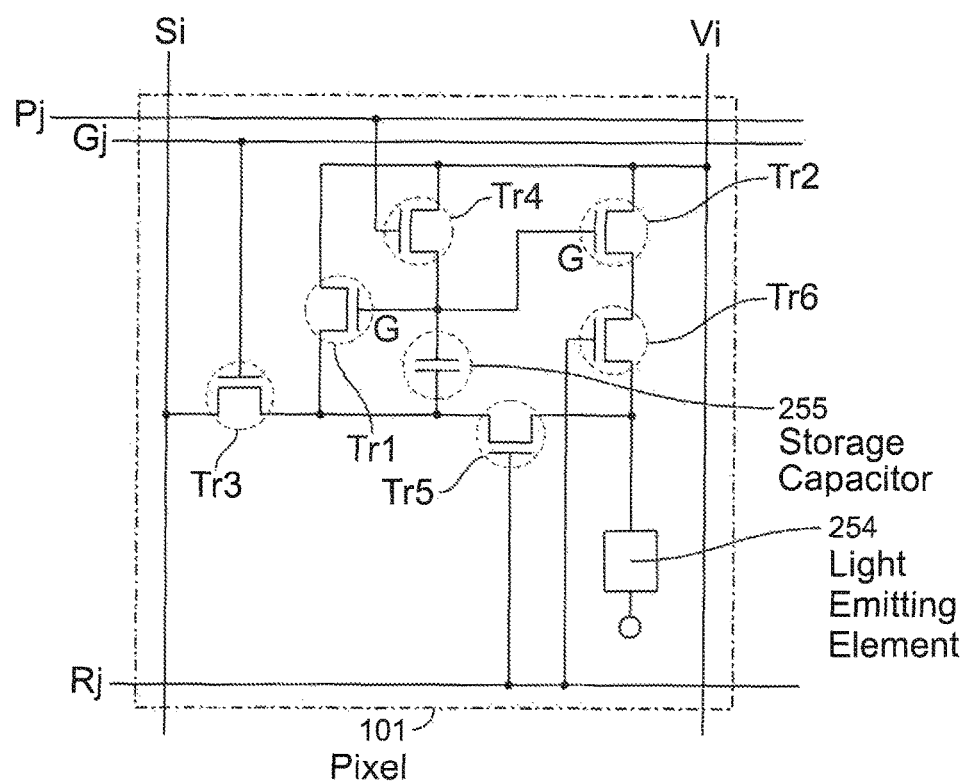
FIG. 22 is a circuit diagram of a pixel of the light emitting device according to the invention.

FIG. 22 shows a detailed configuration of the pixel 101 shown in FIG. 1. The pixel 101 shown in FIG. 22 has a signal line Si (one of the S1-Sx), a first scan line Gj (one of the G1-Gy), a second scan line Pj (one of the P1-Py), a third scan line Rj (one of the R1-Ry) and a power supply line Vi (one of the $V1-V_x$).

Further, the pixel 101 has transistors Tr1, Tr2, Tr3, Tr4. Tr5 and Tr6, a light emitting element 254 and a storage capacitor 255. The storage capacitor 255 is provided in order to maintain the gate voltage of the transistor Tr1 and Tr2 with a higher reliability, but it is not always necessary to provide the same.

A gate of the transistor Tr3 is connected to the first scan line Gj. One of a first terminal and a second terminal of the transistor Tr3 is connected to the signal line Si, and another one thereof is connected to a first terminal of the transistor Tr1.

A gate of the transistor Tr4 is connected to the second scan line Pj. One of a first terminal and a second terminal of the transistor Tr4 is connected to the power supply line Vi, and another one thereof is connected to the gates of the transistors Tr1 and Tr2.

A gate of the transistor Tr6 is connected to the third scan line Rj. One of a first terminal and a second terminal of the transistor Tr6 is connected to a first terminal of the transistor Tr2, and another one thereof is connected to a pixel electrode of a light emitting element 254.

A gate of the transistor Tr5 is connected to the third scan line Rj. One of a first terminal and a second terminal of the transistor Tr5 is connected to the first terminal of the transistor Tr1, and another one thereof is connected to a pixel electrode of a light emitting element 254. An counter electrode is held at a predetermined voltage.

The gates of the transistor Tr1 and the transistor Tr2 are connected to each other. And the second terminals of the transistors Tr1 and Tr2 are connected to the power supply line Vi.

One of the two electrodes included in a storage capacitor 255 is connected to the gates of the transistors Tr1 and Tr2, and another one thereof is connected to a source of the transistor Tr1.

The transistors Tr1 and Tr2 may be any of an n-channel transistor and a p-channel transistor. However, the polarity of the transistors Tr1 and Tr2 are the same. When the anode is used as the pixel electrode and the cathode is used as the counter electrode, it is preferred that the transistors Tr1 and Tr2 are the n-channel transistors. To the contrary, when the anode is used as the counter electrode and the cathode is used as the pixel electrode, it is preferred that the transistors Tr1 and Tr2 are the p-channel transistors.

The transistors Tr3, Tr4, Tr5 and Tr6 may be any of the n-channel transistor and the p-channel transistor. However, since both of the gates of the transistors Tr5 and Tr6 are connected to the third scan line Rj, it is necessary that the polarity thereof is the same. When the gates of the transistors Tr5 and Tr6 are not connected to the same wiring, the polarity thereof may not be the same.

Next, referring to FIG. 23, the operation of the light emitting device according to the example will be described. The operation of the light emitting device according to the invention will be described being separated into a write period Ta a display period Td and a inverted bias period Ti on the basis of each pixel of the respective lines. FIG. 23 is a diagram briefly showing the connections of the transistor Tr1, Tr2, Tr6 and the light emitting element 254 during the respective periods. Herein, the case that the Tr1 and Tr2 are of the n-channel type TFT, and the anode of the light emitting element 254 is used as the pixel electrode is given as an example.

First, when the write period Ta starts at a pixel of each line, the voltage of the power supply lines $V1-V_x$ is held at a level so that the current of the forward bias flows to the light emitting element when the transistors Tr2 and Tr6 are turned ON. That is to say, when the Tr1 and Tr2 are of the n-channel type TFT and the anode of the light emitting element 254 is used as the pixel electrode, the voltage of the power supply line Vi is set to be higher than that of the counter electrode. To the contrary, when the Tr1 and Tr2 are of the p-channel type TFT and the cathode of the light emitting element 254 is used as the pixel electrode, the voltage of the power supply line Vi is set to be lower than that of the counter electrode.

The first scan line and the second scan line of each line are selected in order. Accordingly, the transistors Tr3 and Tr4 are turned ON. The selected periods of the first and the second scan lines do not overlap with each other. Since the third scan line is not selected, the transistors Tr5 and Tr6 are OFF.

Based on video signal, which is input to a signal line drive circuit 102, signal current Ic corresponding to the video signal respectively flows between the signal lines S1-Sx and the power supply lines V1-$V_x$.

FIG. 23A shows a schematic diagram of the pixel 101 when the signal current Ic flows to the signal line Si during the write period Ta. Reference numeral 256 denotes a terminal for connecting to a power supply that provides a voltage to the counter electrode. Reference numeral 257 denotes a constant current source included in the signal line drive circuit 102.

Since the transistor Tr3 is ON, when the signal current Ic flows to the signal line Si, the signal current Ic flows between a drain and the source of the transistor Tr1. At this time, since the gate and the drain are connected, the transistor Tr1 operates in a saturated zone and Expression 1 is satisfied. Accordingly, gate voltage $V_{GS}$ of the transistor Tr1 is determined depending on the current value Ic.

During the display period Td, since the transistor Tr6 is OFF, the drain of the transistor Tr2 is in a state of, what is called, floating in which the drain is not provided with any voltage from other wiring, power supply or the like. Accordingly, no drain current flows to the transistor Tr2.

At the pixel of each line, when the write period Ta completes, the selection of the first scan line and the second scan line complete in order. At this time, it is preferred that the selection of the second scan line completes prior to the selection of the first scan line. This is because, if the transistor Tr3 turns OFF earlier, the electric charge of the storage capacitor 255 leaks through the Tr4.

When the write period Ta has completed at the pixel of each line, the display period Td starts. The voltage of the power supply line Vi during the display period Td is held at the same level as the voltage during the write period Ta. When the display period Td starts, the third scan line is selected. Accordingly, at the pixel of each line, the transistors Tr5 and Tr6 are turned ON. Since the first scan line and second scan line are not selected, the transistors Tr3 and Tr4 are OFF.

FIG. 23B shows a schematic diagram of the pixel during the display period Td. The transistor Tr3 and the transistor Tr4 are in a state of OFF. Further, the drains of the transistor Tr1 and the transistor Tr2 are connected to the power supply line Vi.

On the other hand, in the transistors Tr1, the Vas, which has been determined in the write period Ta, is held as it is. And the gate of the transistor Tr2 is connected to the gate of the transistor Tr1. Also, the source of the transistor Tr2 is connected to the source of the transistor Tr1. Accordingly, the gate voltage of the transistor Tr1 becomes the gate voltage of the transistor Tr2 as it is. Further, since the drain of the transistor Tr2 is connected to the power supply line Vi, the drain current $I_2$ of the transistor Tr2 has a magnitude proportional to the drain current of the transistor Tr1. Particularly, when $\mu C_0 W/L$ and $V_{TH}$ are equal to each other, the drain currents of the transistor Tr1 and the transistor Tr2 become equal to each other resulting in $I_2=I_1=Ic$.

Further, since the transistor Tr5 is ON, the drain current $I_1$ of the transistor Tr1 and the drain current $I_2$ of the transistor Tr2 flow to the light emitting element 254 as the current that both of them flow to the light emitting element. Accordingly, during the display period Td, a current of a magnitude that the drain current $I_1$ and the drain current $I_2$ are combined flows to the light emitting element 254, and the light emitting element 254 emits light at the luminance according to the magnitude of the current that flows to the light emitting element.

Immediately after the write period Ta, always the display period Td appears. Immediately after the display period Td, the next write period Ta or the inverted bias period Ti appears.

When the inverted bias period starts, the voltage of the power supply lines V1-$V_x$ is held at a level that the voltage of inverted bias is impressed to the light emitting element when the transistors Tr2 and Tr6 are turned ON. That is to say, when the Tr1 and the Tr2 are of the p-channel type TFT and the anode of the light emitting element 254 is used as the pixel electrode, the voltage of the power supply line Vi is set so as to be lower than that of the counter electrode. To the contrary, when the Tr1 and the Tr2 are of the p-channel type TFT and the cathode of the light emitting element 254 is used as the pixel electrode, the voltage of the power supply line Vi is set so as to be higher than that of the counter electrode.

The first, second and third scan lines of each line are selected in order by the scan line drive circuit 103 and the transistors Tr3, Tr4, Tr5 and Tr6 are turned ON. And a voltage of a level that the transistors Tr1 and the Tr2 are turned ON is impressed to each of the signal lines S1-Sx by the signal line drive circuit 102.

FIG. 23C shows a schematic diagram of the pixel 101 during the inverted bias period Ti. During the inverted bias period Ti, since the Tr2, and Tr6 are turned ON, a voltage of inverted bias is impressed to the light emitting element 254. And the light emitting element 254 gets into a state that the same does not emit light when the voltage of inverted bias is impressed.

It is acceptable if the voltage of the power supply line is at a level that a voltage of inverted bias is impressed to the light emitting element when the transistors Tr2 and Tr6 are turned ON. Also, it is possible for a designer to determine the length of the inverted bias period Ti appropriately while taking the relationship with the duty ratio (a ratio of the sum of the length of display period during one frame period) into consideration.

Since the light emitting element 254 emits light at the luminance corresponding to the magnitude of the current that flows to the light emitting element, the tone of each pixel depends on the magnitude of the current that flows to the light emitting element during the display period Td.

In the pixel according to the example, the current that flows to light emitting element during the display period is the sum of the drain current $I_1$ and the drain current $I_2$. Accordingly, the current that flows to the light emitting element does not depend on the drain current $I_2$ only. Therefore, even when the characteristics of the transistor Tr1 and the transistor Tr2 get different from each other, and a difference of the ratio of the drain current $I_2$ of the transistor Tr2 with respect to the drain current $I_1$ of the transistor Tr1 is resulted in among the pixels, it is possible to prevent the value of the current that flows to light emitting element from getting different among the pixels. As a result, it is possible to prevent the fluctuation of the luminance being recognized visually.

Further, in the pixel according to the example, during the write period Ta, the drain current of the transistor Tr1 does not flow to the light emitting element. Accordingly, the time, from a point when a current is supplied to the pixel by the signal line drive circuit, and drain current of transistor Tr1 flows and the gate voltage begins to change to a point when the value of the voltage gets stable, does not depend on the capacity of the light emitting element. Therefore, since the voltage converted from a supplied current gets stable swiftly, it is possible to shorten the time for writing the current. As a result, it is possible to prevent an afterimage from being recognized visually during motion picture display.

In this example, one of the first terminal and the second terminal of the transistor Tr4 is connected to the second terminal of the transistor Tr1 and another one thereof is connected to the gate of the transistor Tr1 and the gate of the transistor Tr2. However, this example is not limited to this configuration. In this example, as for the pixel, it is acceptable if the transistor Tr4 is connected to another element or wiring so that the gate and the drain of the transistor Tr1 are connected to each other during the write period Ta, and the gate and the drain of the transistor Tr1 are separated from each other during the display period.

That is to say, it is acceptable if Tr3, Tr4, Tr5 and Tr6 are connected as shown in FIG. 23A during Ta; during Td, they are connected as shown in FIG. 23B; and during Ti, they are connected as shown in FIG. 23C. Also, although Gj, Pj and Rj are given with three separated wirings, they may be integrated into one or two wirings.

That is to say, it is acceptable if all of the current that flows through the Tr1 flows to the current source, and all of the current that flows through the current source flows to the Tr1 during the Ta. And during the Td, it is acceptable if the current that flows through the Tr1 and Tr2 flows to the light emitting element.

The light emitting device according to the example is capable of performing display using any of digital video signal and analog video signal.

This example may be implemented in combination with the examples 1-6.

Example 12

The configuration of a pixel of a light emitting device according to still another example of the invention, which is different from those shown in FIG. 2, FIG. 14, FIG. 16. FIG. 18, FIG. 20 and FIG. 22 will be described.

Figure 24:
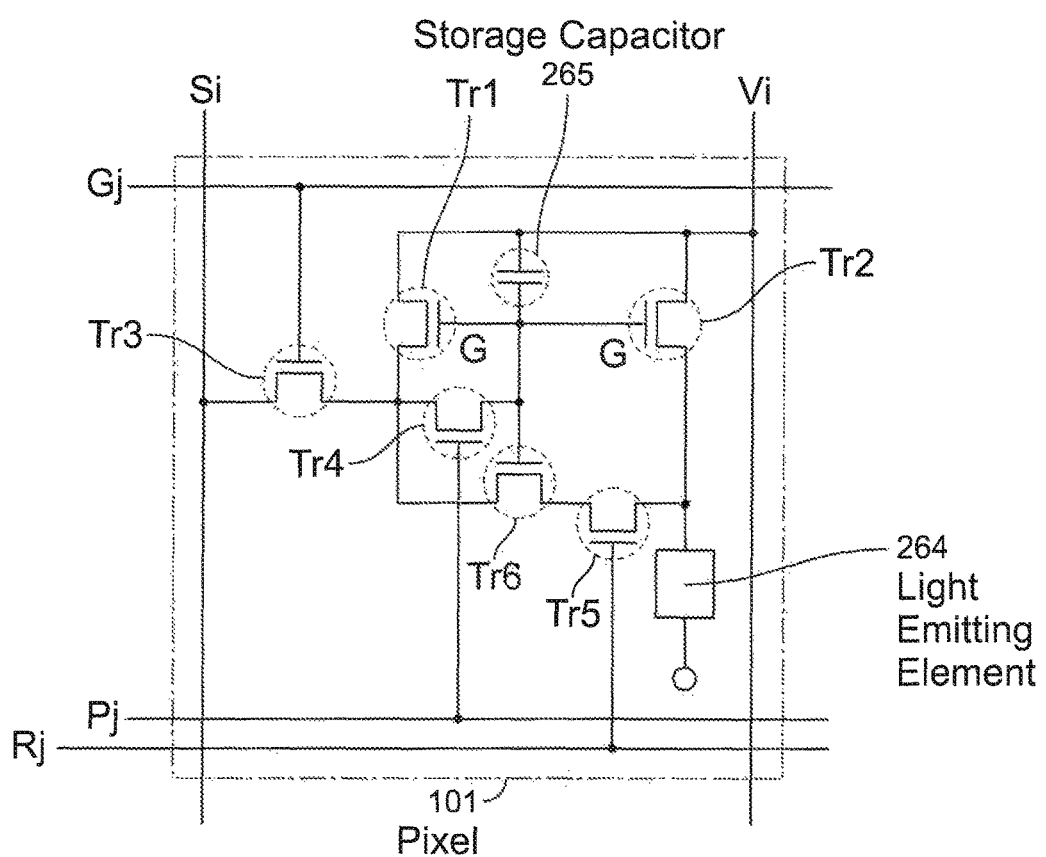
FIG. 24 is a circuit diagram of a pixel of the light emitting device according to the invention.

FIG. 24 shows a detailed configuration of the pixel 101 shown in FIG. 1. The pixel 101 shown in FIG. 24 has a signal line Si (one of the S1-Sx), a first scan line Gj (one of the G1-Gy), a second scan line Pj (one of the P1-Py), a third scan line Rj (one of the R1-Ry) and a power supply line Vi (one of the V1-$V_x$).

Further, the pixel 101 has transistors Tr1, Tr2, Tr3, Tr4, Tr5 and Tr6, a light emitting element 264 and a storage capacitor 265. The storage capacitor 265 is provided in order to maintain the voltage (gate voltage) between the gate and the source of the transistor Tr1 and Tr2 with a higher reliability, but it is not always necessary to provide the same.

A gate of the transistor Tr3 is connected to the first scan line Gj. One of a first terminal and a second terminal of the transistor Tr3 is connected to the signal line Si, and another one thereof is connected to a second terminal of the transistor Tr1.

A gate of the transistor Tr4 is connected to the second scan line Pj. One of a first terminal and a second terminal of the transistor Tr4 is connected to the second terminal of the transistor Tr1, and another one thereof is connected to the gates of the transistors Tr1 and Tr2.

A gate of the transistor Tr6 is connected to the gates of the transistors Tr1 and Tr2. One of a first terminal and a second terminal of the transistor Tr6 is connected to a second terminal of the transistor Tr1, and another one thereof is connected to a first terminal or a second terminal of the transistor Tr5.

A gate of the transistor Tr5 is connected to the third scan line Rj. One of the first terminal and the second terminal of the transistor Tr5 is connected to a second terminal of the transistor Tr2, and another one thereof is connected to a first terminal or a second terminal of the transistor Tr6.

The gates of the transistor Tr1, the transistor Tr2 and Tr6 are connected to each other. Both of sources of the transistor Tr1 and the transistor Tr2 are connected to the power supply line Vi. The second terminal of the transistor Tr2 is connected to a pixel electrode of a light emitting element 264. An counter electrode is held at a predetermined voltage.

One of the two electrodes included in a storage capacitor 265 is connected to the gates of the transistors Tr1 and Tr2, and another one thereof is connected to the power supply line Vi.

The transistors Tr1, Tr2 and Tr6 may be any of an n-channel transistor and a p-channel transistor. However, the polarity of the transistors Tr1, Tr2 and Tr6 are the same. When the anode is used as the pixel electrode and the cathode is used as the counter electrode, it is preferred that the transistors Tr1 and Tr2 are the p-channel transistors. To the contrary, when the anode is used as the counter electrode and the cathode is used as the pixel electrode, it is preferred that the transistors Tr1 and Tr2 are the n-channel transistors.

The transistors Tr3, Tr4 and Tr5 may be any of the n-channel transistor and the p-channel transistor.

Next, referring to FIG. 25, the operation of the light emitting device according to the example will be described. The operation of the light emitting device according to the invention will be described being separated into a write period Ta, a display period Td and a inverted bias period Ti on the basis of each pixel of the respective lines. FIG. 25 is a diagram briefly showing the connections of the transistor Tr1, Tr2, Tr6 and the light emitting element 264 during the respective periods. Herein, the case that the Tr1, Tr2 and Tr6 are of the p-channel type TFT, and the anode of the light emitting element 264 is used as the pixel electrode is given as an example.

First, when the write period Ta starts at a pixel of each line, the voltage of the power supply lines V1-$V_x$ is held at a level so that the current of the forward bias flows to the light emitting element when the transistor Tr2 is turned ON. That is to say, when the Tr1, Tr2 and Tr6 are of the p-channel type TFT and the anode of the light emitting element 264 is used as the pixel electrode, the voltage of the power supply line Vi is set to be higher than that of the counter electrode. To the contrary, when the Tr1, Tr2 and Tr6 are of the p-channel type TFT and the cathode of the light emitting element 264 is used as the pixel electrode, the voltage of the power supply line Vi is set to be lower than that of the counter electrode.

The first scan line and the second scan line of each line are selected in order. Accordingly, the transistors Tr3 and Tr4 are turned ON. The selected periods of the first and the second scan line do not overlap with each other. Since the third scan line is not selected, the transistor Tr5 is OFF.

Based on video signal, which is input to a signal line drive circuit 102, signal current Ic corresponding to the video signal respectively flows between the signal lines S1-Sx and the power supply lines V1-$V_x$.

Figure 25A:
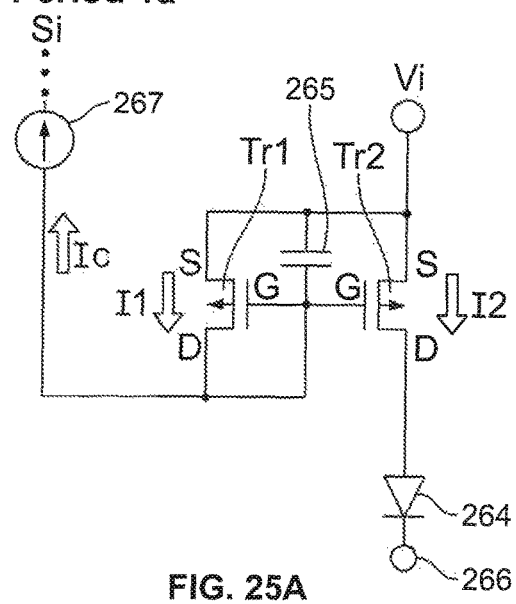
FIGS. 25A to 25C are schematic diagrams of the pixel being operation.

FIG. 25A shows a schematic diagram of the pixel 101 when the signal current Ic corresponding to the video signal flows to the signal line Si during the write period Ta. Reference numeral 266 denotes a terminal for connecting to a power supply that provides a voltage to the counter electrode. Reference numeral 267 denotes a constant current source included in the signal line drive circuit 102.

Since the transistor Tr3 is ON, when the signal current Ic corresponding to the video signal flows to the signal line Si, the signal current Ic flows between a drain and the source of the transistor Tr1. At this time, since the gate and the drain are connected, the transistor Tr1 operates in a saturated zone and Expression 1 is satisfied. Accordingly, gate voltage $V_{GS}$ of the transistor Tr1 is determined depending on the current value Ic. At this time, the value of the current value Ic is determined so that the gate voltage $V_{GS}$ of the transistor Tr1 depending on the current value Ic is lower than the voltage obtained by adding a threshold $V_{TH}$ of the Tr1 and a threshold $V_{TH}$ of the Tr6. When the Tr1, Tr2 and Tr6 are of the n-channel type TFT, the value of the current value Ic is determined so that the same is higher than the value obtained by adding the threshold $V_{TH}$ of the Tr1 and the threshold $V_{TH}$ of the Tr6.

The gate of the transistor Tr2 is connected to the gate of the transistor Tr1. Further, the source of the transistor Tr2 is connected to the source of the transistor Tr1. Accordingly, the gate voltage of the transistor Tr1 is the gate voltage of the transistor Tr2 as it is. Accordingly, the drain current of the transistor Tr2 is proportional to the drain current of the transistor Tr1. Particularly, when $\mu C_0 W/L$ and $V_{TH}$ are equal to each other, the drain currents of the transistor Tr1 and the transistor Tr2 become equal to each other resulting in $I_2$=Ic.

The drain current $I_2$ of the transistor Tr2 flows to the light emitting element 264. The current that flows to the light emitting element has a magnitude corresponding to the signal current Ic determined by the constant current source 267, and the light emitting element 264 emits light with the luminance corresponding to the magnitude of the current that flows thereto. When the current that flows to the light emitting element is extremely close to 0, or when the current that flows to the light emitting element is of the inverted bias, the light emitting element 264 does not emit light.

When the write period Ta completes, the selection of the first scan line and the second scan line complete. At this time, it is preferred that the selection of the second scan line completes prior to the selection of the first scan line. This is because if the transistor Tr3 turns OFF earlier, the electric charge of the storage capacitor 265 leaks through the Tr4.

When the write period Ta has completed, the display period Td starts. The voltage of the power supply line Vi during the display period Td is held at the same level as the voltage during the write period Ta. When the display period Td starts, the third scan line is selected, and the transistor Tr5 is turned ON. Since the first scan line and second scan line are not selected, the transistors Tr3 and Tr4 are OFF.

Figure 25B:
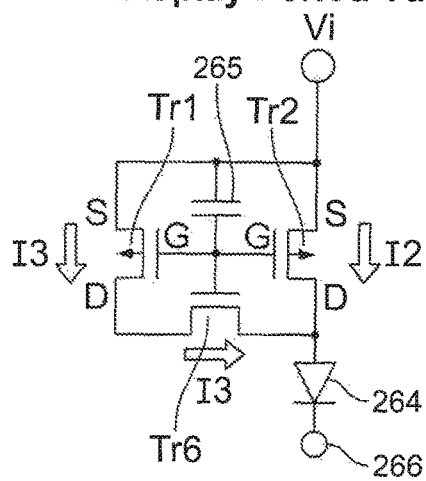

FIG. 25B shows a schematic diagram of the pixel during the display period Td. The transistor Tr3 and the transistor Tr4 are in a state of OFF. Further, the sources of the transistor Tr1 and the transistor Tr2 are connected to the power supply line Vi.

On the other hand, in the transistors Tr1 and Tr2, the Vas, which has been determined in the write period Ta, is held as it is. The $V_{GS}$ is lower than the voltage in which threshold $V_{TH}$ of Tr1 and threshold $V_{TH}$ of Tr6 are added. Further, the gate of the transistor Tr6 is connected to the gates of the transistors Tr1 and Tr2. Accordingly, the drain current of the transistor Tr1 and the drain current of the transistor Tr6 are held at the same magnitude. And as demonstrated by Expression 1, the drain current of the transistor Tr1 depends on the channel length and the channel width of the transistor Tr6.

Assuming that the gate voltage, the mobility, the gate capacitance per unit area, the threshold and the channel width are the same between the transistor Tr1 and Tr6, Expression 2 is resulted in from Expression 1. In Expression 2, channel length of the transistor Tr1 is defined as L1; channel length of Tr6 is defined as L6; and drain currents of Tr1 and Tr6 is defined as $I_3$.

$$I_3 = I_1 \times L1/(L1+L6) \quad \text{[Expression 2]}$$

On the other hand, the value of the drain current $I_2$ of the transistor Tr2 is held at the magnitude corresponding to the signal current Ic. And since the transistor Tr5 is ON, both of the drain current $I_3$ of the transistor Tr1 and Tr6 and the drain current $I_2$ of the transistor Tr2 flow to the light emitting element 264. Accordingly, the light emitting element 264 emits light at the luminance according to the magnitude of the current in which the drain currents $I_3$ and $I_2$ are combined.

Immediately after the write period Ta, always the display period Td appears. Immediately after the display period Td, the next write period Ta or the inverted bias period Ti appears.

When the inverted bias period starts, the voltage of the power supply lines V1-$V_x$ is held at a level that the voltage of inverted bias is impressed to the light emitting element when the transistor Tr2 is turned ON. That is to say, when Tr1, Tr2 and Tr6 are of the p-channel type TFT and the anode of the light emitting element 264 is used as the pixel electrode, the voltage of the power supply line Vi is set so as to be lower than that of the counter electrode. To the contrary, when Tr1, Tr2 and Tr6 are of the n-channel type TFT and the cathode of the light emitting element 264 is used as the pixel electrode, the voltage of the power supply line Vi is set so as to be higher than that of the counter electrode.

Figure 25C:
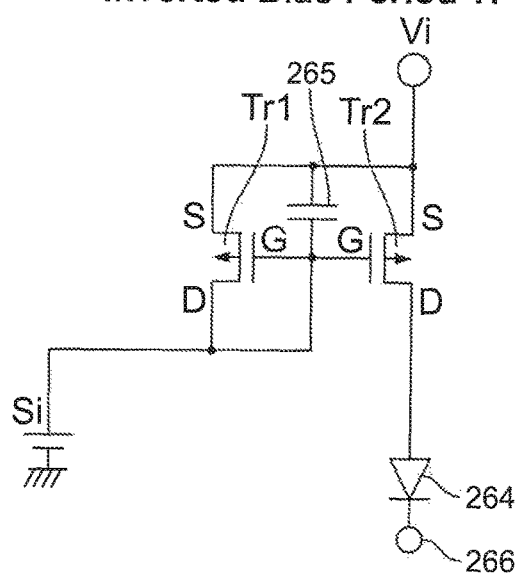

The first and second scan lines of each line are selected in order by the scan line drive circuit 103 and the transistors Tr3 and Tr4 are turned ON. And a voltage of a level that the transistors Tr1, Tr2 and Tr6 are turned ON is impressed to each of the signal lines S1-Sx by the signal line drive circuit 102. Any case whether the third scan line is selected or not is acceptable. FIG. 25C shows a case that the third scan line is not selected, and Tr5 is OFF.

FIG. 25C shows a schematic diagram of the pixel 101 during the inverted bias period Ti. During the inverted bias period Ti, since Tr2 is turned ON, a voltage of inverted bias is impressed to the light emitting element 264. And the light emitting element 264 gets into a state that the same does not emit light when the voltage of inverted bias is impressed.

It is acceptable if the voltage of the power supply line is at a level that a voltage of inverted bias is impressed to the light emitting element when the transistor Tr2 is turned ON. Also, it is possible for a designer to determine the length of the inverted bias period Ti appropriately while taking the relationship with the duty ratio (a ratio of the sum of the length of display period during one frame period) into consideration.

Since the light emitting element 264 emits light at the luminance corresponding to the magnitude of the current that flows to the light emitting element, the tone of each pixel depends on the magnitude of the current that flows to the light emitting element during the display period Td.

During the write period Ta also, although the light emitting element emits light at the luminance corresponding to the magnitude of the drain current $I_1$, it can be assumed that the influence thereof on the tone of the actual panel is extremely small to an extent that it can be neglected. This is because, for example, in the case of VGA, since the pixel section is provided with pixels of 480 lines, the write period Ta for the pixels of one line is extremely small as approximately 1/480 of one frame period. Of course, the magnitude of the signal current Ic may be corrected while taking into consideration the influence on the tone of the current that flows to the light emitting element during the write period Ta.

In the pixel according to the example, the current that flows to light emitting element during the display period is the sum of the drain current $I_2$ and the drain current $I_3$. Accordingly, the current that flows to the light emitting element does not depend on the drain current $I_2$ only. Therefore, even when the characteristics of the transistor Tr1 and the transistor Tr2 get different from each other, and a difference of the ratio of the drain current $I_2$ of the transistor Tr2 with respect to the signal current Ic is resulted in among the pixels, it is possible to prevent the value of the current that flows to light emitting element from getting different among the pixels. As a result, it is possible to prevent the fluctuation of the luminance being recognized visually.

Further, in the pixel according to the example, during the write period Ta, the drain current of the transistor Tr1 does not flow to the light emitting element. Accordingly, the time, from a point when a current is supplied to the pixel by the signal line drive circuit, and drain current of transistor Tr1 flows and the gate voltage begins to change to a point when the value of the voltage gets stable, does not depend on the capacity of the light emitting element. Therefore, since the voltage converted from a supplied current gets stable swiftly, it is possible to shorten the time for writing the current. As a result, it is possible to prevent an afterimage from being recognized visually during motion picture display.

Furthermore, compared to the pixels shown in FIG. 2, FIG. 14, FIG. 16, FIG. 18, FIG. 20 and FIG. 22, in the pixel according to the example, since the drain current of Tr1 during display period is smaller than the drain current of the transistor Tr1 during the write period, the ratio of the current that flows to the light emitting element with respect to the signal current Ic becomes smaller. Accordingly, since it is possible to make the signal current Ic larger, it is hardly subjected to the influence of noise.

In this example, one of the first terminal and the second terminal of the transistor Tr4 is connected to the second terminal of the transistor Tr1 and another one thereof is connected to the gate of the transistor Tr1 and the gate of the transistor Tr2. However, this example is not limited to this configuration. In this example, as for the pixel, it is acceptable if the transistor Tr4 is connected to another element or wiring so that the gate and the drain of the transistor Tr1 are connected to each other during the write period Ta, and the gate and the drain of the transistor Tr1 are separated from each other during the display period.

Further, according to the example, one of the first terminal and the second terminal of the transistor Tr5 are connected to the second terminal of Tr2, and another one thereof is connected to the first terminal or the second terminal of Tr6. However, the example is not limited to this configuration. In the pixel according to the example, if the transistor Tr5 is connected to another element or wiring so that the drain of the transistor Tr1 and the pixel electrode are separated from each other during write period Ta and the drain of the transistor Tr1 and the pixel electrode are connected to each other during display period Ta.

That is to say, it is acceptable if Tr3, Tr4 and Tr5 are connected as shown in FIG. 25A during Ta; during Td, they are connected as shown in FIG. 25B; and during Ti, they are connected as shown in FIG. 25C. Also, although Gj, Pj and Rj are given with three separated wirings, they may be integrated into one or two wirings.

That is to say, it is acceptable if all of the current that flows through the Tr1 flows to the current source, and all of the current that flows through the current source flows to the Tr1 during the Ta. And during the Td, it is acceptable if the current that flows through the Tr1 and Tr2 flows to the light emitting element.

The light emitting device according to the example is capable of performing display using any of digital video signal and analog video signal.

This example may be implemented in combination with the examples 1-6.

Example 13

The configuration of a pixel of a light emitting device according to still another example of the invention, which is different from those shown in FIG. 2, FIG. 14, FIG. 16. FIG. 18, FIG. 20, FIG. 22 and FIG. 24 will be described.

Figure 26:
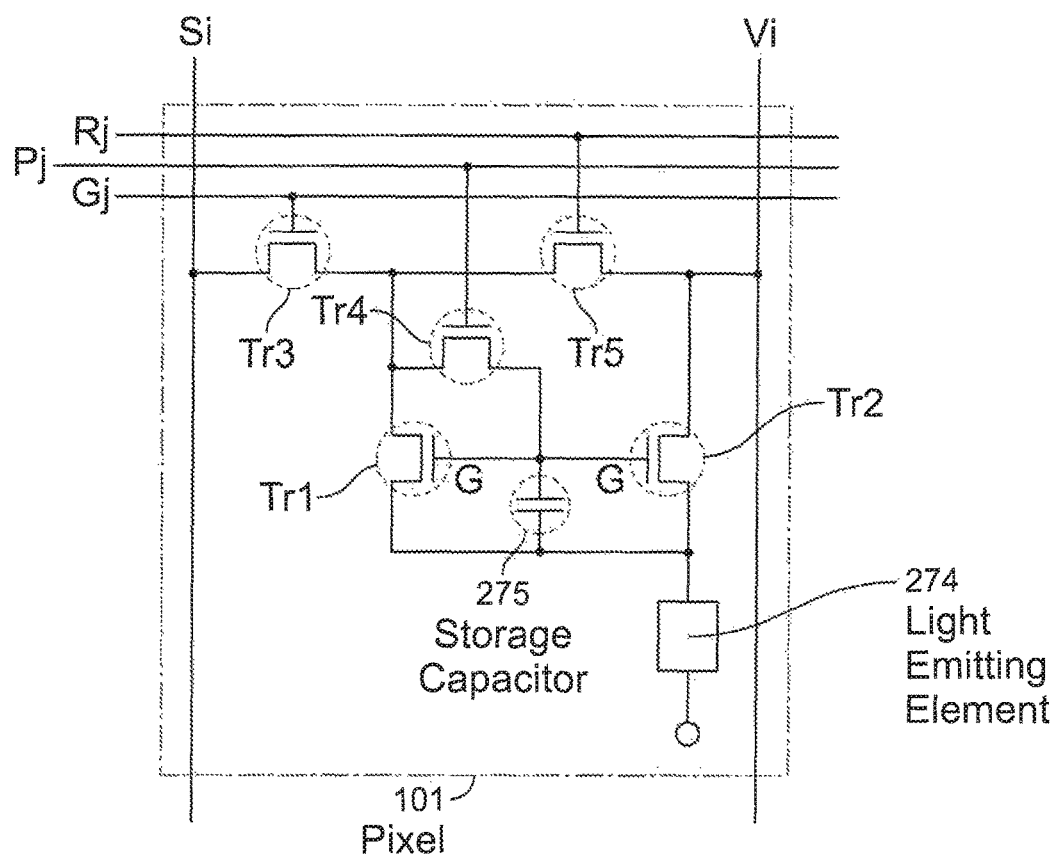
FIG. 26 is a circuit diagram of a pixel of the light emitting device according to the invention.

FIG. 26 shows a detailed configuration of the pixel 101 shown in FIG. 1. The pixel 101 shown in FIG. 26 has a signal line Si (one of the S1-Sx), a first scan line Gj (one of the G1-Gy), a second scan line Pj (one of the P1-Py), a third scan line Rj (one of the R1-Ry) and a power supply line Vi (one of the V1-$V_x$).

Further, the pixel 101 has transistors Tr1, Tr2, Tr3, Tr4 and Tr5, a light emitting element 274 and a storage capacitor 275. The storage capacitor 275 is provided in order to maintain the voltage (gate voltage) between the gate and the source of the transistor Tr1 and Tr2 with a higher reliability, but it is not always necessary to provide the same.

A gate of the transistor Tr3 is connected to the first scan line Gj. One of a first terminal and a second terminal of the transistor Tr3 is connected to the signal line Si, and another one thereof is connected to a second terminal of the transistor Tr1.

A gate of the transistor Tr4 is connected to the second scan line Pj. One of a first terminal and a second terminal of the transistor Tr4 is connected to the second terminal of the transistor Tr1, and another one thereof is connected to the gates of the transistors Tr1 and Tr2.

A gate of the transistor Tr5 is connected to the third scan line Rj. One of a first terminal and a second terminal of the transistor Tr5 is connected to a second terminal of the transistor Tr2 and the power supply line Vi, and another one thereof is connected to the second terminal of the transistor Tr1.

The gates of the transistor Tr1 and the transistor Tr2 are connected to each other. Both of the first terminals of the transistor Tr1 and the transistor Tr2 are connected to a pixel electrode of the light emitting element 274.

One of the two electrodes included in a storage capacitor 275 is connected to the gates of the transistors Tr1 and Tr2, and another one thereof is connected to a pixel electrode of a light emitting element 274. An counter electrode is held at a predetermined voltage.

The transistors Tr1 and Tr2 may be any of an n-channel transistor and a p-channel transistor. However, the polarity of the transistors Tr1 and Tr2 are the same. When the anode is used as the pixel electrode and the cathode is used as the counter electrode, it is preferred that the transistors Tr1 and Tr2 are the n-channel transistors. To the contrary, when the anode is used as the counter electrode and the cathode is used as the pixel electrode, it is preferred that the transistors Tr1 and Tr2 are the p-channel transistors.

The transistors Tr3, Tr4 and Tr5 may be any of the n-channel transistor and the p-channel transistor.

Next, referring to FIG. 27, the operation of the light emitting device according to the example will be described. The operation of the light emitting device according to the invention will be described being separated into a write period Ta, a display period Td and a inverted bias period Ti on the basis of each pixel of the respective lines. FIG. 27 is a diagram briefly showing the connections of the transistor Tr1, Tr2 and the light emitting element 274 during the respective periods. Herein, the case that the Tr1 and Tr2 are of the n-channel type TFT, and the anode of the light emitting element 274 is used as the pixel electrode is given as an example.

First, when the write period Ta starts at a pixel of each line, the voltage of the power supply lines V1-$V_x$ is held at a level so that the current of the forward bias flows to the light emitting element when the transistor Tr2 is turned ON. That is to say, when the Tr1 and Tr2 are of the n-channel type TFT and the anode of the light emitting element 274 is used as the pixel electrode, the voltage of the power supply line Vi is set to be higher than that of the counter electrode. To the contrary, when the Tr1 and Tr2 are of the n-channel type TFT and the cathode of the light emitting element 274 is used as the pixel electrode, the voltage of the power supply line Vi is set to be lower than that of the counter electrode.

The first scan line and the second scan line of each line are selected in order by a scan line drive circuit 103. The selected periods of the first and the second scan lines do not overlap with each other. Accordingly, the transistors Tr3 and Tr4 are turned ON. Since the third scan line is not selected, the transistor Tr5 is OFF.

Based on video signal, which is input to a signal line drive circuit 102, signal current Ic corresponding to the video signal respectively flows between the signal lines S1-Sx and the power supply lines V1-$V_x$.

Figure 27A:
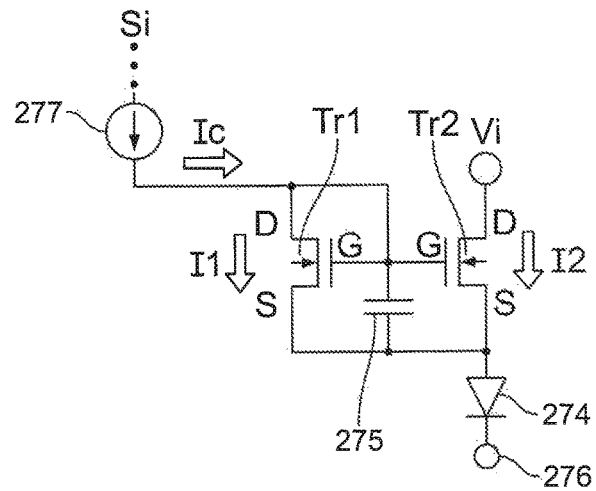
FIGS. 27A to 27C are schematic diagrams of the pixel being operation.

FIG. 27A shows a schematic diagram of the pixel 101 when the signal current Ic corresponding to the video signal flows to the signal line Si during the write period Ta. Reference numeral 276 denotes a terminal for connecting to a power supply that provides a voltage to the counter electrode. Reference numeral 277 denotes a constant current source included in the signal line drive circuit 102.

Since the transistor Tr3 is ON, when the signal current Ic corresponding to the video signal flows to the signal line Si, the signal current Ic flows between a drain and the source of the transistor Tr1. At this time, since the gate and the drain are connected, the transistor Tr1 operates in a saturated zone and Expression 1 is satisfied. Accordingly, gate voltage $V_{GS}$ of the transistor Tr1 is determined depending on the current value Ic.

The gate of the transistor Tr2 is connected to the gate of the transistor Tr1. Further, the source of the transistor Tr2 is connected to the source of the transistor Tr1. Accordingly, the gate voltage of the transistor Tr1 is the gate voltage of the transistor Tr2 as it is. Accordingly, the drain current of the transistor Tr2 is proportional to the drain current of the transistor Tr1. Particularly, when $\mu C_0 W/L$ and $V_{TH}$ are equal to each other, the drain currents of the transistor Tr1 and the transistor Tr2 become equal to each other resulting in $I_2$=Ic.

The drain current $I_2$ of the transistor Tr2 flows to the light emitting element 274. The current that flows to the light emitting element has a magnitude corresponding to the signal current Ic determined by the constant current source 277, and the light emitting element 274 emits light with the luminance corresponding to the magnitude of the current that flows thereto. When the current that flows to the light emitting element is extremely close to 0, or when the current that flows to the light emitting element is of the inverted bias, the light emitting element 274 does not emit light.

When the write period Ta completes, the selection of the first scan line and the second scan line complete. At this time, it is preferred that the selection of the second scan line completes prior to the selection of the first scan line. This is because, if the transistor Tr3 turns OFF earlier, the electric charge of the storage capacitor 275 leaks through the Tr4.

When the write period Ta has completed, the display period Td starts. The voltage of the power supply line Vi during the display period Td is held at the same level as the voltage during the write period Ta. When the display period Td starts, the third scan line of each line is selected in order, and the transistor Tr5 is turned ON. Since the first scan line and second scan line are not selected, the transistors Tr3 and Tr4 are OFF.

Figure 27B:
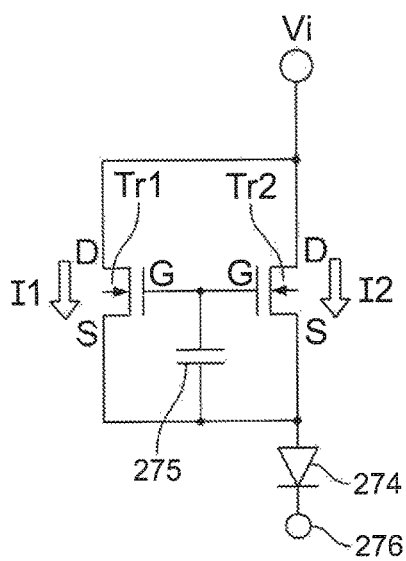

FIG. 27B shows a schematic diagram of the pixel during the display period Td. The transistor Tr3 and the transistor Tr4 are in a state of OFF. Further, the sources of the transistor Tr1 and the transistor Tr2 are connected to the pixel electrode of the light emitting element 274.

On the other hand, in the transistors Tr1 and Tr2, the $V_{GS}$, which has been determined in the write period Ta, is held as it is. And the gate of the transistor Tr2 is connected to the gate of the transistor Tr1. Also, the source of the transistor Tr2 is connected to the source of the transistor Tr1. Accordingly, the gate voltage of the transistor Tr1 becomes the gate voltage of the transistor Tr2 as it is. Further, since the drain of the transistor Tr1 and the drain of the transistor Tr2 is connected to the power supply line Vi, the drain current $I_2$ of the transistor Tr2 has a magnitude proportional to the drain current $I_1$ of the transistor Tr1. Particularly, when $\mu C_0 W/L$ and $V_3$ are equal to each other, the drain currents of the transistor Tr1 and the transistor Tr2 become equal to each other resulting in $I_2=I_1$=Ic.

Further, since the transistor Tr5 is ON, the drain current $I_1$ of the transistor Tr1 and the drain current $I_2$ of the transistor Tr2 flow to the light emitting element 274 as the current that both of them flow to the light emitting element. Accordingly, during the display period Td, a current of a magnitude that the drain current $I_1$ and the drain current $I_2$ are combined flows to the light emitting element 274, and the light emitting element 274 emits light at the luminance corresponding to the magnitude of the current that flows to the light emitting element.

Immediately after the write period Ta, always the display period Td appears. Immediately after the display period Td, the next write period Ta or the inverted bias period Ti appears.

When the inverted bias period starts, the voltage of the power supply lines V1-$V_x$ is held at a level that the voltage of inverted bias is impressed to the light emitting element when the transistor Tr2 is turned ON. That is to say, when Tr1 and Tr2 are of the n-channel type TFT and the anode of the light emitting element 274 is used as the pixel electrode, the voltage of the power supply line Vi is set so as to be lower than that of the counter electrode. To the contrary, when Tr1 and Tr2 are of the p-channel type TFT and the cathode of the light emitting element 274 is used as the pixel electrode, the voltage of the power supply line Vi is set so as to be higher than that of the counter electrode.

Figure 27C:
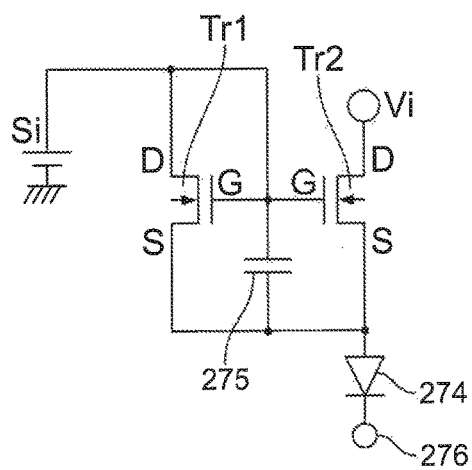

The first and second scan lines of each line are selected in order by the scan line drive circuit 103 and the transistors Tr3 and Tr4 are turned ON. And a voltage of a level that the transistors Tr1 and Tr2 are turned ON is impressed to each of the signal lines S1-Sx by the signal line drive circuit 102. Any case whether the third scan line is selected or not is acceptable. FIG. 27C shows a case that the third scan line is not selected, and Tr5 is OFF.

FIG. 27C shows a schematic diagram of the pixel 101 during the inverted bias period Ti. During the inverted bias period Ti, since Tr1 and Tr2 are turned ON, the voltage of the power supply line Vi is supplied to the pixel electrode of the light emitting element 274, and a voltage of inverted bias is impressed to the light emitting element 274. And the light emitting element 274 gets into a state that the same does not emit light when the voltage of inverted bias is impressed.

It is acceptable if the voltage of the power supply line is at a level that a voltage of inverted bias is impressed to the light emitting element when the transistors Tr1 and Tr2 are turned ON. Also, it is possible for a designer to determine the length of the inverted bias period Ti appropriately while taking the relationship with the duty ratio (a ratio of the sum of the length of display period during one frame period) into consideration.

Since the light emitting element 274 emits light at the luminance corresponding to the magnitude of the current that flows to the light emitting element, the tone of each pixel depends on the magnitude of the current that flows to the light emitting element during the display period Td.

In the pixel according to the example, the current that flows to light emitting element during the display period is the sum of the drain current $I_1$ and the drain current $I_2$. Accordingly, the current that flows to the light emitting element does not depend on the drain current $I_2$ only. Therefore, even when the characteristics of the transistor Tr1 and the transistor Tr2 get different from each other, and a difference of the ratio of the drain current $I_2$ of the transistor Tr2 with respect to the signal current Ic is resulted in among the pixels, it is possible to prevent the value of the current that flows to light emitting element from getting different among the pixels. As a result, it is possible to prevent the fluctuation of the luminance being recognized visually.

Further, in the pixel according to the example, during the write period Ta, the drain current of the transistor Tr1 does not flow to the light emitting element. Accordingly, the time, from a point when a current is supplied to the pixel by the signal line drive circuit, and drain current of transistor Tr1 flows and the gate voltage begins to change to a point when the value of the voltage gets stable, does not depend on the capacity of the light emitting element. Therefore, since the voltage converted from a supplied current gets stable swiftly, it is possible to shorten the time for writing the current. As a result, it is possible to prevent an afterimage from being recognized visually during motion picture display.

In this example, one of the first terminal and the second terminal of the transistor Tr4 is connected to the second terminal of the transistor Tr1 and another one thereof is connected to the gate of the transistor Tr1 and the gate of the transistor Tr2. However, this example is not limited to this configuration. In this example, as for the pixel, it is acceptable if the transistor Tr4 is connected to another element or wiring so that the gate and the drain of the transistor Tr1 are connected to each other during the write period Ta, and the gate and the drain of the transistor Tr1 are separated from each other during the display period.

Further, in this example, one of the first terminal and the second terminal of the transistor Tr5 is connected to the second terminal of the transistor Tr2 and another one thereof is connected to the first terminal or the second terminal of Tr6. However, this example is not limited to this configuration. In this example, as for the pixel, it is acceptable if the transistor Tr5 is connected to another element or wiring so that the drain of the transistor Tr1 and the pixel electrode are separated from each other during the write period Ta, and the drain of the transistor Tr1 and the pixel electrode are connected to each other during the display period.

That is to say, it is acceptable if Tr3, Tr4 and Tr5 are connected as shown in FIG. 27A during Ta; during Td, they are connected as shown in FIG. 27B; and during Ti, they are connected as shown in FIG. 27C. Also, although Gj, Pj and Rj are given with three separated wirings, they may be integrated into one or two wirings.

That is to say, it is acceptable if all of the current that flows through the Tr1 flows to the current source, and all of the current that flows through the current source flows to the Tr1 during the Ta. And during the Td, it is acceptable if the current that flows through the Tr1 and Tr2 flows to the light emitting element.

The light emitting device according to the example is capable of performing display using any of digital video signal and analog video signal.

This example may be implemented in combination with the examples 1-6.

Example 14

The configuration of a pixel of a light emitting device according to still another example of the invention, which is different from those shown in FIG. 2, FIG. 14. FIG. 16, FIG. 18, FIG. 20, FIG. 22, FIG. 24 and FIG. 26 will be described.

Figure 28:
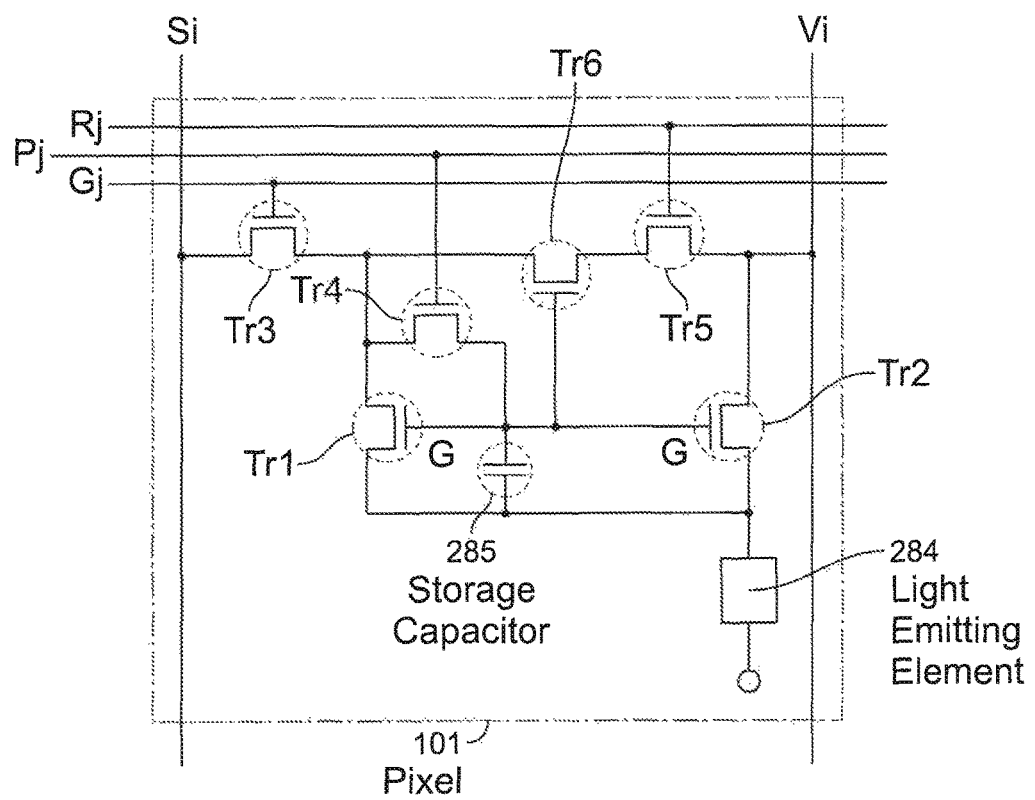
FIG. 28 is a circuit diagram of a pixel of the light emitting device according to the invention.

FIG. 28 shows a detailed configuration of the pixel 101 shown in FIG. 1. The pixel 101 shown in FIG. 28 has a signal line Si (one of the S1-Sx), a first scan line Gj (one of the G1-Gy), a second scan line Pj (one of the P1-Py), a third scan line Rj (one of the R1-Ry) and a power supply line Vi (one of the V1-$V_x$).

Further, the pixel 101 has transistors Tr1, Tr2, Tr3, Tr4, Tr5 and Tr6, a light emitting element 284 and a storage capacitor 285. The storage capacitor 285 is provided in order to maintain the voltage (gate voltage) between the gate and the source of the transistor Tr1 and Tr2 with a higher reliability, but it is not always necessary to provide the same.

A gate of the transistor Tr3 is connected to the first scan line Gj. One of a first terminal and a second terminal of the transistor Tr3 is connected to the signal line Si, and another one thereof is connected to a second terminal of the transistor Tr1.

A gate of the transistor Tr4 is connected to the second scan line PJ. One of a first terminal and a second terminal of the transistor Tr4 is connected to the second terminal of the transistor Tr1, and another one thereof is connected to the gates of the transistors Tr1 and Tr2.

A gate of the transistor Tr5 is connected to the third scan line Rj. One of a first terminal and a second terminal of the transistor Tr5 is connected to a second terminal of the transistor Tr2 and the power supply line Vi, and another one thereof is connected to a first or second terminal of the transistor Tr6.

A gate of the transistor Tr6 is connected to the gates of the transistors Tr1 and Tr2. One of a first terminal and a second terminal of the transistor Tr6 is connected to a second terminal of the transistor Tr1, and another one thereof is connected to a first terminal or a second terminal of the transistor Tr5.

The gates of the transistor Tr1 and the transistor Tr2 are connected to each other. Both of the first terminals of the transistor Tr1 and the transistor Tr2 are connected to a pixel electrode of the light emitting element 284. An counter electrode is held to a predetermined voltage.

One of the two electrodes included in a storage capacitor 285 is connected to the gates of the transistors Tr1 and Tr2, and another one thereof is connected to a pixel electrode of a light emitting element 284.

The transistors Tr1, Tr2 and Tr6 may be any of an n-channel transistor and a p-channel transistor. However, the polarity of the transistors Tr1, Tr2 and Tr6 are the same. When the anode is used as the pixel electrode and the cathode is used as the counter electrode, it is preferred that the transistors Tr1, Tr2 and Tr6 are the n-channel transistors. To the contrary, when the anode is used as the counter electrode and the cathode is used as the pixel electrode, it is preferred that the transistors Tr1, Tr2 and Tr6 are the p-channel transistors.

The transistors Tr3, Tr4 and Tr5 may be any of the n-channel transistor and the p-channel transistor.

Next, referring to FIG. 29, the operation of the light emitting device according to the example will be described. The operation of the light emitting device according to the invention will be described being separated into a write period Ta, a display period Td and a inverted bias period Ti on the basis of each pixel of the respective lines. FIG. 29 is a diagram briefly showing the connections of the transistor Tr1, Tr2 and the light emitting element 284 during the respective periods. Herein, the case that the Tr1, Tr2 and Tr6 are of the n-channel type TFT, and the anode of the light emitting element 284 is used as the pixel electrode is given as an example.

First, when the write period Ta starts at a pixel of each line, the voltage of the power supply lines V1-$V_x$ is held at a level so that the current of the forward bias flows to the light emitting element when the transistors Tr1 and Tr2 are turned ON. That is to say, when the Tr1, Tr2 and Tr6 are of the n-channel type TFT and the anode of the light emitting element 284 is used as the pixel electrode, the voltage of the power supply line Vi is set to be higher than that of the counter electrode. To the contrary, when the Tr1, Tr2 and Tr6 are of the p-channel type TFT and the cathode of the light emitting element 284 is used as the pixel electrode, the voltage of the power supply line Vi is set to be lower than that of the counter electrode.

The first scan line and the second scan line of each line are selected by a scan line drive circuit 103. Accordingly, the transistors Tr3 and Tr4 are turned ON. The selected periods of the first and the second scan line do not overlap with each other. Since the third scan line is not selected, the transistor Tr5 is OFF.

Based on video signal, which is input to a signal line drive circuit 102, signal current Ic corresponding to the video signal respectively flows between the signal lines S1-Sx and the power supply lines V1-$V_x$.

Figure 29A:
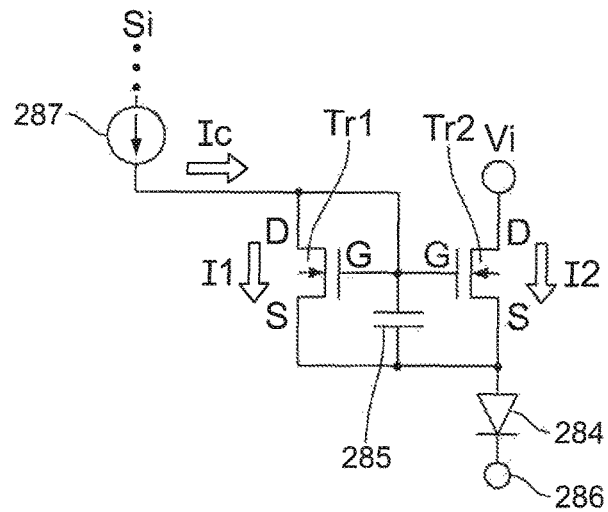
FIGS. 29A to 29C are schematic diagrams of the pixel being operation.

FIG. 29A shows a schematic diagram of the pixel 101 when the signal current Ic corresponding to the video signal flows to the signal line Si during the write period Ta. Reference numeral 286 denotes a terminal for connecting to a power supply that provides a voltage to the counter electrode. Reference numeral 287 denotes a constant current source included in the signal line drive circuit 102.

Since the transistor Tr3 is ON, when the signal current Ic corresponding to the video signal flows to the signal line Si, the signal current Ic flows between a drain and the source of the transistor Tr1. At this time, since the gate and the drain are connected, the transistor Tr1 operates in a saturated zone and Expression 1 is satisfied. Accordingly, gate voltage $V_{GS}$ of the transistor Tr1 is determined depending on the current value Ic. At this time, the value of the current value Ic is determined so that the gate voltage $V_{GS}$ of the transistor Tr1 depending on the current value Ic is higher than the voltage obtained by adding a threshold $V_{TH}$ of the Tr1 and a threshold $V_{TH}$ of the Tr6. When the Tr1, Tr2 and Tr6 are of the p-channel type TFT, the value of the current value Ic is determined so that the same is lower than the voltage obtained by adding the threshold $V_{TH}$ of the Tr1 and the threshold $V_{TH}$ of the Tr6.

The gate of the transistor Tr2 is connected to the gate of the transistor Tr1. Further, the source of the transistor Tr2 is connected to the source of the transistor Tr1. Accordingly, the gate voltage of the transistor Tr1 is the gate voltage of the transistor Tr2 as it is. Accordingly, the drain current of the transistor Tr2 is proportional to the drain current of the transistor Tr1. Particularly, when $\mu C_0 W/L$ and VT are equal to each other, the drain currents of the transistor Tr1 and the transistor Tr2 become equal to each other resulting in $I_2$=Ic.

The drain current $I_2$ of the transistor Tr2 flows to the light emitting element 284. The current that flows to the light emitting element has a magnitude corresponding to the signal current Ic determined by the constant current source 287, and the light emitting element 284 emits light with the luminance corresponding to the magnitude of the current that flows thereto. When the current that flows to the light emitting element is extremely close to 0, or when the current that flows to the light emitting element is of the inverted bias, the light emitting element 284 does not emit light.

When the write period Ta completes, the selection of the first scan line and the second scan line complete. At this time, it is preferred that the selection of the second scan line completes prior to the selection of the first scan line. This is because, if the transistor Tr3 turns OFF earlier, the electric charge of the storage capacitor 285 leaks through the Tr4.

When the write period Ta has completed, the display period Td starts. The voltage of the power supply line Vi during the display period Td is held at the same level as the voltage during the write period Ta. When the display period Td starts, the third scan line of each line is selected in order, and the transistor Tr5 is turned ON. Since the first scan line and second scan line are not selected, the transistors Tr3 and Tr4 are OFF.

Figure 29B:
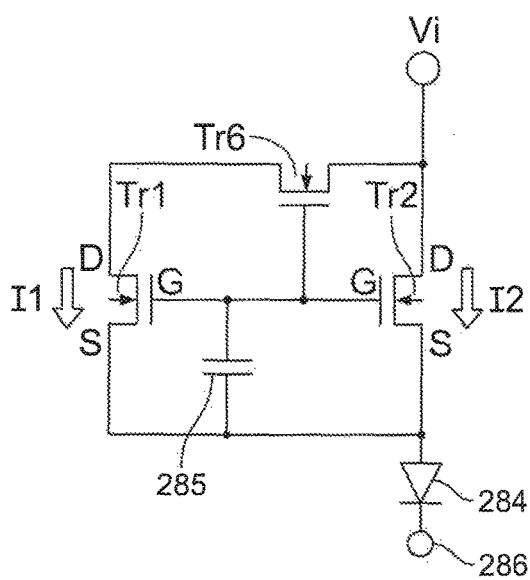

FIG. 29B shows a schematic diagram of the pixel during the display period Td. The transistor Tr3 and the transistor Tr4 are in a state of OFF. Further, the sources of the transistor Tr1 and the transistor Tr2 are connected to the pixel electrode of the light emitting element 284.

On the other hand, in the transistors Tr1 and Tr2, the $V_{GS}$, which has been determined in the write period Ta, is held as it is. The $V_{GS}$ is higher than the voltage in which threshold $V_{TH}$ of Tr1 and threshold $V_{TH}$ of Tr6 are added. Further, the gate of the transistor Tr6 is connected to the gates of the transistors Tr1 and Tr2. Accordingly, the drain current of the transistor Tr1 and the drain current of the transistor Tr6 are held at the same magnitude. And as demonstrated by Expression 1, the drain current of the transistor Tr1 depends on the channel length and the channel width of the transistor Tr6.

As described above, assuming that the gate voltage, the mobility, the gate capacitance per unit area, the threshold and the channel width are the same between the transistor Tr1 and Tr6, Expression 2 is resulted in from Expression 1.

On the other hand, the value of the drain current $I_2$ of the transistor Tr2 is held at the magnitude corresponding to the signal current Ic.

And since the transistor Tr5 is ON, both of the drain current $I_1$ of the transistor Tr1 and Tr6 and the drain current $I_2$ of the transistor Tr2 flow to the light emitting element 284. Accordingly, the light emitting element 284 emits light at the luminance corresponding to the magnitude of the current that drain current $I_1$ and $I_2$ are combined.

Immediately after the write period Ta, always the display period Td appears. Immediately after the display period Td, the next write period Ta or the inverted bias period Ti appears.

When the inverted bias period starts, the voltage of the power supply lines V1-$V_x$ is held at a level that the voltage of inverted bias is impressed to the light emitting element when the transistor Tr2 is turned ON. That is to say, when Tr1, Tr2 and Tr6 are of the n-channel type TFT and the anode of the light emitting element 284 is used as the pixel electrode, the voltage of the power supply line Vi is set so as to be lower than that of the counter electrode. To the contrary, when Tr1, Tr2 and Tr6 are of the p-channel type TFT and the cathode of the light emitting element 284 is used as the pixel electrode, the voltage of the power supply line Vi is set so as to be higher than that of the counter electrode.

Figure 29C:
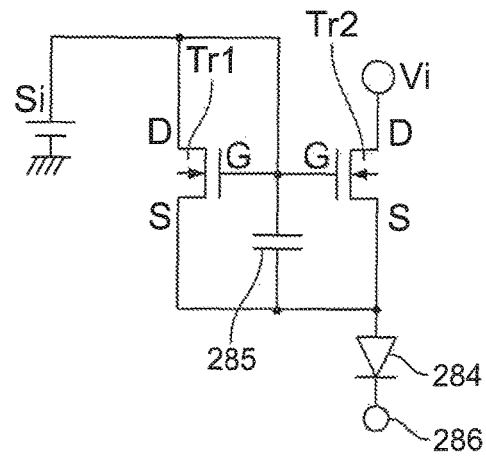

The first and second scan lines of each line are selected in order by the scan line drive circuit 103 and the transistors Tr3 and Tr4 are turned ON. And a voltage of a level that the transistors Tr1, Tr2 and Tr6 are turned ON is impressed to each of the signal lines S1-Sx by the signal line drive circuit 102. Any case whether the third scan line is selected or not is acceptable. FIG. 29C shows a case that the third scan line is not selected, and Tr5 is OFF.

FIG. 29C shows a schematic diagram of the pixel 101 during the inverted bias period Ti. During the inverted bias period Ti, since Tr2 is turned ON, a voltage of inverted bias is impressed to the light emitting element 284. And the light emitting element 284 gets into a state that the same does not emit light when the voltage of inverted bias is impressed.

It is acceptable if the voltage of the power supply line is at a level that a voltage of inverted bias is impressed to the light emitting element when the transistor Tr2 is turned ON. Also, it is possible for a designer to determine the length of the inverted bias period Ti appropriately while taking the relationship with the duty ratio (a ratio of the sum of the length of display period during one frame period) into consideration.

Since the light emitting element 284 emits light at the luminance corresponding to the magnitude of the current that flows to the light emitting element, the tone of each pixel depends on the magnitude of the current that flows to the light emitting element during the display period Td.

In the pixel according to the example, the current that flows to light emitting element during the display period is the sum of the drain current $I_2$ and the drain current $I_3$. Accordingly, the current that flows to the light emitting element does not depend on the drain current $I_2$ only. Therefore, even when the characteristics of the transistor Tr1 and the transistor Tr2 get different from each other, and a difference of the ratio of the drain current $I_2$ of the transistor Tr2 with respect to the signal current Ic is resulted in among the pixels, it is possible to prevent the value of the current that flows to light emitting element from getting different among the pixels. As a result, it is possible to prevent the fluctuation of the luminance being recognized visually.

Further, in the pixel according to the example, during the write period Ta, the drain current of the transistor Tr1 does not flow to the light emitting element. Accordingly, the time, from a point when a current is supplied to the pixel by the signal line drive circuit, and drain current of transistor Tr1 flows and the gate voltage begins to change to a point when the value of the voltage gets stable, does not depend on the capacity of the light emitting element. Therefore, since the voltage converted from a supplied current gets stable swiftly, it is possible to shorten the time for writing the current. As a result it is possible to prevent an afterimage from being recognized visually during motion picture display.

Furthermore, compared to the pixels shown in FIG. 2, FIG. 14, FIG. 16, FIG. 18, FIG. 20, FIG. 22 and FIG. 26, in the pixel according to the example, since the drain current of Tr1 during display period is smaller than the drain current of the transistor Tr1 during the write period, the ratio of the current that flows to the light emitting element with respect to the signal current Ic becomes smaller. Accordingly, since it is possible to make the signal current Ic larger, it is hardly subjected to the influence of noise.

In this example, one of the first terminal and the second terminal of the transistor Tr4 is connected to the second terminal of the transistor Tr1 and another one thereof is connected to the gate of the transistor Tr1 and the gate of the transistor Tr2. However, this example is not limited to this configuration. In this example, as for the pixel, it is acceptable if the transistor Tr4 is connected to another element or wiring so that the gate and the drain of the transistor Tr1 are connected to each other during the write period Ta, and the gate and the drain of the transistor Tr1 are separated from each other during the display period.

Further, in this example, one of the first terminal and the second terminal of the transistor Tr5 is connected to the second terminal of the transistor Tr2 and another one thereof is connected to the second terminal of Tr2. However, this example is not limited to this configuration. In this example, as for the pixel, it is acceptable if the transistor Tr5 is connected to another element or wiring so that the drain of the transistor Tr1 and the pixel electrode are separated from each other during the write period Ta, and the drain of the transistor Tr1 and the pixel electrode are connected to each other during the display period.

That is to say, it is acceptable if Tr3, Tr4, Tr5 and Ta6 are connected as shown in FIG. 29A during Ta; during Td, they are connected as shown in FIG. 29B; and during Ti, they are connected as shown in FIG. 29C. Also, although Gj, Pj and Rj are given with three separated wirings, they may be integrated into one or two wirings.

That is to say, it is acceptable if all of the current that flows through the Tr1 flows to the current source, and all of the current that flows through the current source flows to the Tr1 during the Ta. And during the Td, it is acceptable if the current that flows through the Tr1 and Tr2 flows to the light emitting element.

The light emitting device according to the example is capable of performing display using any of digital video signal and analog video signal.

This example may be implemented in combination with the examples 1-6.

Example 15

The configuration of a pixel of a light emitting device according to still another example of the invention, which is different from those shown in FIG. 2, FIG. 14, FIG. 16, FIG. 18, FIG. 20, FIG. 22, FIG. 24, FIG. 26 and FIG. 28 will be described.

Figure 30:
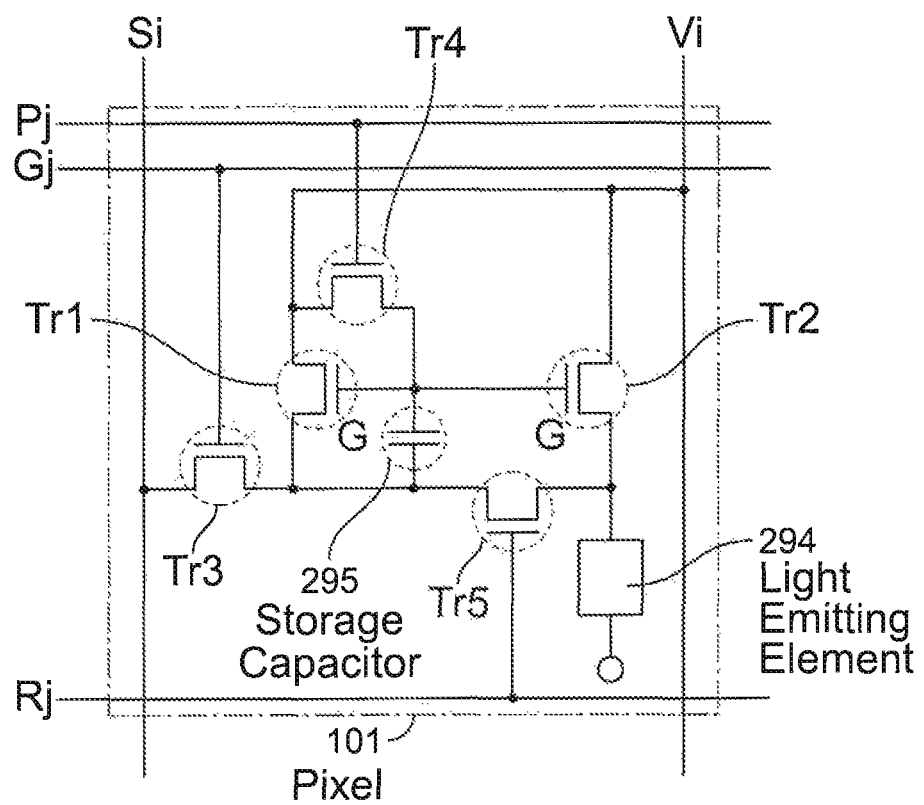
FIG. 30 is a circuit diagram of a pixel of the light emitting device according to the invention.

FIG. 30 shows a detailed configuration of the pixel 101 shown in FIG. 1. The pixel 101 shown in FIG. 30 has a signal line Si (one of the S1-Sx), a first scan line Gj (one of the G1-Gy), a second scan line Pj (one of the P1-Py), a third scan line Rj (one of the R1-Ry) and a power supply line Vi (one of the V1-V$_x$).

Further, the pixel 101 has transistors Tr1, Tr2, Tr3, Tr4 and Tr5, a light emitting element 294 and a storage capacitor 295. The storage capacitor 295 is provided in order to maintain the voltage (gate voltage) between the gate and the source of the transistor Tr1 and Tr2 with a higher reliability, but it is not always necessary to provide the same.

A gate of the transistor Tr3 is connected to the first scan line Gj. One of a first terminal and a second terminal of the transistor Tr3 is connected to the signal line Si, and another one thereof is connected to a second terminal of the transistor Tr1.

A gate of the transistor Tr4 is connected to the second scan line Pj. One of a first terminal and a second terminal of the transistor Tr4 is connected to the second terminal of the transistor Tr1, and another one thereof is connected to the gates of the transistors Tr1 and Tr2.

A gate of the transistor Tr5 is connected to the third scan line Rj. One of a first terminal and a second terminal of the transistor Tr5 is connected to the first terminal of the transistor Tr2 and a pixel electrode of a light emitting element 294, and another one thereof is connected to the first terminal of the transistor Tr1.

The gates of the transistor Tr1 and the transistor Tr2 are connected to each other. The first terminal of the transistor Tr2 is connected to a pixel electrode of a light emitting element 294. Both of the second terminals of the transistor Tr1 and the transistor Tr2 are connected to the power supply line Vi. An counter electrode is held at a predetermined voltage.

One of the two electrodes included in a storage capacitor 295 is connected to the gates of the transistors Tr1 and Tr2, and another one thereof is connected to a pixel electrode of a light emitting element 294.

The transistors Tr1 and Tr2 may be any of an n-channel transistor and a p-channel transistor. However, the polarity of the transistors Tr1 and Tr2 are the same. When the anode is used as the pixel electrode and the cathode is used as the counter electrode, it is preferred that the transistors Tr1 and Tr2 are the n-channel transistors. To the contrary, when the anode is used as the counter electrode and the cathode is used as the pixel electrode, it is preferred that the transistors Tr1 and Tr2 are the p-channel transistors.

The transistors Tr3, Tr4 and Tr5 may be any of the n-channel transistor and the p-channel transistor.

Next, referring to FIG. 31, the operation of the light emitting device according to the example will be described. The operation of the light emitting device according to the invention will be described being separated into a write period Ta, a display period Td and a inverted bias period Ti on the basis of each pixel of the respective lines. FIG. 31 is a diagram briefly showing the connections of the transistor Tr1, Tr2 and the light emitting element 294 during the respective periods. Herein, the case that the Tr1 and Tr2 are of the n-channel type TFT, and the anode of the light emitting element 294 is used as the pixel electrode is given as an example.

First, when the write period Ta starts at a pixel of each line, the voltage of the power supply lines V1-V$_x$ is held at a level so that the current of the forward bias flows to the light emitting element when the transistors Tr1 and Tr2 are turned ON. That is to say, when the Tr1 and Tr2 are of the n-channel type TFT and the anode of the light emitting element 294 is used as the pixel electrode, the voltage of the power supply line Vi is set to be higher than that of the counter electrode. To the contrary, when the Tr1 and Tr2 are of the p-channel type TFT and the cathode of the light emitting element 294 is used as the pixel electrode, the voltage of the power supply line Vi is set to be lower than that of the counter electrode.

The first scan line and the second scan line of each line are selected in order by a scan line drive circuit 103, and the transistors Tr3 and Tr4 are turned ON. The selected periods of each scan line do not overlap with each other. Since the third scan line is not selected, the transistor Tr5 is OFF.

Based on video signal, which is input to a signal line drive circuit 102, signal current Ic corresponding to the video signal respectively flows between the signal lines S1-Sx and the power supply lines V1-V$_x$.

Figure 31A:
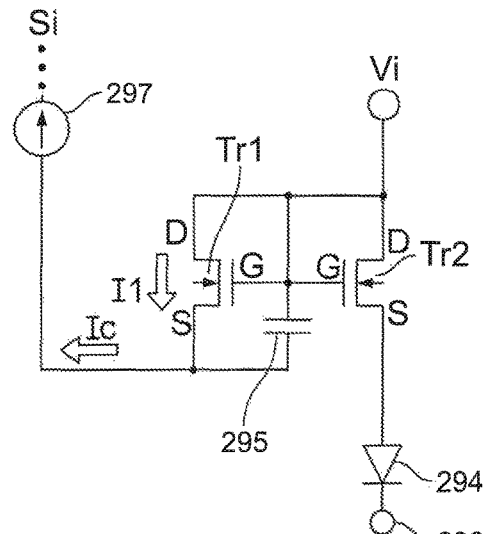
FIGS. 31A to 31C are schematic diagrams of the pixel being operation.

FIG. 31A shows a schematic diagram of the pixel 101 when the signal current Ic corresponding to the video signal flows to the signal line Si during the write period Ta. Reference numeral 296 denotes a terminal for connecting to a power supply that provides a voltage to the counter electrode. Reference numeral 297 denotes a constant current source included in the signal line drive circuit 102.

Since the transistor Tr3 is ON, when the signal current Ic flows to the signal line Si, the signal current Ic flows between a drain and the source of the transistor Tr1. At this time, since the gate and the drain are connected, the transistor Tr1 operates in a saturated zone and Expression 1 is satisfied. Accordingly, gate voltage V$_{GS}$ of the transistor Tr1 is determined depending on the current value Ic. And the gate of the transistor Tr2 is connected to the gate of the transistor Tr1.

When the write period Ta completes, the selection of the first scan line and the second scan line complete. At this time, it is preferred that the selection of the second scan line completes prior to the selection of the first scan line. This is because, if the transistor Tr3 turns OFF earlier, the electric charge of the storage capacitor 295 leaks through the Tr4.

When the write period Ta has completed, the display period Td starts. The voltage of the power supply line Vi during the display period Td is held at the same level as the voltage during the write period Ta. When the display period Td starts, the third scan line is selected, and the transistor Tr5 is turned ON. Since the first scan line and second scan line are not selected, the transistors Tr3 and Tr4 are OFF.

Figure 31B:
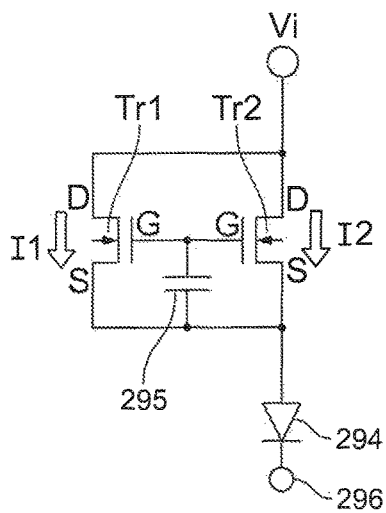

FIG. 31B shows a schematic diagram of the pixel during the display period Td. The transistor Tr3 and the transistor Tr4 are in a state of OFF. Further, the drains of the transistor Tr1 and the transistor Tr2 are connected to the pixel electrode of the light emitting element 294.

On the other hand, in the transistors Tr1 and Tr2, the V$_{GS}$, which has been determined in the write period Ta, is held as it is. And the gate of the transistor Tr2 is connected to the gate of the transistor Tr1. Also, the source of the transistor Tr2 is connected to the source of the transistor Tr1. Accordingly, the gate voltage of the transistor Tr1 becomes the gate voltage of the transistor Tr2 as it is. Further, since the drain of the transistor Tr1 and the drain of the transistor Tr2 is connected to the power supply line Vi, the drain current I$_1$ of the transistor Tr2 has a magnitude proportional to the drain current I$_1$ of the transistor Tr1. Particularly, when $\mu C_0 W/L$ and V$_{TH}$ are equal to each other, the drain currents of the transistor Tr1 and the transistor Tr2 become equal to each other resulting in I$_2$=I$_1$=Ic.

Further, since the transistor Tr5 is ON, the drain current I$_1$ of the transistor Tr1 and the drain current I$_2$ of the transistor Tr2 flow to the light emitting element 294 as the current that both of them flow to the light emitting element. Accordingly, during the display period Td, a current of a magnitude that the drain current $I_1$ and the drain current $I_2$ are combined flows to the light emitting element 294, and the light emitting element 294 emits light at the luminance corresponding to the magnitude of the current that flows to the light emitting element.

Immediately after the write period Ta, always the display period Td appears. Immediately after the display period Td, the next write-period Ta or the inverted bias period Ti appears.

When the inverted bias period starts, the voltage of the power supply lines V1-V$_x$ is held at a level that the voltage of inverted bias is impressed to the light emitting element when the transistor Tr2 is turned ON. That is to say, when Tr1 and Tr2 are of the n-channel type TFT and the anode of the light emitting element 294 is used as the pixel electrode, the voltage of the power supply line Vi is set so as to be lower than that of the counter electrode. To the contrary, when Tr1 and Tr2 are of the p-channel type TFT and the cathode of the light emitting element 294 is used as the pixel electrode, the voltage of the power supply line Vi is set so as to be higher than that of the counter electrode.

Figure 31C:
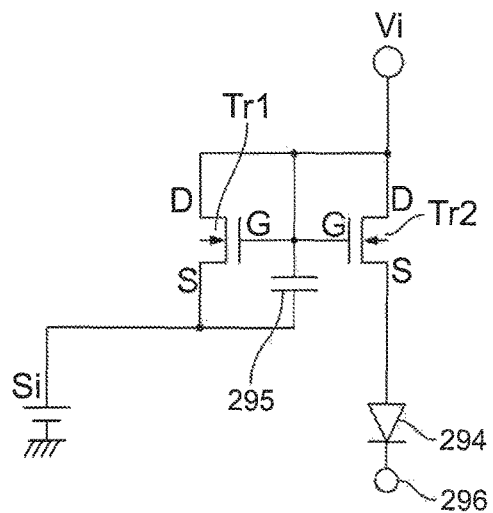

The first and second scan lines of each line are selected in order by the scan line drive circuit 103 and the transistors Tr3 and Tr4 are turned ON. And a voltage of a level that the transistors Tr1 and Tr2 are turned ON is impressed to each of the signal lines S1-Sx by the signal line drive circuit 102. Any case whether the third scan line is selected or not is acceptable. FIG. 31C shows a case that the third scan line is not selected, and Tr5 is OFF.

FIG. 31C shows a schematic diagram of the pixel 101 during the inverted bias period Ti. During the inverted bias period Ti, since Tr1 and Tr2 are turned ON, a voltage of inverted bias is impressed to the light emitting element 294. And the light emitting element 294 gets into a state that the same does not emit light when the voltage of inverted bias is impressed.

In the pixel shown in FIG. 30, during the inverted bias period Ti, since the gate and the source of Tr2 are connected to each other and the voltage Vi of the power supply line is lower than the voltage of the counter electrode, Tr2 is in a state of OFF, and the voltages at the source and the drain of Tr2 are not the same. Accordingly, the voltage of the inverted bias impressed to the light emitting element 294 is not the same as the voltage difference between the power supply line Vi and the counter electrode, but it becomes a value which is the voltage difference between the counter electrode and the power supply line Vi subtracted by $V_{DS}$ of Tr2. However, since it is possible to impress the voltage of inverted bias to the light emitting element 294 reliably, it is possible to prevent the luminance from decreasing due to the deterioration of the light emitting element.

Also, it is possible for a designer to determine the length of the inverted bias period Ti appropriately while taking the relationship with the duty ratio (a ratio of the sum of the length of display period during one frame period) into consideration.

Since the light emitting element 294 emits light at the luminance corresponding to the magnitude of the current that flows to the light emitting element, the tone of each pixel depends on the magnitude of the current that flows to the light emitting element during the display period Td. During the write period Ta also, although the light emitting element emits light at the luminance corresponding to the magnitude of the drain current of Tr2, it can be assumed that the influence thereof on the tone of the actual panel is extremely small to an extent that it can be neglected. For example, in the case of VGA, since the pixel section is provided with pixels of 480 lines, the write period Ta for the pixels of one line is extremely small as approximately 1/480 of one frame period.

In the pixel according to the example, the current that flows to light emitting element during the display period is the sum of the drain current $I_1$ and the drain current $I_2$. Accordingly, the current that flows to the light emitting element does not depend on the drain current $I_2$ only. Therefore, even when the characteristics of the transistor Tr1 and the transistor Tr2 get different from each other, and a difference of the ratio of the drain current $I_2$ of the transistor Tr2 with respect to the signal current Ic is resulted in among the pixels, it is possible to prevent the value of the current that flows to light emitting element from getting different among the pixels. As a result, it is possible to prevent the fluctuation of the luminance being recognized visually.

Further, in the pixel according to the example, during the write period Ta, the drain current of the transistor Tr1 does not flow to the light emitting element. Accordingly, the time, from a point when a current is supplied to the pixel by the signal line drive circuit, and drain current of transistor Tr1 flows and the gate voltage begins to change to a point when the value of the voltage gets stable, does not depend on the capacity of the light emitting element. Therefore, since the voltage converted from a supplied current gets stable swiftly, it is possible to shorten the time for writing the current. As a result, it is possible to prevent an afterimage from being recognized visually during motion picture display.

In this example, one of the first terminal and the second terminal of the transistor Tr4 is connected to the second terminal of the transistor Tr1 and another one thereof is connected to the gate of the transistor Tr1 and the gate of the transistor Tr2. However, this example is not limited to this configuration. In this example, as for the pixel, it is acceptable if the transistor Tr4 is connected to another element or wiring so that the gate and the drain of the transistor Tr1 are connected to each other during the write period Ta, and the gate and the drain of the transistor Tr1 are separated from each other during the display period.

Further, in this example, one of the first terminal and the second terminal of the transistor Tr5 is connected to the first terminal of the transistor Tr2 and another one thereof is connected to the first terminal of Tr1. However, this example is not limited to this configuration. In this example, as for the pixel, it is acceptable if the transistor Tr5 is connected to another element or wiring so that the source of the transistor Tr1 and the pixel electrode are separated from each other during the write period Ta, and the source of the transistor Tr1 and the pixel electrode are connected to each other during the display period.

That is to say, it is acceptable if Tr3, Tr4 and Tr5 are connected as shown in FIG. 31A during Ta; during Td, they are connected as shown in FIG. 31B; and during Ti, they are connected as shown in FIG. 31C. Also, although Gj, Pj and Rj are given with three separated wirings, they may be integrated into one or two wirings.

That is to say, it is acceptable if all of the current that flows through the Tr1 flows to the current source, and all of the current that flows through the current source flows to the Tr1 during the Ta. And during the Td, it is acceptable if the current that flows through the Tr1 and Tr2 flows to the light emitting element.

The light emitting device according to the example is capable of performing display using any of digital video signal and analog video signal.

This example may be implemented in combination with the examples 1-6.

Example 16

In this example, an external light emitting quantum efficiency can be remarkably improved by using an organic light emitting material by which phosphorescence from a triplet excitation can be employed for emitting a light. As a result, the power consumption of light emitting element can be reduced, the lifetime of light emitting element can be elongated and the weight of light emitting element can be lightened.

The following is a report where the external light emitting quantum efficiency is improved by using the triplet excitation (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

(Chemical formula 1)

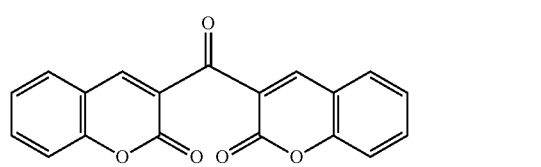

(M. A. Baldo. D. F. O' Brien, Y. You, A. Shoustikov, S. Sibley, M. E. Thompson, S. R. Forrest, Nature 395 (1998) p.151)

The molecular formula of an organic light emitting material (Pt complex) reported by the above article is represented as follows.

(Chemical formula 2)

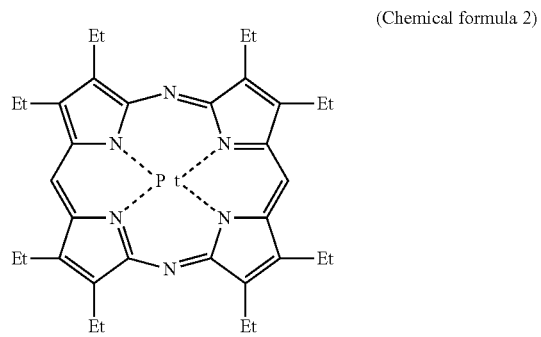

(M. A. Baldo, S. Lamansky. P. E. Burrows, M. E. Thompson. S. R. Forrest, Appl. Phys. Lett., 75 (1999) p.4.)

(T.Tsutsui, M.-J.Yang, M. Yahiro, K. Nakamura, T.Watanabe. T. Tsuji. Y. Fukuda, T. Wakimoto, S. Mayaguchi, Jpn. Appl. Phys., 38 (12B) (1999) L1502)

The molecular formula of an organic light emitting material (Ir complex) reported by the above article is represented as follows.

(Chemical formula 3)

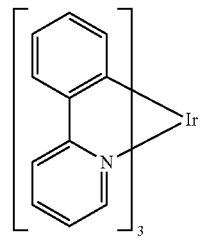

excitation can be put to practical use, it can realize the external light emitting quantum efficiency three to four times as high as that in the case of using fluorescence from a singlet excitation in principle.

The structure according to this example can be freely implemented in combination of any structures of the Examples 1 to 15.

Example 17

Organic light emitting materials used in OLEDs are roughly divided into low molecular weight materials and high molecular weight materials. A light-emitting device of the present invention can employ a low molecular weight organic light emitting material and a high molecular weight organic light emitting material both.

A low molecular weight organic light emitting material is formed into a film by evaporation. This makes it easy to form a laminate structure, and the efficiency is increased by layering films of different functions such as a hole transporting layer and an electron transporting layer.

Examples of low molecular weight organic light emitting material include an aluminum complex having quinolinol as a ligand ($Alq_3$) and a triphenylamine derivative (TPD).

On the other hand, a high molecular weight organic light emitting material is physically stronger than a low molecular weight material and enhances the durability of the element. Furthermore, a high molecular weight material can be formed into a film by application and therefore manufacture of the element is relatively easy.

The structure of a light emitting element using a high molecular weight organic light emitting material is basically the same as the structure of a light emitting element using a low molecular weight organic light emitting material, and has a cathode, an organic light emitting layer, and an anode. When an organic light emitting layer is formed from a high molecular weight organic light emitting material, a two-layer structure is popular among the known ones. This is because it is difficult to form a laminate structure using a high molecular weight material unlike the case of using a low molecular weight organic light emitting material. Specifically, an element using a high molecular weight organic light emitting material has a cathode, a light emitting layer, a hole transporting layer, and an anode. Ca may be employed as the cathode material in a light emitting element using a high molecular weight organic light emitting material.

The color of light emitted from an element is determined by the material of its light emitting layer. Therefore, a light emitting element that emits light of desired color can be formed by choosing an appropriate material. The high molecular weight organic light emitting material that can be used to form a light emitting layer is a polyparaphenylene vinylene-based material, a polyparaphenylene-based material, a polythiophen-based material, or a polyfluorene-based material.

The polyparaphenylene vinylene-based material is a derivative of poly(paraphenylene vinylene) (denoted by PPV), for example, poly(2, 5-dialkoxy-1, 4-phenylene vinylene) (denoted by RO-PPV), poly(2-(2'-ethyl-hexoxy)-5-metoxy-1, 4-phenylene vinylene) (denoted by MEH-PPV), and poly(2-(dialkoxyphenyl)-1, 4-phenylene vinylene) (denoted by ROPh-PPV).

The polyparaphenylene-based material is a derivative of polyparaphenylene (denoted by PPP), for example, poly(2, 5-dialkoxy-1, 4-phenylene) (denoted by RO-PPP) and poly (2, 5-dihexoxy-1, 4-phenylene).

The polythiophene-based material is a derivative of polythiophene (denoted by PT), for example, poly(3-alkylthiophene) (denoted by PAT), poly(3-hexylthiophene) (denoted by PHT), poly(3-cyclohexylthiophene) (denoted by PCHT), poly(3-cyclohexyl-4-methylthiophene) (denoted by PCHMT), poly(3, 4-dicyclohexylthiophene) (denoted by PDCHT), poly[3-(4-octylphenyl)-thiophene] (denoted by POPT), and poly[3-(4-octylphenyl)-2, 2 bithiophene] (denoted by PTOPT).

The polyfluorene-based material is a derivative of polyfluorene (denoted by PF), for example, poly(9, 9-dialkylfluOrene) (denoted by PDAF) and poly(9, 9-dioctylfluorene) (denoted by PDOF).

If a layer that is formed of a high molecular weight organic light emitting material capable of transporting holes is sandwiched between an anode and a high molecular weight organic light emitting material layer that emits light, injection of holes from the anode is improved. This hole transporting material is generally dissolved into water together with an acceptor material, and the solution is applied by spin coating or the like. Since the hole transporting material is insoluble in an organic solvent, the film thereof can form a laminate with the above-mentioned organic light emitting material layer that emits light.

The high molecular weight organic light emitting material capable of transporting holes is obtained by mixing PEDOT with camphor sulfonic acid (denoted by CSA) that serves as the acceptor material. A mixture of polyaniline (denoted by PANI) and polystyrene sulfonic acid (denoted by PSS) that serves as the acceptor material may also be used.

The structure of this example may be freely combined with any of the structures of Examples 1 through 16.

Example 18

An example of a production method for a light emitting device according to the present invention will be explained with reference to FIGS. 32 to 35. Here, a method for simultaneously producing the pixel transistor Tr2 and the pixel transistor Tr4 shown in FIG. 2 and the TFT of the driving part provided in the periphery of the pixel part will be explained in detail in according to the steps as the representative. The transistor Tr1 and the transistor Tr3 can also be produced according to the production method for the transistor Tr2 and the transistor Tr4.

First, in this example, a substrate 900 made of a glass, such as a barium borosilicate glass, and an alumino borosilicate glass represented by #7059 glass and #1737 glass of Corning Incorporated, was used. As the substrate 900, any substrate having a light transmittivity can be used so that a quarts substrate may be used as well. Moreover, a plastic substrate having a heat resistance durable in a process temperature of this example can be used as well.

Figure 32A:
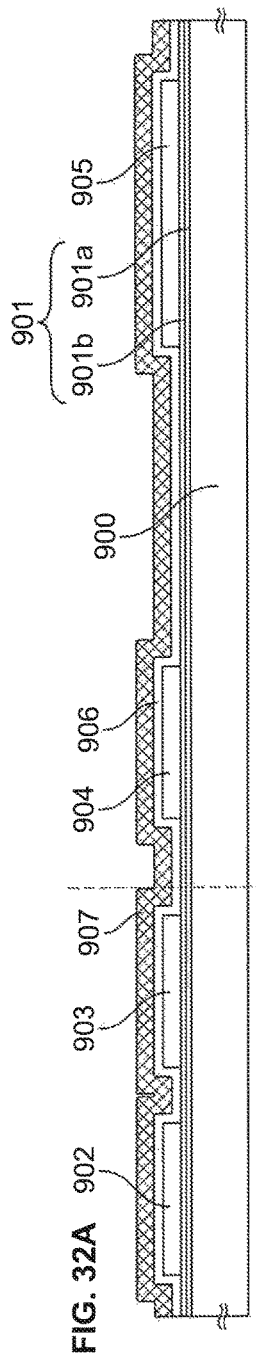
FIGS. 32A to 32D are views showing a manufacturing method of the light emitting device according to the invention.

Next, as shown in FIG. 32A, a base film 901 comprising an insulated film, such as a silicon oxide film, a silicon nitride film, and a silicon nitride oxide film was formed on the substrate 900. Although a two layer structure was employed as the base film 901 in this example, a single layer film of the above-mentioned insulated film, or a structure with two or more layers laminated can be used as well. As the first layer of the base film 901, a silicon nitride oxide film 901a produced by a plasma CVD method using an $SiH_4$, an $NH_3$, and an $N_2O$ as the reaction gas; was formed by 10 to 200 nm (preferably 50 to 100 nm). In this example, the silicon nitride oxide film 901a of a 50 nm film thickness (structure ratio Si=32%, O=27%, N=24%, H=17%) was formed. Next, as the second layer of the base film 901, a silicon nitride oxide film 901b produced by a plasma CVD method using an $SiH_4$, and an $N_2O$ as the reaction gas, was formed by 50 to 200 nm (preferably 100 to 150 nm). In this example, the silicon nitride oxide film 901b of a 100 nm film thickness (structure ratio Si=32%, O=59%, N=7%, H=2%) was formed.

Next, semiconductor layers 902 to 905 were formed on the base film 901. The semiconductor layers 902 to 905 were formed by patterning into a desired shape a crystalline semiconductor film obtained by producing a semiconductor film having an amorphous structure by a known means (a sputtering method, an LPCVD method, a plasma CVD method, or the like), and executing a known crystallization process (a laser crystallization method, a thermal crystallization method, a thermal crystallization method using a catalyst such as a nickel). The semiconductor layers 902 to 905 are formed by a 25 to 80 nm (preferably 30 to 60 nm) thickness. The material for the crystalline semiconductor films is not particularly limited, but it is formed preferably with a silicon or a silicon germanium ($Si_xGe_{1-x}$ (X=0.0001 to 0.02)) alloy. In this example, after forming a 55 nm amorphous silicon film using the plasma CVD method, a solution containing a nickel is maintained on the amorphous silicon film. After executing dehydration (500° C. 1 hour) to the amorphous silicon film, a thermal crystallization (550° C., 4 hours) was executed, and further, a laser annealing process for improving the crystallization was executed for forming a crystalline silicon film. According to a patterning process of the crystalline silicon film using a photolithography method, the semiconductor layers 902 to 905 were formed.

Moreover, it is also possible to dope a slight amount of an impurity element (boron or phosphorus) to the semiconductor layers 902 to 905 after formation of the semiconductor layers 902 to 905 for controlling the threshold value of the TFT.

Moreover, in the case of producing a crystalline semiconductor film by the laser crystallization method, a pulse oscillation type or continuous light emitting type excimer laser, an YAG laser, or an $YVO_4$ laser are used. In the case of using these lasers, it is preferable to use a method of linearly collecting a laser beam outputted from a laser oscillator by an optical system and directing the same to the semiconductor films. The crystallization condition can be selected optionally by the operator, and in the case of using an excimer laser, the pulse oscillation frequency was set at 300 Hz, and the laser energy density was set at 100 to 400 $mJ/cm^2$ (as the representative, 200 to 300 $mJ/cm^2$). Furthermore, in the case of using an YAG laser, it is preferable to set the pulse oscillation frequency using the second harmonic at 30 to 300 kHz, and the laser energy density at 300 to 600 $mJ/cm^2$ (as the representative, 350 to 500 $mJ/cm^2$). Furthermore, it is preferable to direct a laser beam collected linearly in a 100 to 1.000 μm width, for example, 400 μm to the substrate entire surface, with an overlapping ratio of the linear laser beam at 50 to 90%.

Note that, a gas laser or solid state laser of continuous oscillation type or pulse oscillation type can be used. The gas laser such as an excimer laser, Ar laser, Kr laser and the solid state laser such as YAG laser, $YVO_4$ laser, YLF laser, $YAlO_3$ laser, glass laser, ruby laser, alexandrite laser, Ti: sapphire laser can be used as the laser beam. Also, crystals such as YAG laser, $YVO_4$ laser, YLF laser, $YAlO_3$ laser wherein Cr, Nd, Er, Ho, Ce, Co, Ti or Tm is doped can be used as the solid state laser. A basic wave of the lasers is different depending on the materials of doping, therefore a laser beam having a basic wave of approximately 1 μm is obtained. A harmonic corresponding to the basic wave can be obtained by the using non-linear optical elements.

Further, after an infrared laser light emitted from the solid state laser changes to a green laser light by a non linear optical element, an ultraviolet laser light obtained by another non linear optical element can be used.

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (532 nm) or the third harmonic (355 nm) of an $Nd:YVO_4$ laser (basic wave of 1064 nm) is applied. Specifically, laser beams emitted from the continuous oscillation type $YVO_4$ laser with 10 W output is converted into a harmonic by using the non-linear optical elements. Also, there is a method of emitting a harmonic by applying crystal of $YVO_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 $MW/cm^2$ (preferably 01. to 10 $MW/cm^2$) is required. The semiconductor film is moved at approximately 10 to 2000 cm/s rate relatively corresponding to the laser beams so as to irradiate the semiconductor film.

Next, a gate insulated film 906 for covering the semiconductor layers 902 to 905 was formed. The gate insulated film 906 was formed with an insulated film containing a silicon by a 40 to 150 nm thickness using the plasma CVD method or the sputtering method. In this example, a silicon nitride oxide film (structure ratio Si=32%, O=59%, N=7%, H=2%) was formed by a 110 nm thickness by the plasma CVD method. Of course the gate insulated film is not limited to the silicon nitride oxide film, and a single layer or a laminated structure of another insulated film containing silicon can be adopted as well.

Moreover, in the case a silicon oxide film is used, it can be used by mixing a TEOS (tetraethyl orthosilicate) and an $O_2$ by the plasma CVD method, and executing electric discharge with a 40 Pa reaction pressure, a 300 to 400° C. substrate temperature, and a 0.5 to 0.8 $W/cm^2$ high frequency (13.56 MHz) power density. According to the silicon oxide film accordingly produced, good characteristics as a gate insulated film can be obtained by thermal annealing at 400 to 500° C. thereafter.

Then, a heat resistant conductive layer 907 for forming a gate electrode on the gate insulated film 906 was formed by a 200 to 400 nm (preferably 250 to 350 nm) thickness. The heat resistant conductive layer 907 can be formed in a single layer or as needed as a laminated structure comprising a plurality of layers such as two layers and three layers. The heat resistant conductive layer contains an element selected from the group consisting of a Ta, a Ti, and a W, an alloy containing the elements as a component, or an alloy film as a combination of the elements. The heat resistant conductive layer is formed by a sputtering method or a CVD method. In order to achieve a low resistance, it is preferable to reduce the concentration of a contained impurity. In particular, it is preferable to have the oxygen concentration of 30 ppm or less. In this example, the W film was formed by a 300 nm thickness. The W film can be formed by a sputtering method with a W used as a target, or it can be formed also by a thermal CVD method using a tungsten hexafluoride ($WF_6$). In either case, in order to use as a gate electrode, a low resistance should be achieved, and it is preferable to have the W film resistivity at 20 μΩcm or less. Although a low resistivity can be achieved in the W film by enlarging the crystal grains, in the case a large amount of an impurity element such as an oxygen is contained in the W, che crystallization is prohibited so as to have a high resistivity. Thereby, in the case of the sputtering method, by forming the W film using a W target of a 99.9999% purity with sufficient attention paid for avoiding inclusion of impurities from the gas phase at the time of film formation, a 9 to 20 μΩcm resistivity can be realized.

In contrast, in the case a Ta film is used for the heat resistant conductive layer 907, similarly, it can be formed by the sputtering method. For the Ta film, an Ar is used as the sputtering gas. Moreover, by adding an appropriate amount of a Xe or a Kr in the gas at the time of sputtering, peel off of the film can be prevented by alleviating the internal stress of the film to be formed. The resistivity of the Ta film of a α phase is about 20 μΩcm so that it can be used as the gate electrode, but the resistivity of the Ta film of a β phase is about 180 μΩcm so that it cannot be suitable for the gate electrode. Since a TaN film has a crystal structure close to the α phase, by forming the TaN film as the base for the Ta film, the Ta film of the α phase can be obtained easily. Moreover, although it is not shown in the Figure, it is effective to form a silicon film with a phosphorus (P) doped by about a 2 to 20 nm thickness below the heat resistant conductive layer 907. Thereby, improvement of the close contact property of the conductive film to be formed thereon and oxidation prevention can be achieved as well as diffusion of an alkaline metal element contained in the heat resistant conductive layer 907 by a slight amount to the gate insulated film 906 of the first shape can be prevented. In either case, it is preferable to have the resistivity of the heat resistant conductive layer 907 in a range of 10 to 50μΩcm.

Next, a mask 908 of a resist is formed using the photolithography technique. Then, the first etching process is executed. In this example, it is executed with a plasma formed by using an ICP etching device, a $Cl_2$ and a $CF_4$ as the etching gas, and introducing an RF (13.56 MHz) power of 3.2 $W/cm^2$ by a 1 Pa pressure. By introducing the RF (13.56 MHz) power of 224 $mW/cm^2$ also to the substrate side (specimen stage), a substantially negative self bias voltage is applied. In this condition, the W film etching rate is about 100 nm/min. For the first etching process, the time needed for just etching the W film was estimated based on the etching rate, and the etching time increased by 20% therefrom was set to be the etching time.

Figure 32B:
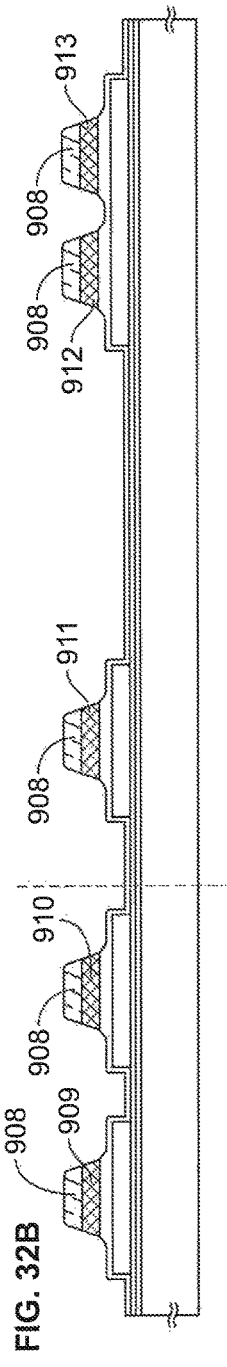

By the first etching process, conductive layers 909 to 913 having the first tapered shape are formed. The conductive layers 909 to 913 were formed with the tapered part angle of 15 to 30°. In order to etch without leaving a residue, an over etching of increasing the etching time by a ratio of about 10 to 20% was applied. Since the selection ratio of the silicon nitride oxide film (gate insulated film 906) with respect to the W film is 2 to 4 (representatively 3), the surface with the silicon nitride oxide film exposed can be etched by about 20 to 50 nm by the over etching process (FIG. 32B).

Figure 32C:
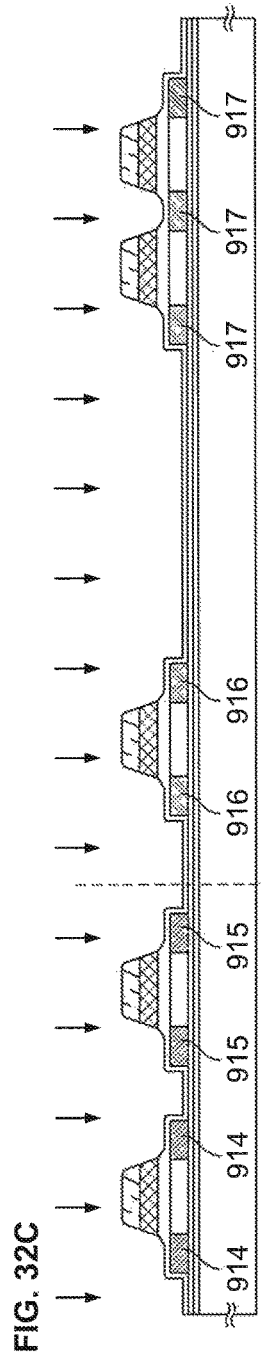

Then, by executing the first doping process, the one conductive type impurity element is added to the semiconductor layer. Here, an impurity element addition step for applying the n type was executed. With the mask 908 with the first shape conductive layer formed left as it is, impurity elements for providing the n type by self aligning were added using the conductive layers 909 to 913 having the first tapered shape by the ion doping method. In order to add the impurity elements for providing the n type reaching to the semiconductor layer through the tapered part at the and part of the gate electrode and the gate insulated film 906 disposed therebelow, the dose amount is set to be $1 \times 10^{13}$ to $5 \times 10^{14}$ atoms/cm², and the acceleration voltage at 80 to 160 keV. As the impurity elements for providing the n type, elements belonging to the 15 group, typically a phosphorus (P) or an arsenic (As) can be used, but here a phosphorus was used. According to the ion doping method, in the first impurity areas 914 to 914, the impurity element for providing the n type was added in a concentration range of $1 \times 10^{20}$ to $1 \times 10^{21}$ atomic/cm³. (FIG. 32C)

In this step, depending on the doping condition, the impurity may be placed below the first shape conductive layers 909 to 913 so that the first impurity areas 914 to 917 can be superimposed on the first shape conductive layers 909 to 913.

Figure 32D:
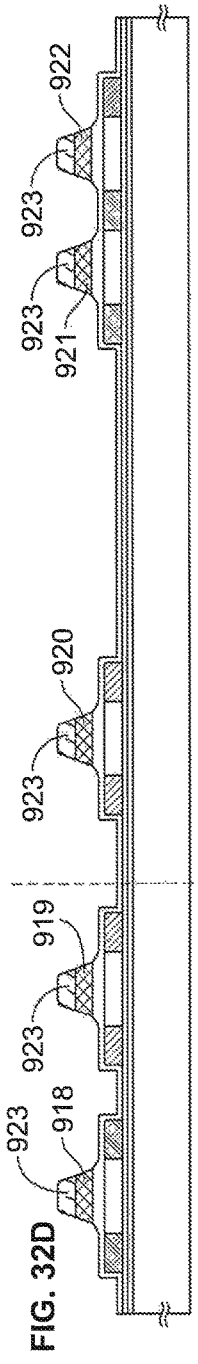

Next, as shown in FIG. 32D, the second etching process is executed. Similarly, the etching process is executed with the ICP etching device using a gas mixture of a $CF_4$ and a $Cl_2$ as the etching gas, a 3.2 W/cm² (13.56 MHz) RPF power, a 45 mW/cm² (13.56 MHz) bias power, and a 1.0 Pa pressure. Thereby, conductive layers 918 to 922 having the second shape formed by the condition can be provided. A tapered part is formed on the end part thereof, with a tapered shape with the thickness increased from the and part to inward. Compared with the first etching process, owing to a lower bias power applied to the substrate side, the ratio of the isotropic etching is increased so that the tapered part angle becomes 30 to 60°. The end part of the mask 908 is cut by etching so as to provide a mask 923. Moreover, in the step of FIG. 32D, the surface of the gate insulated film 906 is etched by about 40 nm.

Figure 33A:
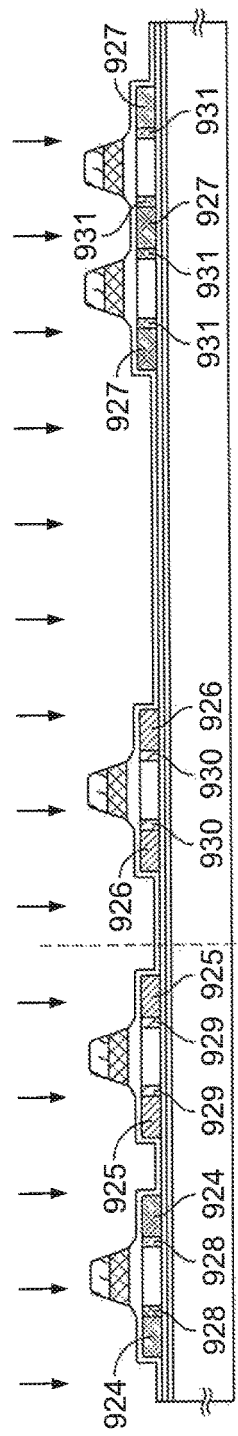
FIGS. 33A to 33C are views showing a manufacturing method of the light emitting device according to the invention.
Figure 33B:
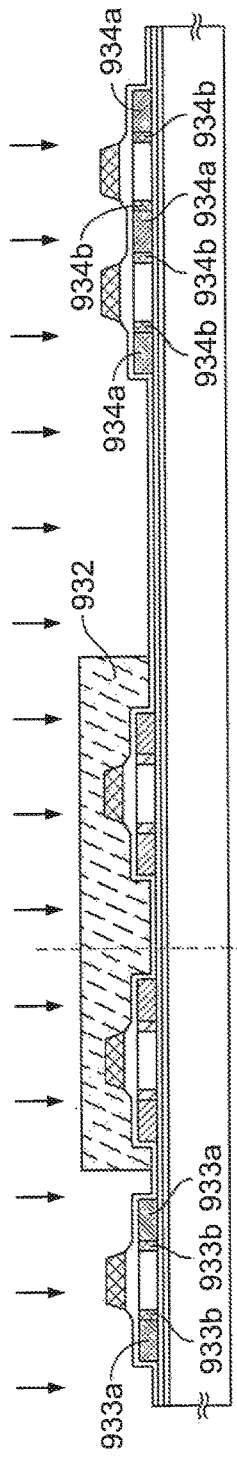

Then, the impurity element for providing the n type is doped with a dose amount smaller than that of the first doping process in a high acceleration voltage condition. For example, the operation is executed with a 70 to 120 KeV acceleration voltage and a $1 \times 10^{13}$/cm² dose amount so as to form the first impurity areas 924 to 927 having a larger impurity concentration and the second impurity areas 928 to 931 in contact with the first impurity areas 924 to 927. In this step, depending on the doping condition, the impurity may be placed below the second shape conductive layers 918 to 922 so that the second impurity areas 928 to 931 can be superimposed on the second shape conductive layers 918 to 922. The impurity concentration in the second impurity area is set to be $1 \times 10^{16}$ to $1 \times 10^{18}$ atoms/cm³. (FIG. 33A)

Then, as shown in (FIG. 33B), impurity areas 933 (933a, 933b) and 934 (934a, 934b) of an opposite conductive type with respect to the one conductive type are formed in the semiconductor layers 902, 905 for forming the p channel type TFT. Also in this case, by adding an impurity element for providing the p type with the second shape conductive layers 918, 921 and 922 used as a mask, an impurity area is formed by self aligning. At the time, the semiconductor layers 903, 904 for forming the n channel type TFT has a resist mask 932 formed so as to cover the entire surface. The impurity areas 933, 934 formed here is formed by the ion doping method using a diborane ($B_2H_6$). The concentration of the impurity element for providing the p type of the impurity areas 933, 934 is set to be $2 \times 10^{20}$ to $2 \times 10^{21}$ atoms/cm³.

However, the impurity areas 933, 934 can be regarded specifically as two areas containing the impurity element for providing the n type. The third impurity-areas 933a, 934a contain the impurity element for providing the n type by a $1 \times 10^{20}$ to $1 \times 10^{21}$ atoms/cm² concentration, and the fourth impurity areas 933b, 934b contain the impurity element for providing the n type by a $1 \times 10^{17}$ to $1 \times 10^{20}$ atoms/cm³ concentration. However, by having the concentration of the impurity element for providing the p type of the impurity areas 933b, 934b at $1 \times 10^{19}$ atoms/cm³ or more, and having the concentration of the impurity element for providing the p type in the impurity areas 933a, 934a by 1.5 to 3 times as much as the concentration of the impurity element for providing the n type, any problem cannot be generated for the function as the source area and the drain area of the p channel type TFT in the third impurity area.

Figure 33C:
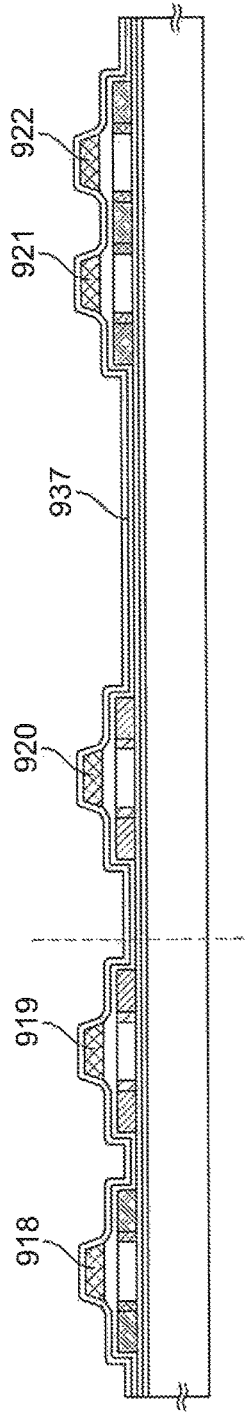

Thereafter, as shown in FIG. 33C, the first interlayer insulated film 937 is formed on the conductive layers 918 to 922 having the second shape and the gate insulated film 906. The first interlayer insulated film 937 can be formed with a silicon oxide film, a silicon nitride oxide film, a silicon nitride film, or a laminated film of a combination thereof. In either case, the first interlayer insulated film 937 is made of an inorganic insulated material. The film thickness of the first interlayer insulated film 937 is set to be 100 to 200 nm. In the case a silicon oxide film is used as the first interlayer insulated film 937, it can be formed by mixing a TEOS and an $O_2$, and executing electric discharge by plasma CVD with a 40 Pa reaction pressure, a 300 to 400° C. substrate temperature, and a 0.5 to 0.8 W/cm high frequency (13.56 MHz) power density. Moreover, in the case a silicon nitride oxide film is used as the first interlayer insulated film 937, a silicon nitride oxide film produced from a $SiH_4$, an $NH_3$, and an $N_2O$, or a silicon nitride oxide film produced from a $SiH_4$, and an $N_2O$ by the plasma CVD method can be used. As the production condition in this case, a 20 to 200 Pa reaction pressure, a 300 to 400° C. substrate temperature, and a 0.1 to 1.0 W/cm² high frequency (60 MHz) power density can be provided. Moreover, as the first interlayer insulated film 937, a hydrogenated silicon nitride oxide film produced from a $SiH_4$, an $N_2O$, and an $H_2$ can be adopted as well. Similarly, a silicon nitride film can be produced from a $SiH_4$, and an $NH_3$ as well.

Then, a process for activating the impurity element for providing the n type or the p type added by each concentration is executed. This step is executed by the thermal annealing method using a furnace annealing furnace. In addition thereto, the laser annealing method, or a rapid thermal annealing method (RTA method) can be adopted as well. The thermal annealing method is executed in a nitrogen atmosphere of 1 ppm or less, preferably 0.1 ppm or less at 400 to 700° C., representatively 500 to 600° C. In this example a heat treatment was executed at 550° C. for 4 hours. Moreover, in the case a plastic substrate having a low heat resistance temperature is used for the substrate 900, it is preferable to adopt the laser annealing method.

When the laser annealing method is employed, the laser used in the crystallization can be used. When activation is performed, the moving speed is set as well as the crystallization processing, and the energy density of about 0.01 to 100 MW/cm² (preferably 0.01 to 10 MW/cm²) is required.

Following the activation step, a step for hydrogenating the semiconductor layer by executing a heat treatment at 300 to 450° C. for 1 to 12 hours with the atmosphere gas changed to an atmosphere containing 3 to 100% of a hydrogen, is executed. This is a step for finishing the end of a dangling bond of $10^{16}$ to $10^{18}/cm^3$ in the semiconductor layer by a thermally excited hydrogen. As another means for the hydrogenation, the plasma hydrogenation (using a hydrogen excited by a plasma) can be executed. In either case, it is preferable to have the defect density in the semiconductor layers 902 to 905 to $10^{16}/cm^3$ or less. Therefore, a hydrogen can be provided by about 0.01 to 0.1 atomic %.

Then, the second interlayer insulated film 939 made of an organic insulated material is formed by a 1.0 to 2.0 μm average thickness. As the organic resin material, a polyimide, an acrylic, a polyamide, a polyimide amide, a BCB (benzocyclo butene), or the like can be used. For example, in the case a polyimide of a type thermally polymerizable after application on the substrate is used, it is formed by baking at 300° C. by a clean oven. Moreover, in the case an acrylic is used, it can be formed by using a two liquid type, mixing a main material and a hardener, applying the same on the substrate entire surface using a spinner, executing a preliminary heating operation at 80° C. for 60 seconds by a hot plate, and further baking at 250° C. for 60 minutes by a clean oven.

By forming the second interlayer insulated film 939 accordingly with an organic insulated material, the surface can be preferably flat. Moreover, since the organic resin material in general has a low dielectric constant, the parasitic capacity can be reduced. However, since it has a moisture absorbing property and thus it is not suitable as a protection film, it can be used preferably in a combination with a silicon oxide film, a silicon nitride oxide film, a silicon nitride film, or the like formed as the first interlayer insulated film 937.

Thereafter, a resist mask of a predetermined pattern is formed, and a contact hole reaching to the source area or the drain area formed in each semiconductor layer is formed. The contact hole is formed by the dry etching method. In this case, first the second interlayer insulated film 939 made of an organic resin material is etched using a gas mixture of a $CF_4$, an $O_2$, and an He as the etching gas, and then subsequently the first interlayer insulated film 937 is etched using a $CF_4$, and $O_2$ as the etching gas. Furthermore, in order to improve the selection ratio with respect to the semiconductor layer, a contact hole can be formed by etching the gate electrode 906 of the third shape with the etching gas changed to a $CHF_3$.

Then, source wirings 940 to 943, 947 and drain wirings 944 to 946 are formed by forming a conductive metal film by the sputtering method or the vacuum deposition method, patterning with a mask, and etching. In this specification, both the source wirings and the drain wirings are referred to as connection wirings. Although it is not shown in the Figure, in this specification, the connection wirings are formed as a laminated film of a Ti film of a 50 nm film thickness, and an alloy film (an alloy film of an Al and a Ti) of a 500 nm film thickness.

Next, a pixel electrode 948 is formed by providing a transparent conductive film thereon by an 80 to 120 nm thickness, and patterning (FIG. 34A). In this example, an indium-tin oxide (ITO) film or a transparent conductive film having 2 to 20[%] of a zinc oxide (ZnO) added to an indium oxide is used as the transparent electrode.

Moreover, the pixel electrode 948 can be connected electrically with the drain area of the transistor Tr2 by forming the same superimposed and connected with the drain wiring 946.

Figure 35:
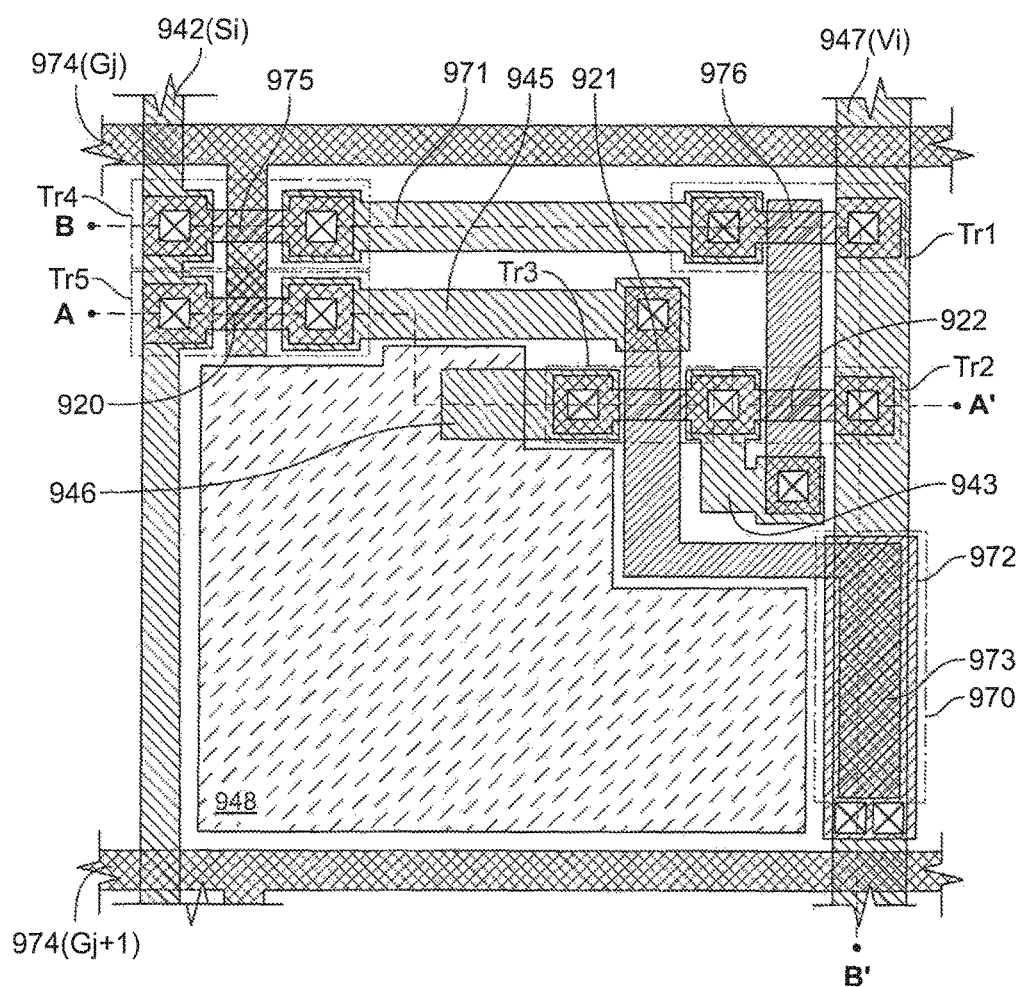
FIG. 35 is a top view of a pixel of the light emitting device according to the invention.

FIG. 35 is a top view of the pixel at the time of finishing the step of FIG. 34A. In order to clarify the position of the wiring and the position of the semiconductor layer, the insulated films and the interlayer insulated films are omitted. The cross-sectional view taken on A-A' in FIG. 35 corresponds with the part shown in A-A' in FIG. 34A.

Figure 42:
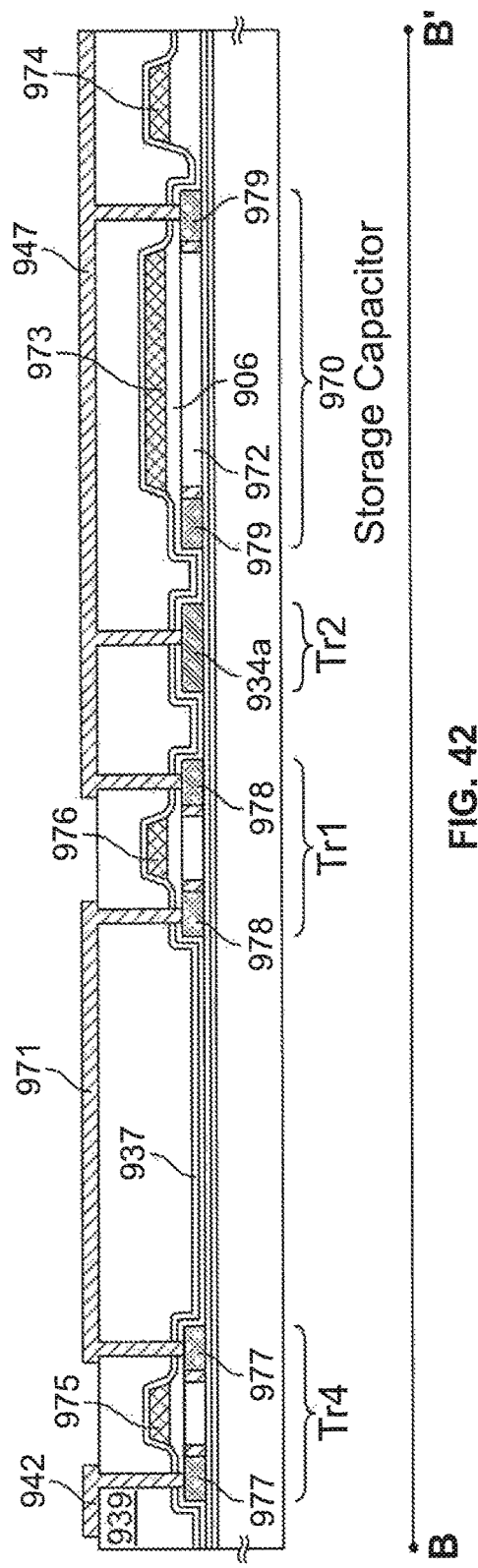
FIG. 42 is a view showing a manufacturing method of the light emitting device according to the invention.

FIG. 42 is a cross-sectional view taken on B-B' in FIG. 35. The transistor Tr4 has a gate electrode 975 as a part of the scanning line 974, with the gate electrode 975 connected also with the gate electrode 920 of the transistor Tr5. Moreover, the impurity area 977 of the semiconductor layer of the transistor Tr3 is connected with a connection wiring 942 serving as the signal line on one side and with the connected with a connection wiring 971 on the other side.

The transistor Tr1 has a gate electrode 976 as a part of the capacity wiring 973, with the gate electrode 976 connected also with the gate electrode 922 of the transistor Tr2. Moreover, the impurity area 978 of the semiconductor layer of the transistor Tr1 is connected with a connection wiring 971 on one side and connected with a connection wiring 947 serving as the power source line Vi on the other side.

The connection wiring 947 is connected also with the impurity area 934a of the transistor Tr2. Moreover, the numeral 970 is a maintaining capacity, having the semiconductor layer 972, the gate insulated film, 906 and the capacity wiring 973. The impurity area 979 of the semiconductor layer 972 is connected with the connection wiring 943.

Next, as shown in FIG. 34B, the third interlayer insulated film 949 having an opening part at a position corresponding to the pixel electrode 948 is formed. The third interlayer insulated film 949 having the insulation property serves as a bank so as to play a roll of separating the organic light emitting layers of the adjacent pixels. In this example, the third interlayer insulated film 949 is formed using a resist.

In this example, the thickness of the third interlayer insulated film 949 is provided by about 1 μm, with the opening part formed in the so-called reverse tapered shape, widened toward the pixel electrode 948. This can be formed by covering except the part for forming the opening part after film formation of the resist, exposing the same by directing the UV light, and eliminating the exposed part by a developer.

Since the organic light emitting layers are divided for the adjacent pixels at the time of film formation of the organic light emitting layers in the following step by having the third insulated film 949 in the reverse tapered shape as in this example, even in the case the coefficients of thermal expansion of the organic light emitting layers and the third interlayer insulated film 949 are different, cracking or peel off of the organic light emitting layer can be restrained.

Although a resist film is used as the third interlayer insulated film in this example, in some cases, a polyimide, a polyamide, an acrylic, a BCB (benzocyclo butene), a silicon oxide film, or the like can be used as well. As long as it has the insulation property, either organic or inorganic third interlayer insulated film 949 can be used.

Next, an organic light emitting layer 950 is formed by the evaporation method, and further, a cathode (MgAg electrode) 951 and a protection electrode 952 are formed by the evaporation method. At the time, it is preferable to apply a heat treatment to the pixel electrode 948 for completely eliminating the moisture content prior to the formation of the organic light emitting layer 950 and the cathode 951. Although the MgAg electrode is used as the OLED cathode in this example, another known material can be used as well.

As the organic light emitting layer 950, a known material can be used. Although a two layer structure comprising a hole transporting layer and a light emitting layer is provided as the organic light emitting layer in this example, in some cases any of a hole injecting layer, an electron injecting layer, or an electron transporting layer is provided. Accordingly, various examples of combinations have already been reported, and any configuration can be used.

In this example, a polyphenylene vinylene is formed as the hole transporting layer by the deposition method. Moreover, as the light emitting layer, one having 30 to 40% of a 1,3,4-oxadiazol derivative molecularly dispersed in a polyvinyl carbazol is formed by the deposition method, with about 1% of a coumarin 6 added as a green light emission center.

Moreover, it is also possible to protect the organic light emitting layer 950 from the moisture content or the oxygen by the protection electrode 952, but it is further preferable to provide a protection film 953. In this example, a 300 nm thickness silicon nitride film is provided as the protection film 953. The protection film can be formed continuously after the protection electrode 952 without release to the atmosphere.

Moreover, the protection electrode 952 is provided for preventing deterioration of the cathode 951, and a metal film having an aluminum as the main component is representative thereof. Of course, another material can be used as well. Moreover, since the light emitting layer 950 and the cathode 951 are extremely weak to the moisture content, it is preferable to form continuously to the protection electrode 952 without release to the atmosphere for protecting the organic light emitting layer from the outside air.

The film thickness of the organic light emitting layer 950 can be provided by 10 to 400 [nm] (typically 60 to 150 [nm]), and the thickness of the cathode 951 can be provided by 80 to 200 [nm] (typically 100 to 150 [nm]).

Accordingly, a light emitting device having the structure shown in FIG. 34B can be completed. The part 954 with the pixel electrode 948, the organic light emitting layer 950, and the cathode 951 superimposed corresponds to the OLED.

The p channel type TFT 960 and the n channel type TFT 961 are a TFT of the driving circuit, which provides a CMOS. The transistor Tr2 and the transistor Tr4 are a TFT of the pixel part, and the TFT of the driving circuit and the TFT of the pixel part can be formed on the same substrate.

In the case of a light emitting device using an OLED, since the voltage of the power source of the driving circuit is sufficiently about 5 to 6V, and about 10V at most, a problem of deterioration by the hot electron in the TFT is not involved. Moreover, since the driving circuit needs to be operated at a high speed, it is preferable that the TFT gate capacity is small. Therefore, as in this example, a configuration with the second impurity area 929 of the semiconductor layer of the TFT and the fourth impurity area 933b not superimposed with the gate electrodes. 918, 919 is preferable.

The production method for a light emitting device according to the present invention is not limited to the production method explained in this example, and a light emitting device of the present invention can be produced using a known method.

Example 18 can be implemented by combining freely with Examples 1 to 17.

Example 19

Figure 36:
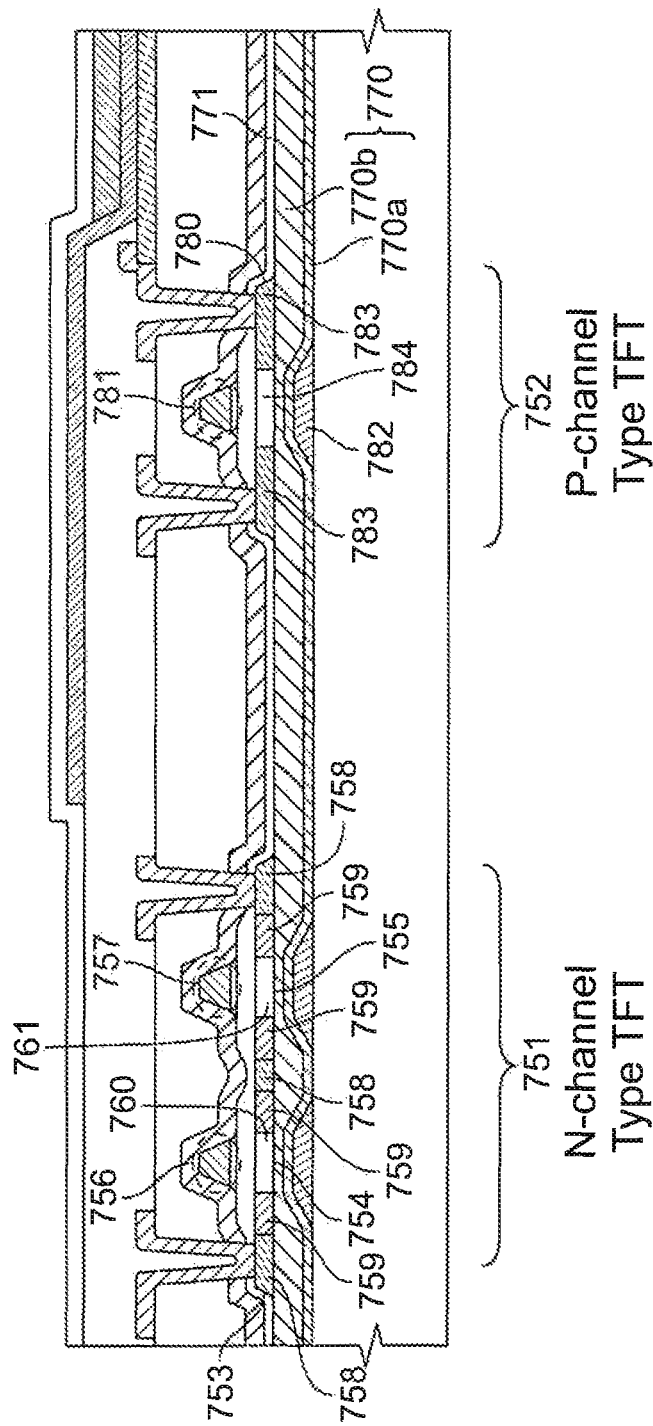
FIG. 36 is a sectional view of a pixel of the light emitting device according to the invention.

In this example, configuration of a pixel of a light emitting device being one of the semiconductor devices of the present invention is described below. FIG. 36 shows a cross-sectional view of a pixel built in a light emitting device according in this example. For simplifying the related illustration, transistors Tr1, Tr2 and Tr4 are omitted. However, configurations identical to those for the transistors Tr3 and Tr5 may be employed therefor.

Reference numeral 751 designates an n-channel type TFT corresponding to the transistor Tr5 shown in FIG. 2. Reference numeral 752 denotes a p-channel type TFT corresponding to the transistor Tr3 shown in FIG. 2. The n-channel type TFT 751 comprises a semiconductor film 753, a first insulating film 770, a pair of first electrodes 754 and 755, a second insulating film 771, and a pair of second electrodes 756 and 757. The semiconductor film 753 comprises a one-conductivity-type impurity region 758 having a first impurity concentration, a one-conductivity-type impurity region 759 having a second impurity concentration, and a pair of channel-formation regions 760 and 761.

In this example, the first insulating film 770 consists of a pair of laminated insulating films 770a and 770b. Alternatively, it is also practicable to provide the first insulating film 770 composed of a single-layer insulating film or an insulating film comprising three or more laminated layers.

A pair of the channel-formation regions 760 and 761 oppose a pair of the first electrodes 754 and 755 through the first insulating film 770 arranged therebetween. The other channel-formation regions 760 and 761 are also superposed on a pair of the second electrodes 756 and 757 by way of sandwiching the second insulating film 771 in-between.

The p-channel type TFT 752 comprises a semiconductor film 780, a first insulating film 770, a first electrode 782, a second insulating film 771, and a second electrode 781. The semiconductor film 780 comprises a one-conductivity-type impurity region 783 having a third impurity concentration, and a channel-formation region 784.

The channel-formation region 784 and the first electrode 782 oppose each other through the first insulating film 770. Further, the channel-formation region 784 and the second electrode 781 also oppose each other through the second insulating film 771 arranged therebetween.

In this example, although not illustrated in a diagram, a pair of the first electrodes 754 and 755 and a pair of the second electrodes 756 and 757 are electrically connected to each other. It should be noted that the scope of the present invention is not solely limited to the above connecting relationship, but it is also practicable to realize such a configuration in which the first electrodes 754 and 755 are electrically disconnected from the second electrodes 756 and 757 and are applied with a predetermined voltage. Alternatively, it is also possible to realize such a configuration in which the first electrode 782 is electrically disconnected from the second electrode 781 and is applied with a predetermined voltage.

Compared to the case of utilizing only one electrode, by applying a predetermined voltage to the first electrode 782, potential variation of the threshold value can be prevented from occurring, and yet, OFF-current can be suppressed. Further, by applying the same voltage to the first and second electrodes, in the same way as in the case of substantially reducing thickness of the semiconductor film, depletion layer quickly spreads, thus making it possible to minimize sub-threshold coefficient and further improve the field-effect mobility. Accordingly, compared to the case of utilizing one electrode, it is possible to increase value of an ON current. Further, by employing the above-referred TFTs based on the above-described configurations, it is possible to lower the drive voltage. Further, since it is possible to increase the value of an ON current, it is possible to contract the actual size, in particular, the channel width, of the TFTs, it is possible to increase the integration density.

Note that Example 19 can be performed by freely combining with any of Examples 1 to 17.

Example 20

Figure 37:
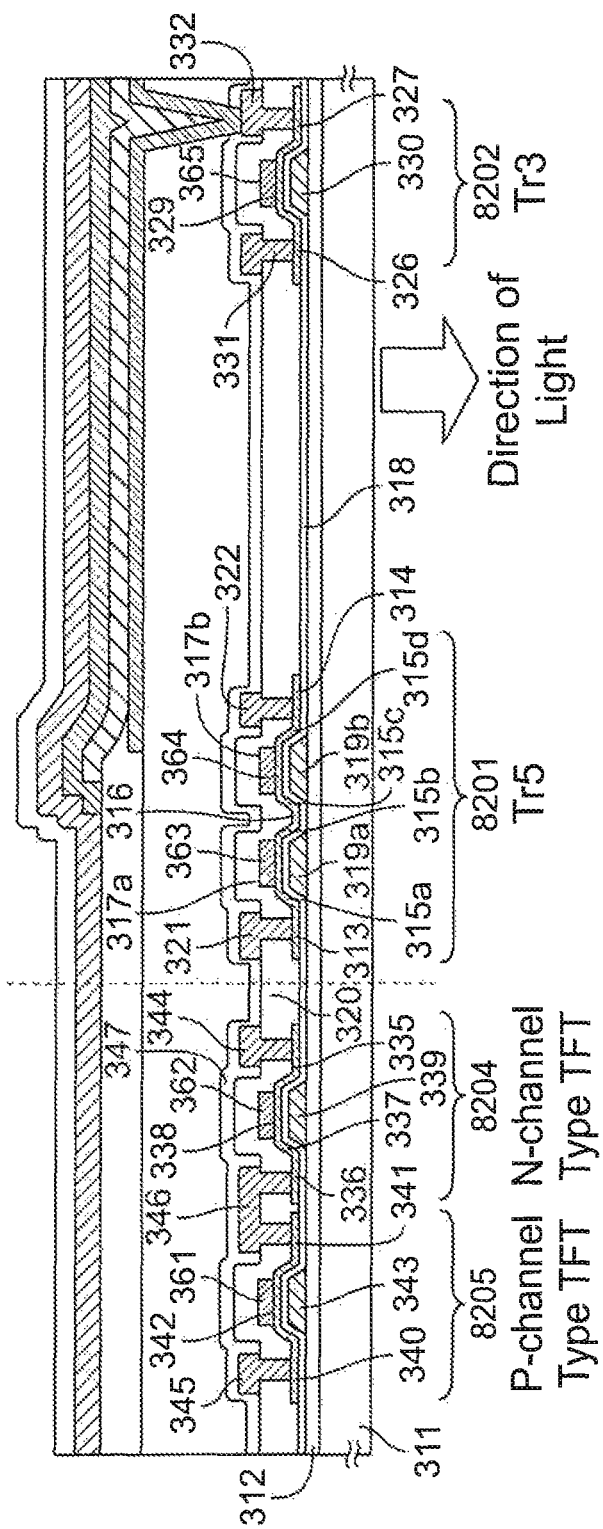
FIG. 37 is a sectional view of a pixel of the light emitting device according to the invention.

In Example 20, the structure of the pixels of the light emitting device which is one example of the semiconductor device according to the present invention is described. FIG. 37 is a cross-sectional view of the pixels of a light emitting device in Example 20. Although, for simplifying explanation, Tr1, Tr2 and Tr4 are omitted. However, constructions identical to those used for the transistors Tr5 and Tr3 may be employed therefor.

Reference numeral 311 denotes a substrate in FIG. 37, and reference numeral 312 denotes an insulating film which becomes a base (hereafter referred to as a base film). A light transmitting substrate, typically a glass substrate, a quartz substrate, a glass ceramic substrate, or a crystalline glass substrate can be used as the substrate 311. However, the substrate used must be one able to withstand the highest process temperature during the manufacturing processes.

Reference numeral 8201 denotes Tr5, reference numeral 8202 denotes Tr3, and both are formed by n-channel TFT and p-channel TFTs respectively. When the direction of organic light emitting layer is toward the substrate lower side (surface where TFTs and the organic light emitting layer are not formed), the above structure is preferable. However, Tr3 and Tr5 may be either n-channel TFTs or p-channel TFTs.

The Tr5 8201 has an active layer containing a source region 313, a drain region 314, LDD regions 315a to 315d, a separation region 316, and an active layer including channel regions 317a and 317b, a gate insulating film 318, gate electrodes 319a and 319b, a first interlayer insulating film 320, a source signal line 321 and a connection wiring 322. Note that the gate insulating film 318 and the first interlayer insulating film 320 may be common among all TFTs on the substrate, or may differ depending upon the circuit or the element.

Furthermore, the Tr5 8201 shown in FIG. 37 is electrically connected to the gate electrodes 317a and 317b, becoming namely a double gate structure. Not only the double gate structure, but also a multi-gate structure (a structure containing an active layer having two or more channel regions connected in series) such as a triple gate structure, may of course also be used.

The multi-gate structure is extremely effective in reducing the off current, and provided that the off current of the switching TFT is sufficiently lowered, a capacitor connected to the gate electrode of the Tr3 8202 can have its capacitance reduced to the minimum necessary. Namely, the surface area of the capacitor can be minimized, and therefore using the multi-gate structure is also effective in expanding the effective light emitting surface area of the organic light emitting elements.

In addition, the LDD regions 315a to 315d are formed so as not to overlap the gate electrodes 319a and 319b through the gate insulating film 318 in the Tr5 8201. This type of structure is extremely effective in reducing the off current. Furthermore, the length (width) of the LDD regions 315a to 315d may be set from 0.5 to 3.5 µm, typically between 2.0 and 2.5 µm. Further, when using a multi-gate structure having two or more gate electrodes, the separation region 316 (a region to which the same impurity element, at the same concentration, as that added to the source region or the drain region, is added) is effective in reducing the off current.

Next, the Tr3 8202 is formed having an active layer containing a source region 326, a drain region 327, and a channel region 329; the gate insulating film 318; a gate electrode 330, the first interlayer insulating film 320; a connecting wiring 331; and a connecting wiring 332. The Tr3 8202 is a p-channel TFT in Example 20.

Incidentally, the gate electrode 330 is a single structure; the gate electrode 330 may be a multi-structure.

The structures of the TFTs formed within the pixel are explained above, but a driver circuit is also formed simultaneously at this point. A CMOS circuit, which becomes a basic unit for forming the driver circuit, is shown in FIG. 37.

A TFT having a structure in which hot carrier injection is reduced without an excessive drop in the operating speed is used as an n-channel TFT 8204 of the CMOS circuit in FIG. 37. Note that the term driver circuit indicates a source signal line driver circuit and a gate signal line driver circuit here. It is also possible to form other logic circuit (such as a level shifter, an A/D converter, and a signal division circuit).

An active layer of the n-channel TFT 8204 of the CMOS circuit contains a source region 335, a drain region 336, an LDD region 337, and a channel region 338. The LDD region 337 overlaps with a gate electrode 339 through the gate insulating film 318.

Formation of the LDD region 337 on only the drain region 336 side is so as not to have drop the operating speed. Further, it is not necessary to be very concerned about the off current with then-channel TFT 8204, and it is good to place more importance on the operating speed. Thus, it is desirable that the LDD region 337 is made to completely overlap the gate electrode to decrease a resistance component to a minimum. It is therefore preferable to eliminate so-called offset.

Furthermore, there is almost no need to be concerned with degradation of a p-channel TFT 8205 of the CMOS circuit, due to hot carrier injection, and therefore no LDD region need be formed in particular. Its active layer therefore contains a source region 340, a drain region 341, and a channel region 342, and a gate insulating film 318 and a gate electrode 343 are formed on the active layer. It is also possible, of course, to take measures against hot carrier injection by forming an LDD region similar to that of the n-channel TFT 8204.

The reference numerals 361 to 365 are a mask to form the channel region 342, 338, 317a, 317b, and 329.

Further, the n-channel TFT 8204 and the p-channel TFT 8205 have source wirings 344 and 345, respectively, on their source regions, through the first interlayer insulating film 320. In addition, the drain regions of the n-channel TFT 8204 and the p-channel TFT 8205 are mutually connected electrically by a connection wiring 346.

Note that it is possible to implement this example by freely combining with Examples 1 to 17.

Example 21

The following description on this example refers to the configuration of a pixel utilizing a cathode as a pixel electrode.

Figure 38:
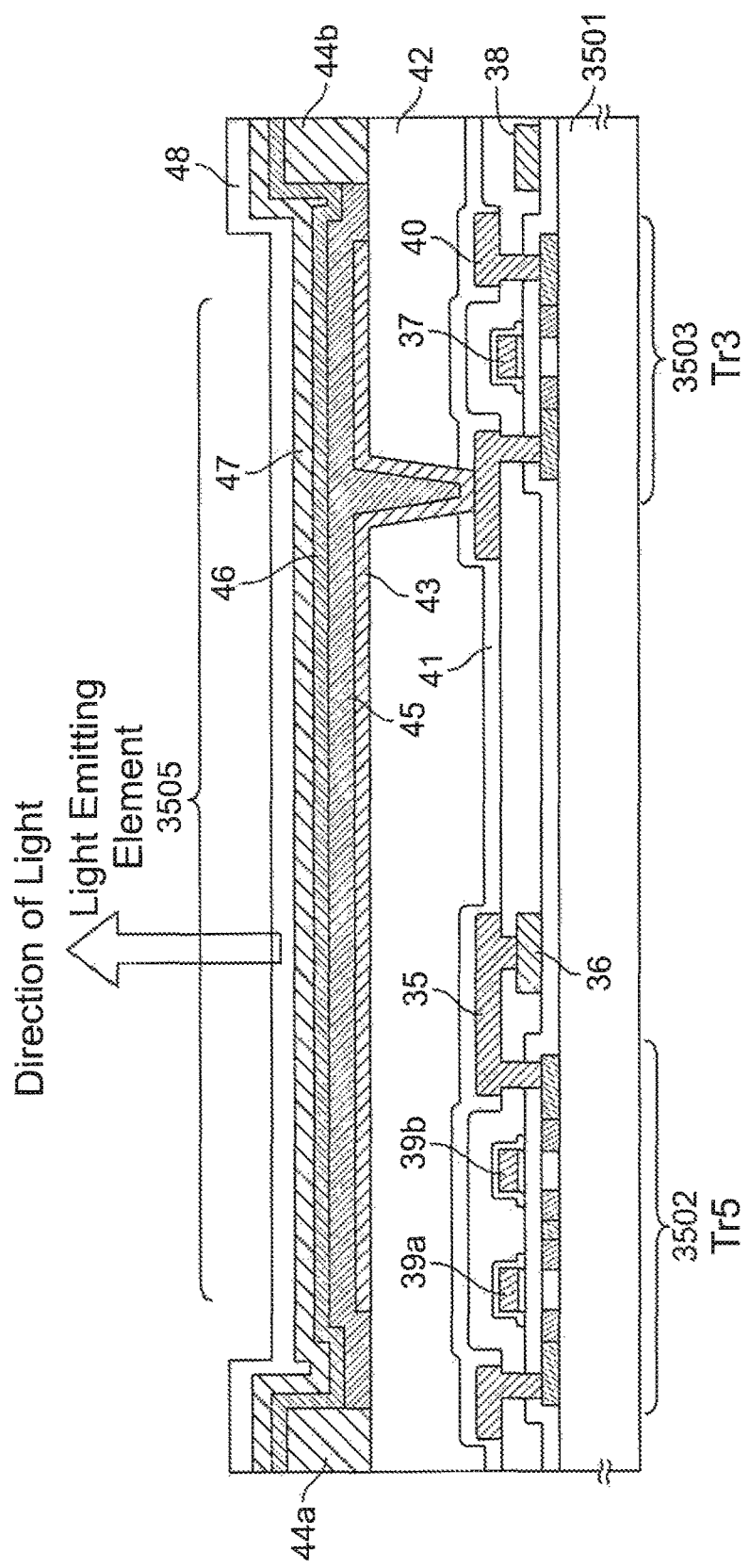
FIG. 38 is a sectional view of a pixel of the light emitting device according to the invention.

FIG. 38 exemplifies a cross-sectional view of a pixel according to this example. In FIG. 38, a transistor Tr5-3502 formed on a substrate 3501 is manufactured by applying a conventional method. In this example, a transistor Tr5-3502 based on the double-gate construction is used. However, it is also practicable to employ a single-gate construction, or a triple-gate construction, or a multiple-gate construction incorporating more than three of gate electrodes. To simplify the illustration, transistors Tr1, Tr2 and Tr4 are omitted. However, constructions identical to those used for the transistors Tr5 and Tr3 may be employed therefor.

A transistor Tr3-3503 shown in FIG. 38 is an n-channel type TFT, which can be manufactured by applying a known method. A wiring designated by reference numeral 38 corresponds to a scanning line for electrically linking a gate electrode 39a of the above transistor Tr5-3502 with the other gate electrode 39b thereof.

In this example shown in FIG. 38, the above transistor Tr3-3503 is exemplified as having a single-gate construction. However, the transistor Tr3-3503 may have a multiple-gate construction in which a plurality of TFTs are connected in series with each other. Further, such a construction may also be introduced, which substantially splits a channel-formation region into plural parts connecting a plurality of TFTs in parallel with each other, thereby enabling them to radiate heat with higher efficiency. This construction is quite effective to cope with thermal degradation of the TFTs.

A first inter-layer insulating film 41 is formed on the transistors Tr5-3502 and Tr3-3503. Further, a second inter-layer insulating film 42 made of resinous insulating film is formed on the first inter-layer insulating film 41. It is extremely important to fully level off steps produced by provision of TFTs by utilizing the second inter-layer insulating film 42. This is because, since organic light emitting layers to be formed later on are extremely thin, since presence of such steps may cause faulty light emission to occur. Taking this into consideration, before forming the pixel electrode, it is desired that the above-referred steps be leveled off as much as possible so that the organic light emitting layers can be formed on a fully leveled surface.

Reference numeral 43 in FIG. 38 designates a pixel electrode, i.e., a cathode electrode provided for the light emitting element, composed of a highly reflective electrically conductive film. The pixel electrode 43 is electrically connected to the drain region of the transistor Tr3-3503. For the pixel electrode 43, it is desired to use an electrically conductive film having a low resistance value such as an aluminum alloy film, a copper alloy film, or a silver alloy film, or a laminate of these alloy films. It is of course practicable to utilize such a construction that employs a laminate comprising the above-referred alloy films combined with other kinds of metallic films bearing electrical conductivity.

FIG. 38 exemplifies a light emitting layer 45 formed inside of a groove (this corresponds to a pixel) produced between a pair of banks 44a and 44b which are made from resinous insulating films. Although not shown in FIG. 20, it is also practicable to separately form a plurality of light emitting layers respectively corresponding to three colors of red, green, and blue. Organic light emitting material such as π-conjugate polymer material is utilized to compose the light emitting layers. Typically, available polymer materials include the following: polyparaphenylene vinyl (PPV), polyvinyl carbazol (PVK), and polyfluorene, for example.

There are a wide variety of organic light emitting materials comprising the above-referred PPV. For example, such materials cited in the following publications may be used: H. Shenk, H. Backer, O. Gelsen, E. Kluge, W. Spreitzer "Polymers for Light Emitting Diodes", Euro Display, Proceedings, 1999, pp. 33-37, and such material, set forth in the JP-10-92576 A.

As a specific example of the above-referred light emitting layers, there may be used cyano-polyphenylene-vinylene for composing a layer for emitting red light; polyphenylene-vinylene for composing a layer for emitting green light; and polyphnylene or polyalkylphenylene for composing a layer for emitting blue light. It is suggested that the thickness of an individual light emitting layer shall be defined in a range of from 30 nm to 150 nm, preferably in a range of from 40 nm to 100 nm.

The above description, however, has solely referred to a typical example of organic light emitting materials available for composing light emitting layers, and thus, applicable organic light emitting materials are not necessarily limited to those which are cited above. Thus, organic light emitting layers (layers for enabling light emission as well as movement of carriers therefor) freely combining light emitting layers, charge-transfer layers, and charge-injection layers with each other.

For example, this example has exemplified such a case in which polymer materials are utilized for composing light emitting layers. However, it is also possible to utilize organic light emitting materials comprising low-molecular weight compound, for example. To compose a charge-transfer layer and a charge-injection layer, it is also possible to utilize inorganic materials such as silicon carbide for example. Conventionally known materials may be used as the organic materials and the inorganic materials.

In this example, an organic light emitting layers having a laminate structure are formed, in which a hole injection layer 46 made from polythiophene (PEDOT) or polyaniline (PAni) is formed on the light emitting layer 45. An anode electrode 47 composed of a transparent electrically conductive film is formed on the hole injection layer 46. Light generated by the light emitting layers 45 is radiant in the direction of the upper surface of the TFT. Because of this, the anode electrode 47 must be light-permeable. To form a transparent electrically conductive film, a compound comprising indium oxide and tin dioxide or a compound comprising indium oxide and zinc oxide may be utilized. However, since the transparent electrically conductive film is formed after completing formation of the light emitting layer 45 and the hole injection layer 46 both having poor heat-resisting property, it is desired that the anode electrode 47 be formed at a low temperature as possible.

Upon completion of the formation of the anode electrode 47, the light emitting element 3505 is completed. Here, the light emitting element 3505 is provided with the pixel electrode (cathode electrode) 43, the light emitting layers 45, the hole injection layer 46, and the anode electrode 47. Since the area of the pixel electrode 43 substantially coincide with the total area of the pixel, the entire pixel functions itself as a light emitting element. Accordingly, an extremely high light-emitting efficiency is attained in practical use, thereby making it possible to display an image with high luminance.

This example further provides a second passivation film 48 on the anode electrode 47. It is desired that silicon nitride or silicon oxynitride utilized for composing the second passivation film 48. The second passivation film 48 shields the light emitting element 3505 from the external in order to prevent unwanted degradation thereof caused by oxidation of the organic light emitting material and also prevent gas component from leaving the organic light emitting material.

By virtue of the above arrangement, reliability of the light emitting device is enhanced furthermore.

As described above, the light emitting device of the present invention shown in FIG. 38 includes pixel portions each having the configuration as exemplified therein. In particular, the light emitting device utilizes the transistor Tr5 with a sufficiently a low OFF current value and the transistor Tr3 capable of fully withstanding injection of heated carriers. Because of these advantageous features, the light emitting device shown in FIG. 38 has enhanced reliability and can display clear image.

Note that the structure of Example 21 can be implemented by being freely combined with the structures shown in Example 1 through 17.

Example 22

In Example 22, the structure of the light emitting device having pixel elements shown in FIG. 2 is described with FIG. 39.

Figure 39A:
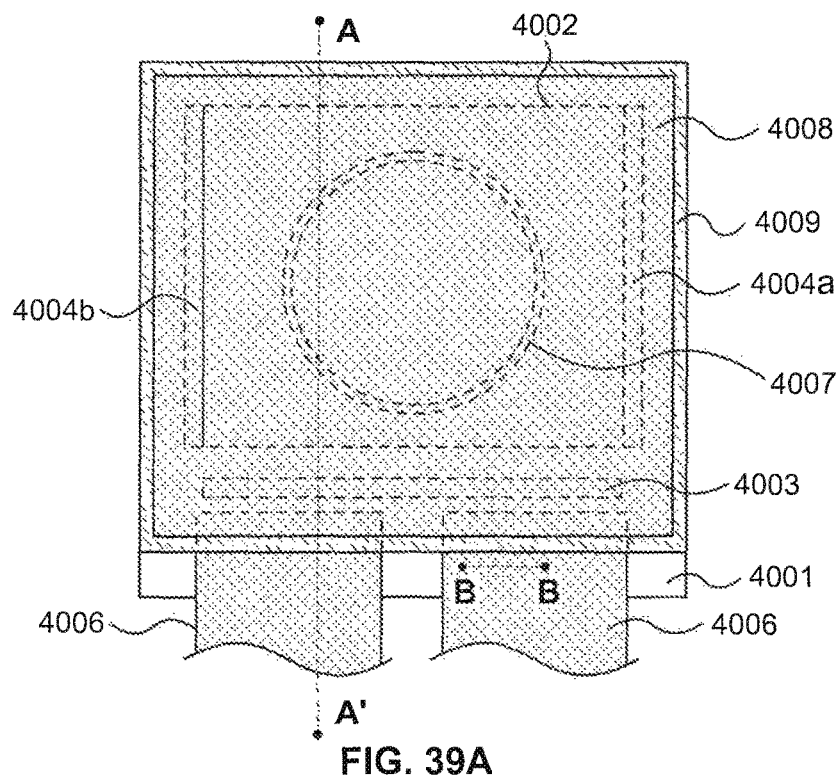
FIGS. 39A to 39C are an external view and sectional views of the light emitting device according to the invention.
Figure 39B:
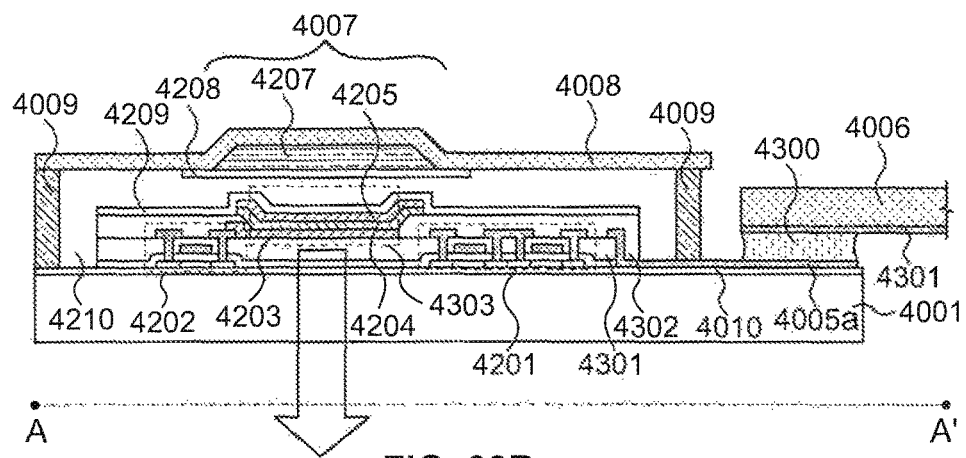
Figure 39C:
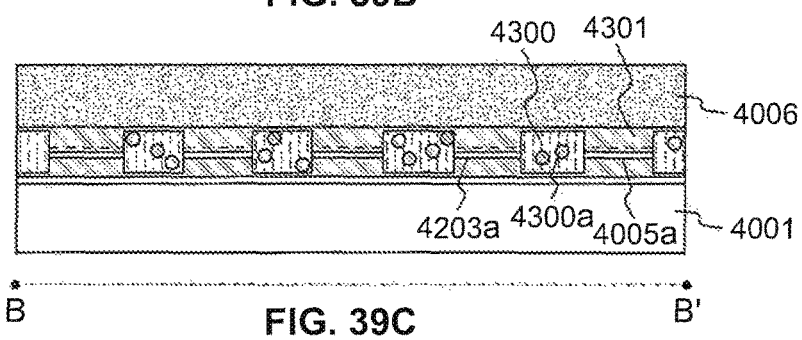

FIG. 39 is a top view of the light-emitting device which is formed according as the element substrate with the transistor is sealed by sealing materials, FIG. 39 B is a cross sectional view taken along with a line A-A' of FIG. 39A, and FIG. 39C is a cross sectional view taken along with a line B-B' of FIG. 39A.

A seal member 4009 is provided so as to surround a pixel portion 4002, a signal line driver circuit 4003, and the first, second scanning line driver circuits 4004a, 4004b, which are provided on a substrate 4001. Further, a sealing material 4008 is provided on the pixel portion 4002, the signal line driver circuit 4003, and the first, the second scanning line driver circuits 4004a, 4004b. Thus, the pixel portion 4002, the signal line driver circuit 4003, and the first, the second scanning line driver circuits 4004a, 4004b are sealed by the substrate 4001, the seal member 4009 and the sealing material 4008 together with a filler 4210.

Further, the pixel portion 4002, the signal line driver circuit 4003, and the first, the second scanning line driver circuits 4004a, 4004b, which are provided on the substrate 4001, have a plurality of TFTs. In FIG. 39B, a driver circuit TFT (Here, an n-channel TFT and a p-channel TFT are shown in the Figure.) 4201 included in the signal line driver circuit 4003 and a transistor Tr3 4202 included in the pixel portion 4002, which are formed on a base film 4010, are typically shown.

In this example, the p-channel TFT or the n-channel TFT manufactured by a known method is used as the driving TFT 4201, and the p-channel TFT manufactured by a known method is used as the transistor Tr3 4202.

An interlayer insulating film (leveling film) 4301 is formed on the driving TFT 4201 and the transistor Tr3 4202, and a pixel electrode (anode) 4203 electrically connected to a drain of the transistor Tr3 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The above transparent conductive film added with gallium may also be used.

Then, an insulating film 4302 is formed on the pixel electrode 4203, and the insulating film 4302 is formed with an opening portion on the pixel electrode 4203. In this opening portion, an organic light-emitting layer 4204 is formed on the pixel electrode 4203. A known organic light-emitting material or inorganic light-emitting material may be used for the organic light-emitting layer 4204.

Further, there exist a low molecular weight (monomer) material and a high molecular weight (polymer) material as the organic light-emitting materials, and both the materials may be used.

A known evaporation technology or application technique may be used as a method of forming the organic light-emitting layer 4204. Further, the structure of the organic light-emitting layer may take a lamination structure or a single layer structure by freely combining a hole injecting layer, a hole transporting layer, a light-emitting layer, an electron transporting layer and an electron injecting layer.

A cathode 4205 made of a conductive film having light-shielding property (typically, conductive film containing aluminum, copper or silver as its main constituent or lamination-film of the above conductive film and another conductive film) is formed on the organic light-emitting layer 4204. Further, it is desirable that moisture and oxygen that exist on an interface of the cathode 4205 and the organic light-emitting layer 4204 are removed as much as possible. Therefore, such a device is necessary that the organic light-emitting layer 4204 is formed in a nitrogen or rare gas atmosphere, and then, the cathode 4205 is formed without exposure to oxygen and moisture. In this example, the above-described film deposition is enabled by using a multi-chamber type (cluster tool type) film forming device. In addition, a predetermined voltage is given to the cathode 4205.

As described above, an light emitting element 4303 constituted of the pixel electrode (anode) 4203, the organic light-emitting layer 4204 and the cathode 4205 is formed. Further, a protective film 4209 is formed on the insulating film 4302 so as to cover the light emitting element 4303. The protective film 4209 is effective in preventing oxygen, moisture and the like from permeating the light emitting element 4303.

Reference symbol 4005a denotes a wiring drawn to be connected to the power supply line, and the wiring 4005a is electrically connected to a source region of the transistor Tr2 4202. The drawn wiring 4005a passes between the seal member 4009 and the substrate 4001, and is electrically connected to an FPC wiring 4206 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the light emitting element is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4210, so that PVC (polyvinyl chloride), acrylic, polyimide, epoxy resin, silicone resin, PVB (polyvinyl butyral) or EVA (ethylene vinyl acetate) can be used. In this example, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4210 is made to be exposed to the hygroscopic substance (preferably, barium oxide) of the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of the light emitting element 4303 can be suppressed by providing the hygroscopic substance or the substance that can absorb oxygen 4207.

As shown in FIG. 39C, the pixel electrode 4203 is formed, and at the same time, a conductive film 4203*a* is formed so as to contact the drawn wiring 4005*a*.

Further, the anisotropic conductive film 4300 has conductive filler 4300*a*. The conductive film 4203*a* on the substrate 4001 and the FPC wiring 4301 on the FPC 4006 are electrically connected to each other by the conductive filler 4300*a* by heat-pressing the substrate 4001 and the FPC 4006.

Note that the structure of Example 22 can be implemented by being freely combined with the structures shown in Example 1 through 21.

Example 23

The light-emitting device using the light emitting element is of the self-emission type, and thus exhibits more excellent recognizability of the displayed image in a light place as compared to the liquid crystal display device. Furthermore, the light-emitting device has a wider viewing angle. Accordingly, the light-emitting device can be applied to a display portion in various electronic devices.

Such electronic devices using a light-emitting device of the present invention include a video camera, a digital camera, a goggles-type display (head mount display), a navigation system, a sound reproduction device (a car audio equipment and an audio set), a lap-top computer, a game machine, a portable information terminal (a mobile computer, a mobile phone, a portable game machine, an electronic book, or the like), an image reproduction apparatus including a recording medium (more specifically, an apparatus which can reproduce a recording medium such as a digital versatile disc (DVD) and so forth, and includes a display for displaying the reproduced image), or the like. In particular, in the case of the portable information terminal, use of the light-emitting device is preferable, since the portable information terminal that is likely to be viewed from a tilted direction is often required to have a wide viewing angle. FIG. 40 respectively shows various specific examples of such electronic devices.

Figure 40A:
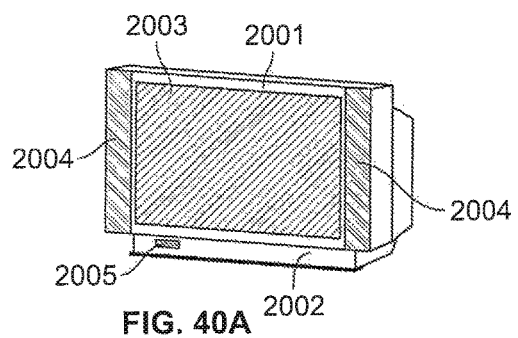
FIGS. 40A to 40H are views of electronic apparatus in which a light emitting device according to the invention is used.

FIG. 40A illustrates an light emitting element display device which includes a casing 2001, a support table 2002, a display portion 2003, a speaker portion 2004, a video input terminal 2005 or the like. The present invention is applicable to the display portion 2003. The light-emitting device is of the self-emission-type and therefore requires no backlight. Thus, the display portion thereof can have a thickness thinner than that of the liquid crystal display device. The organic light emitting display device is including the entire display device for displaying information, such as a personal computer, a receiver of TV broadcasting and an advertising display.

Figure 40B:
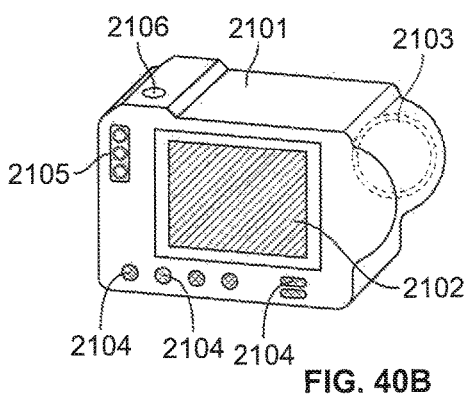

FIG. 40B illustrated a digital still camera which includes a main body 2101, a display portion 2102, an image receiving portion 2103, an operation key 2104, an external connection port 2105, a shutter 2106, or the like. By using the light-emitting device in accordance with the present invention as the display portion 2102, the digital still camera of the present invention is completed.

Figure 40C:
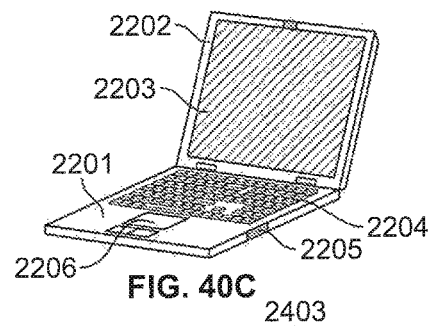

FIG. 40C illustrates a lap-top computer which includes a main body 2201, a casing 2202, a display portion 2203, a keyboard 2204, an external connection port 2205, a pointing mouse 2206, or the like. By using the light-emitting device in accordance with the present invention as the display portion 2203, the lap-top computer of the present invention is completed.

Figure 40D:
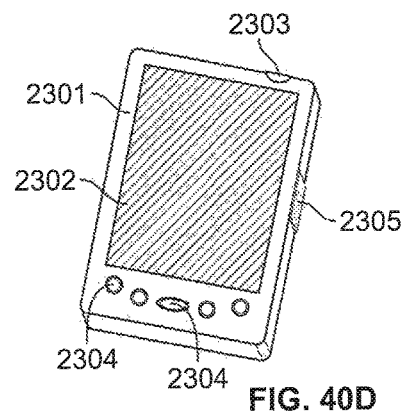

FIG. 40D illustrated a mobile computer which includes a main body 2301, a display portion 2302, a switch 2303, an operation key 2304, an infrared port 2305, or the like. By using the light-emitting device in accordance with the present invention as the display portion 2302, the mobile computer of the present invention is completed.

Figure 40E:
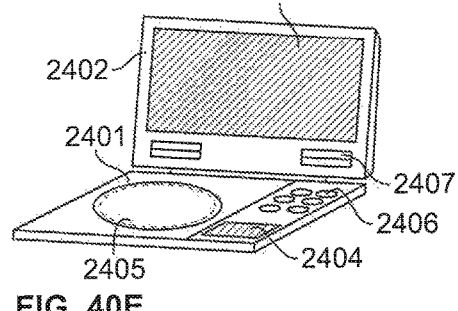

FIG. 40E illustrates a portable image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The image reproduction apparatus including a recording medium further includes a game machine or the like. By using the light-emitting device in accordance with the present invention as these display portions A 2403 and B 2404, the image reproduction apparatus of the present invention is completed.

Figure 40F:
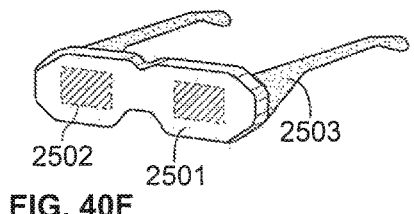

FIG. 40F illustrates a goggle type display (head mounted display) which includes a main body 2501, a display portion 2502, arm portion 2503 or the like. By using the light-emitting device in accordance with the present invention as the display portion 2502, the goggle type display of the present invention is completed.

Figure 40G:
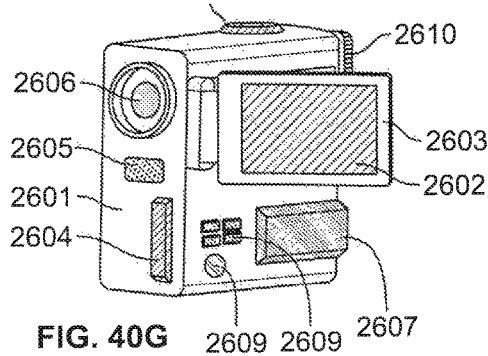

FIG. 40G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, an eyepiece 2610, or the like. By using the light-emitting device in accordance with the present invention as the display portion 2602, the video camera of the present invention is completed.

Figure 40H:
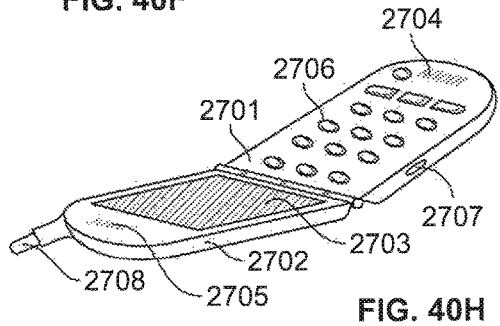

FIG. 40H illustrates a mobile phone which includes a main body 2701, a casing 2702, a display portion 2703, a sound input portion 2704, a sound output portion 2705, an operation key 2706, an external connecting port 2707, an antenna 2708, or the like. Note that the display portion 2703 can reduce power consumption of the mobile telephone by displaying white-colored characters on a black-colored background. By using the light-emitting device in accordance with the present invention as the display portion 2703, the mobile phone of the present invention is completed.

When the brighter luminance of light emitted from the organic light-emitting material becomes available in the future, the light-emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light-emitting device is suitable for displaying moving pictures since the organic light-emitting material can exhibit high response speed.

A portion of the light-emitting device that is emitting light consumes power, so it is desirable to display information in such a manner that the light-emitting portion therein becomes as small as possible. Accordingly, when the light-emitting device is applied to a display portion which mainly displays character information, e.g., a display portion of a portable information terminal, and more particular, a portable telephone or a sound reproduction device, it is desirable to drive the light-emitting device so that the character information is formed by a light-emitting portion while a non-emission portion corresponds to the background.

As set forth above, the present invention can be applied variously to a wide range of electronic devices in all fields. The electronic device in this example can be obtained by utilizing a light-emitting device having the structure in which the structures in Example 1 through 22 are freely combined.

According to the invention, owing to the configuration as described above, compared to an ordinary light emitting device shown in FIG. 41, even when the characteristics of the TFT disperse in each pixel, it is possible to prevent the luminance of the light emitting element dispersing in each pixel. Further, compared to the case that a TFT 51 provided with a voltage input type pixel shown in FIG. 41 is operated in a linear zone, it is possible to prevent the luminance from decreasing due to deterioration of the light emitting element. Furthermore, even when the temperature of the organic luminescent layer is influenced by the outside air temperature, the heat emitted from the luminescent panel itself or the like, it is possible to prevent the luminance of the light emitting element from varying. Also, it is possible to prevent the current consumption from increasing accompanying the temperature raise.

Further, according to the invention, by adopting the driving method in which a drive voltage of inverted bias is impressed to the light emitting element every predetermined period (alternating-current drive), the deterioration of the current-voltage characteristics of the light emitting element is improved. As a result, compared to a conventional drive method, it is possible to elongate the life of the light emitting element.

What is claimed is:

1. A display device comprising:
   a semiconductor layer comprising:
      a first channel-formation region;
      a second channel-formation region; and
      an impurity region;
   a gate insulated film over the semiconductor layer;
   a first gate electrode overlapping with the first channel-formation region with the gate insulated film interposed therebetween;
   a second gate electrode overlapping with the second channel-formation region with the gate insulated film interposed therebetween;
   a first insulated film over the semiconductor layer, the first gate electrode, and the second gate electrode;
   a connection wiring over the first insulated film;
   a power supply line over the first insulated film;
   a pixel electrode electrically connected to the connection wiring;
   an organic light emitting layer over the pixel electrode;
   a cathode over the organic light emitting layer; and
   a storage capacitor,
   wherein a first electrode of the storage capacitor is electrically connected to the first gate electrode,
   wherein a second electrode of the storage capacitor is electrically connected to the power supply line;
   wherein the power supply line is electrically connected to the impurity region through the second channel-formation region,
   wherein the impurity region is electrically connected to the connection wiring through the first channel-formation region, and
   wherein the first gate electrode and the second gate electrode are formed in different conductive layers.

2. The display device according to claim 1, further comprising a base film,
   wherein the semiconductor layer is positioned over the base film.

3. The display device according to claim 1, wherein the first insulated film comprises a silicon oxide film, a silicon nitride oxide film, a silicon nitride film, or a laminated film of a combination of the silicon oxide film, the silicon nitride oxide film, and the silicon nitride film.

4. A display module comprising an FPC and the display device according to claim 1.

5. An electronic device comprising an operation key, a main body, a speaker portion and the display module according to claim 4.

6. A display device comprising:
   a semiconductor layer comprising:
      a first channel-formation region;
      a second channel-formation region; and
      an impurity region;
   a gate insulated film over the semiconductor layer;
   a first gate electrode overlapping with the first channel-formation region with the gate insulated film interposed therebetween;
   a second gate electrode overlapping with the second channel-formation region with the gate insulated film interposed therebetween;
   a first insulated film over the semiconductor layer, the first gate electrode, and the second gate electrode;
   a connection wiring over the first insulated film;
   a power supply line over the first insulated film;
   a pixel electrode electrically connected to the connection wiring;
   an organic light emitting layer over the pixel electrode;
   a cathode over the organic light emitting layer; and
   a storage capacitor,
   wherein a first electrode of the storage capacitor is electrically connected to the first gate electrode,
   wherein a second electrode of the storage capacitor is electrically connected to the power supply line;
   wherein the power supply line is electrically connected to the impurity region through the second channel-formation region,
   wherein the impurity region is electrically connected to the connection wiring through the first channel-formation region, and
   wherein a potential of the first gate electrode and a potential of the second gate electrode are individually controlled from each other.

7. The display device according to claim 6, further comprising a base film,
   wherein the semiconductor layer is positioned over the base film.

8. The display device according to claim 6, wherein the first insulated film comprises a silicon oxide film, a silicon nitride oxide film, a silicon nitride film, or a laminated film of a combination of the silicon oxide film, the silicon nitride oxide film, and the silicon nitride film.

9. A display module comprising an FPC and the display device according to claim 6.

10. An electronic device comprising an operation key, a main body, a speaker portion and the display module according to claim 9.

* * * * *